(12) United States Patent
Nicolaescu

(10) Patent No.: US 8,164,070 B2
(45) Date of Patent: Apr. 24, 2012

(54) COLLIMATOR MAGNET FOR ION IMPLANTATION SYSTEM

(75) Inventor: Dan Nicolaescu, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 665 days.

(21) Appl. No.: 12/328,824

(22) Filed: Dec. 5, 2008

(65) Prior Publication Data

US 2010/0140494 A1    Jun. 10, 2010

(51) Int. Cl.
*H01J 3/14* (2006.01)
(52) U.S. Cl. ............. 250/398; 250/396 R; 250/396 ML; 250/423 R
(58) Field of Classification Search ............ 250/396 R, 250/396 ML, 398, 492.1–492.21, 492.3
See application file for complete search history.

(56) References Cited

U.S. PATENT DOCUMENTS

| | | | |
|---|---|---|---|
| 4,745,281 A | 5/1988 | Enge | |
| 5,672,879 A * | 9/1997 | Glavish | 250/396 ML |
| 5,834,786 A | 11/1998 | White et al. | |
| 6,207,963 B1 * | 3/2001 | Benveniste | 250/492.21 |
| 6,437,350 B1 * | 8/2002 | Olson et al. | 250/492.21 |
| 6,614,027 B1 | 9/2003 | Iwasawa | |
| 2006/0197029 A1 * | 9/2006 | Purser et al. | 250/396 ML |
| 2008/0245957 A1 | 10/2008 | Gupta et al. | |
| 2009/0206270 A1 | 8/2009 | Glayish et al. | |
| 2010/0084581 A1 * | 4/2010 | Benveniste et al. | 250/492.21 |

FOREIGN PATENT DOCUMENTS

WO    96/42103 A1    12/1996

OTHER PUBLICATIONS

The International Search Report of PCT/IB2009/007365 dated Feb. 19, 2010.
The Written Opinion of the International Searching Authority of PCT/IB2009/007365 dated Feb. 19, 2010.

\* cited by examiner

*Primary Examiner* — Michael Maskell
(74) *Attorney, Agent, or Firm* — Sughrue Mion, PLLC

(57) ABSTRACT

A collimator magnet (CM) usable in an ion implantation system provides an exit ion beam with a large aperture, substantially parallel in one plane or orthogonal planes. The CM includes identical poles, defined by an incident edge receiving an ion beam, and an exit edge outputting the ion beam for implantation. Ion beam deflection takes place due to magnetic forces inside the CM and magnetic field fringe effects outside the CM. The CM incident and/or exit edge is shaped by solving a differential equation to compensate for magnetic field fringe effects and optionally, space charge effects and ion beam initial non-parallelism. The CM shape is obtained by imposing that the incidence or exit angle is substantially constant, or, incidence and exit angles have opposite sign but equal absolute values for each ray in the beam; or the sum of incidence and exit angles is a constant or a non-constant function.

12 Claims, 53 Drawing Sheets

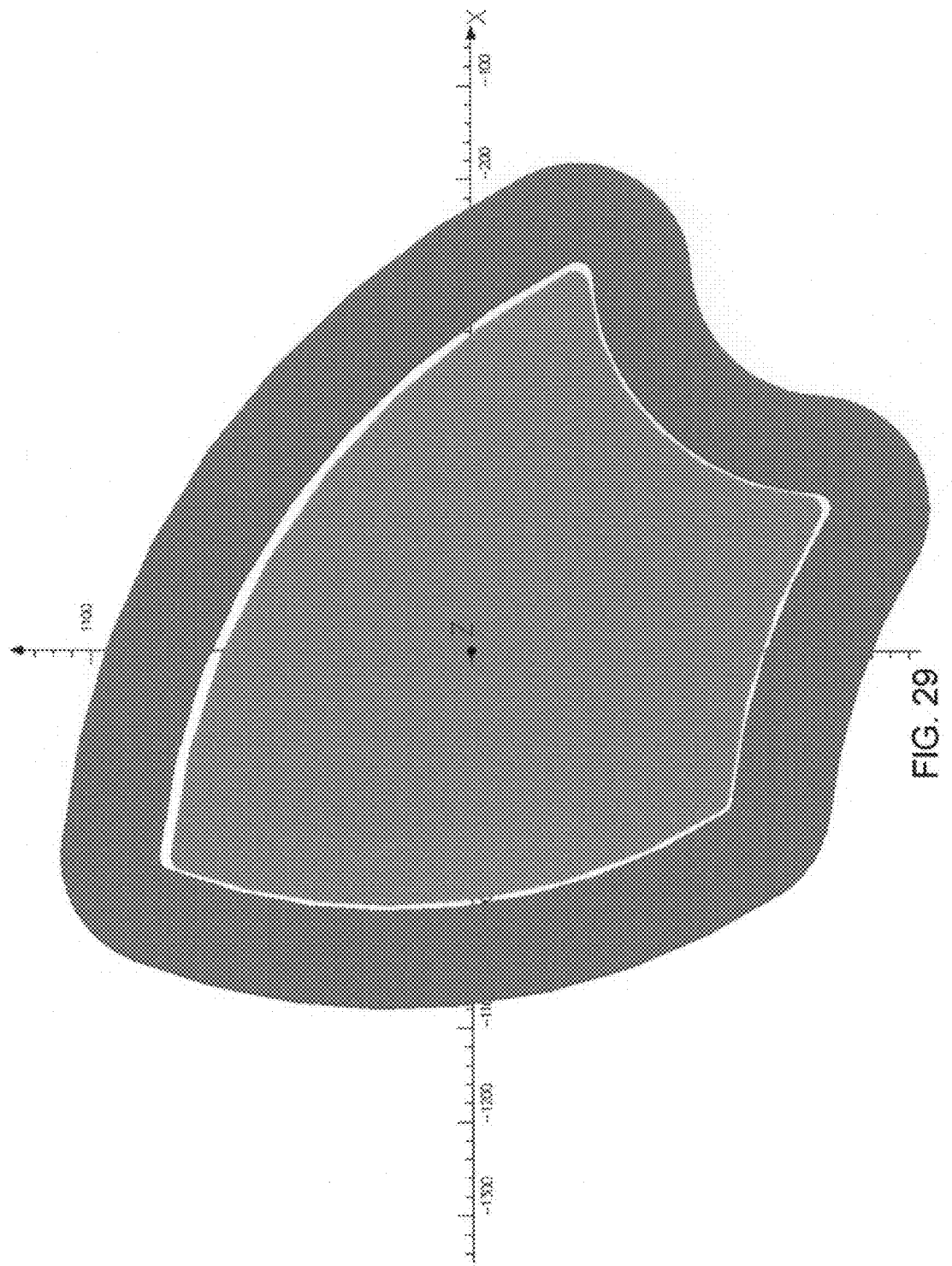

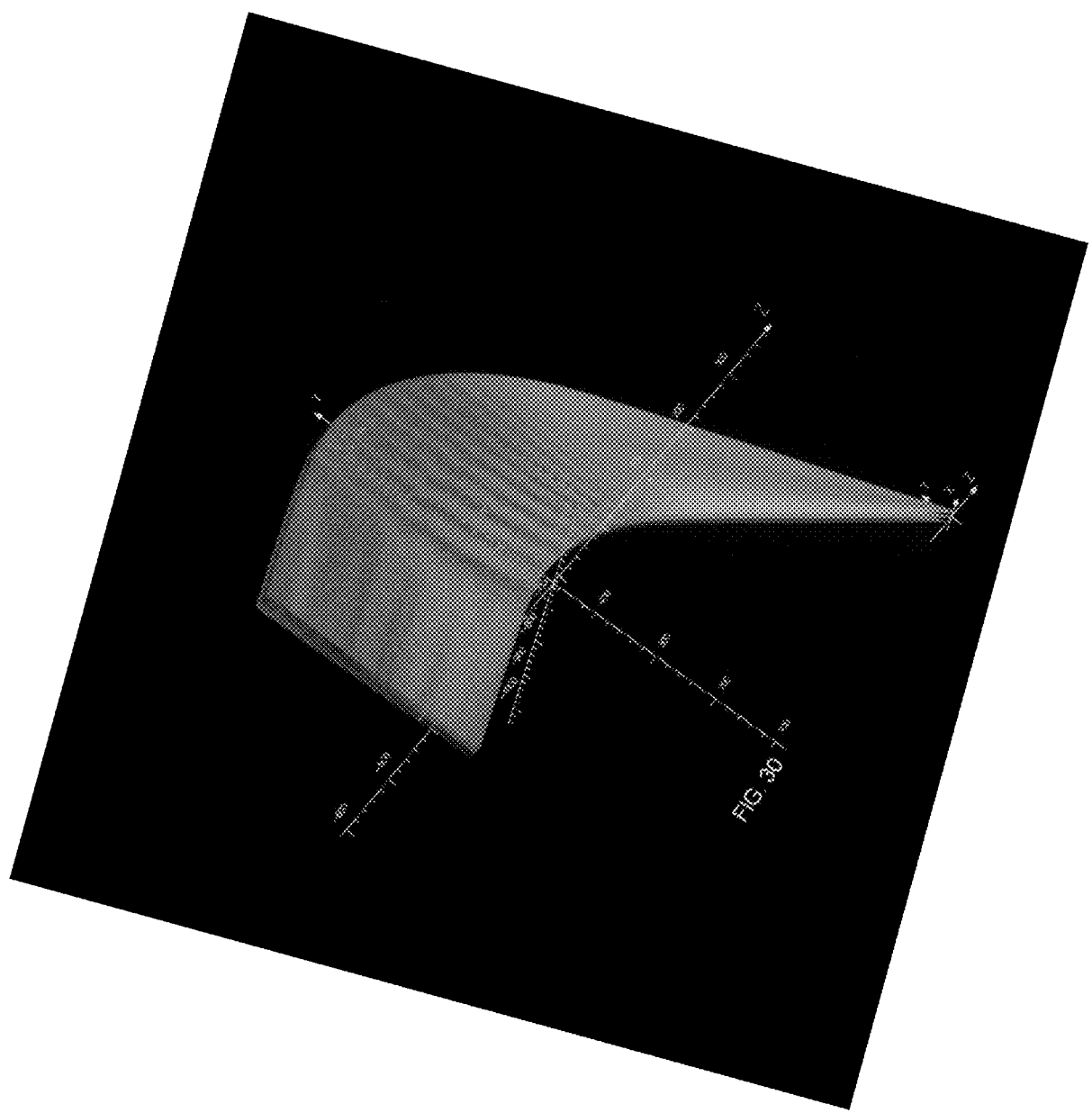

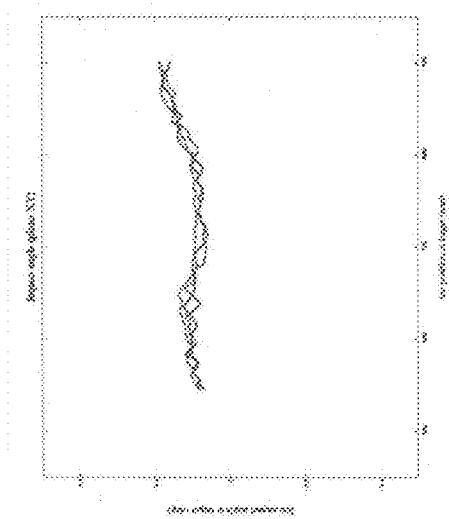
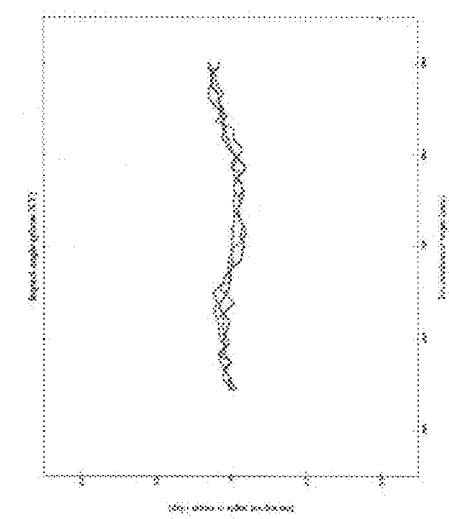
FIG. 38
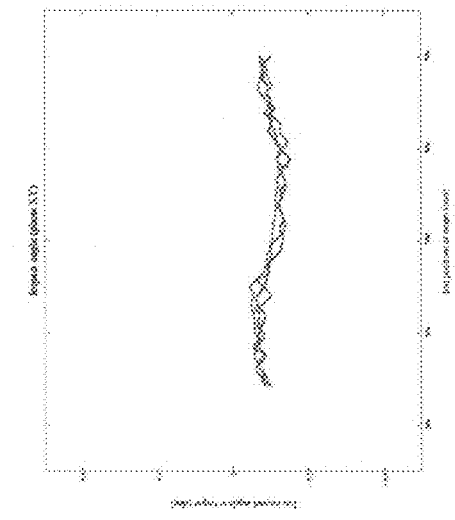

COLLIMATOR MAGNET FOR ION IMPLANTATION SYSTEM

BACKGROUND OF THE INVENTION

1. Technical Field

Aspects and features of the present invention relate to a collimator magnet ("CM") for use in an ion implantation system to compensate for beam deflection. More specifically, the present invention relates to a collimator magnet achieving substantially high parallelism for an ion beam, as well as compensation of the fringe field, and optionally space charge effects.

2. Related Art

In the related art, an ion implantation system may be used to implant ion species onto a wafer. For example but not by way of limitation, ion species may be implanted on a silicon wafer to manufacture a semiconductor device.

FIG. 1 illustrates a related art implementation of an ion implantation system. A related art ion implantation system is disclosed in U.S. Pat. No. 6,614,027B1, which is also assigned to the same assignee as the present application, and is incorporated herein by reference. More specifically, the related art ion implantation system is of a type known as EXCEED.

As shown in FIG. 1, an ion source 2 is provided that generates an ion beam 4, which travels along a beam line through mass analysis magnet 6, accelerating tube 8, trimming Q lens 10 and energy analysis magnet 12. Eventually, the ion beam 4 reaches a beam sweeping magnet (BSM) 14, where the beam becomes divergent. A collimator magnet 16 functions to make parallel a divergent beam from ion source 2. The beam that has passed through the collimator magnet 16 is then used in the end station 18, 20, 22, for example, to implant an ion species on a semiconductor wafer.

U.S. Pat. No. 5,834,786 discloses another related art ion implantation system, as shown in FIG. 2. More specifically, collimator magnet 3' is provided. The collimator magnet 3' receives divergent rays of an incoming beam and outputs apparently parallel rays. The ion beam received from the ion generation source may be a spot beam; alternatively, the ion beam may be a ribbon beam.

However, the above related art ion implantation systems may have various problems and/or disadvantages. For example, but not by way of limitation, magnetic leakage occurs in a fringe field of a related art collimator magnet, and the related art collimator magnets are not capable of compensating for this effect with a substantially high degree of precision. Related art collimator magnets cannot precisely make the divergent beam parallel, due to magnetic leakage (hereinafter referred to as a "fringe field effect"). If the beam is not made parallel, then the ion implantation of the beam perpendicular to the wafer cannot be fully performed. Further, the related art cannot compensate for the space charge effect problem, discussed further below.

The degree of precision with which related art collimator magnets can take into account the above-discussed related art fringe field effect problem is limited. For example, available related art knowledge, available related art computational power (both hardware and software), and related art industry standards imposed for precision of beam parallelism have limited the degree of precision that is possible for taking into account magnetic field fringe effects. Such related art collimator magnets may be used to make semiconductor wafers when a minimum circuit pattern width of semiconductor device was around 250 nm as manufacture standard at that time (i.e., year 2001).

However, the minimum circuit pattern width of a semiconductor device has since been substantially changed. The minimum circuit pattern width will become about 25 nm to 45 nm as a manufacture standard, from the above-noted value of about 250 nm. Moreover, the size of the wafers which currently have 300 mm is diameter increasing as well, for example to 450 mm. Accordingly, the result of the fringe field effect as well as space charge effects need to be properly compensated for to achieve parallelism of the ion beam in a manner that permits the ion implantation system to effectively operate. In this regard, there is an unmet need to obtain a solution that addresses one or both of these effects.

SUMMARY OF THE INVENTION

According to an aspect of the present invention, an ion implantation apparatus is provided for irradiating a target with an ion beam. The apparatus includes an ion generation source that generates the ion beam, and a collimator magnet that receives the ion beam in a divergent form and modifies it so as to output a parallel ion beam to irradiate the target. The ion beam has mass and energy of the ions substantially equal. Collimation properties for the ion beam depend on an incident and on an exit angle of the collimator magnet. Collimator magnet is defined as having either the incidence angle or the exit angle keeping substantially constant value for each ray within the ion beam. Incident angle is defined as an angle formed between a ray of the ion beam, and the local normal to the collimator magnet incidence edge. Exit angle is defined as the angle formed between the same ray of the ion beam and the local normal to the collimator magnet exit edge. Incident and exit angles may have positive, zero or negative values.

According to another aspect of the present invention, the collimator magnet is defined as having a sum of the incidence angle and the exit angle equal to substantially zero or a constant for each ray within the ion beam.

According to yet another aspect of the present invention, the collimator magnet is defined as having the sum of the incidence angle and the exit angle not constant and depending on the position of the ray within the ion beam.

Further, the ion beam comprises a scanning beam or a ribbon beam, and a mass and energy of the ions is substantially equal. Moreover, at least one of the incident edge and the exit edge are shaped so that the parallel ion beam is parallel in consideration of magnetic field fringe forces. Further, the incident edge and the exit edge are shaped so that the parallel ion beam is parallel in consideration of uniform space charge effects. Alternatively, the incident edge and the exit edge are shaped so that the parallel ion beam is parallel in consideration of non-uniform space charge effects.

According to still another aspect of the present invention, the incident edge and the exit edge are shaped so that the parallel ion beam is parallel with at least one of (a) in an XY plane (b) in the XY plane and an XZ plane and (c) in the XY plane and the XZ plane and in view of space charge effect forces.

In another aspect of the present invention, the incident edge and the exit edge are subjected to compensation for an effect of the magnetic field fringe of the collimator magnet by removing a virtual (i.e., computer model) slice from the incident edge or the exit edge or from both edges. Further, the virtual slice can have a substantially constant thickness, so as to compensate for deflection of the ion beam as a whole, or the virtual slice can have a variable thickness, so as to compensate for deflection of individual rays of the ion beam as well as for deflection of the ion beam as a whole.

Additionally, the collimator magnet may be a double circular collimator magnet. The apparatus further includes a beam sweep magnet that sweeps the ion beam received from the ion generation source in a first direction to be received by the collimator magnet.

Further, according to another exemplary embodiment, the incident edge or the exit edge or both incident and exit edges are approximated by a plurality of arcs of a circle, a spline function approximation, or a non-linear mathematical function depending on one or more parameters.

BRIEF DESCRIPTION OF THE DRAWINGS

The above and/or other aspects and features of the exemplary embodiments will become apparent and more readily appreciated from the following description, taken in conjunction with the accompanying drawings, in which:

FIG. 29 provides an illustration of a shape of the CSA-DCCM according to the exemplary, non-limiting embodiments;

FIG. 38 illustrates the occurrence of degradation for ion beam collimation when the virtual ion source is not point but actual has a physical structure or distribution, according to an exemplary, non-limiting embodiment.

DETAILED DESCRIPTION OF THE EXEMPLARY EMBODIMENTS

Figure 1:
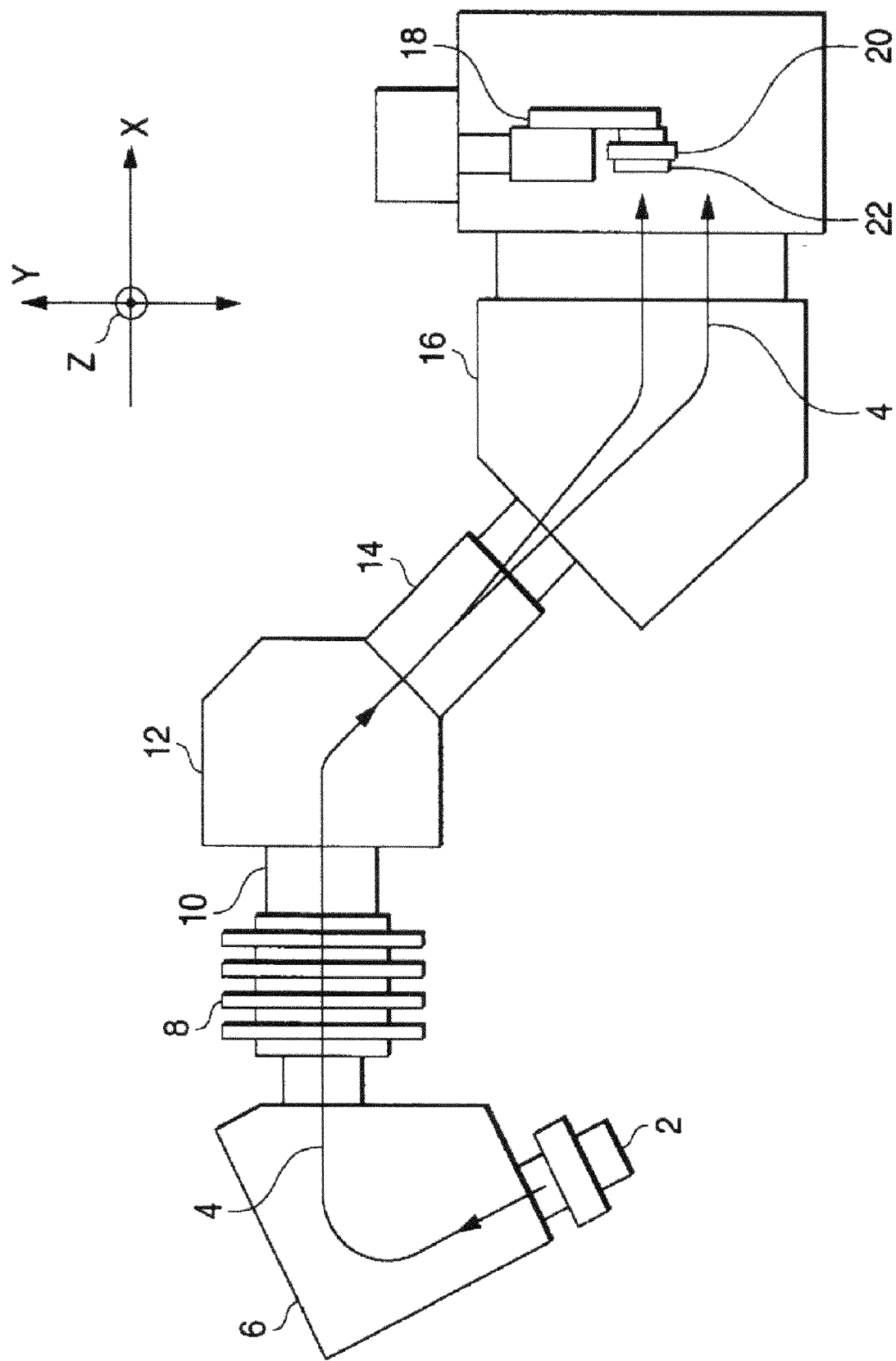
FIG. 1 illustrates a related art ion implanting system.
Figure 2:
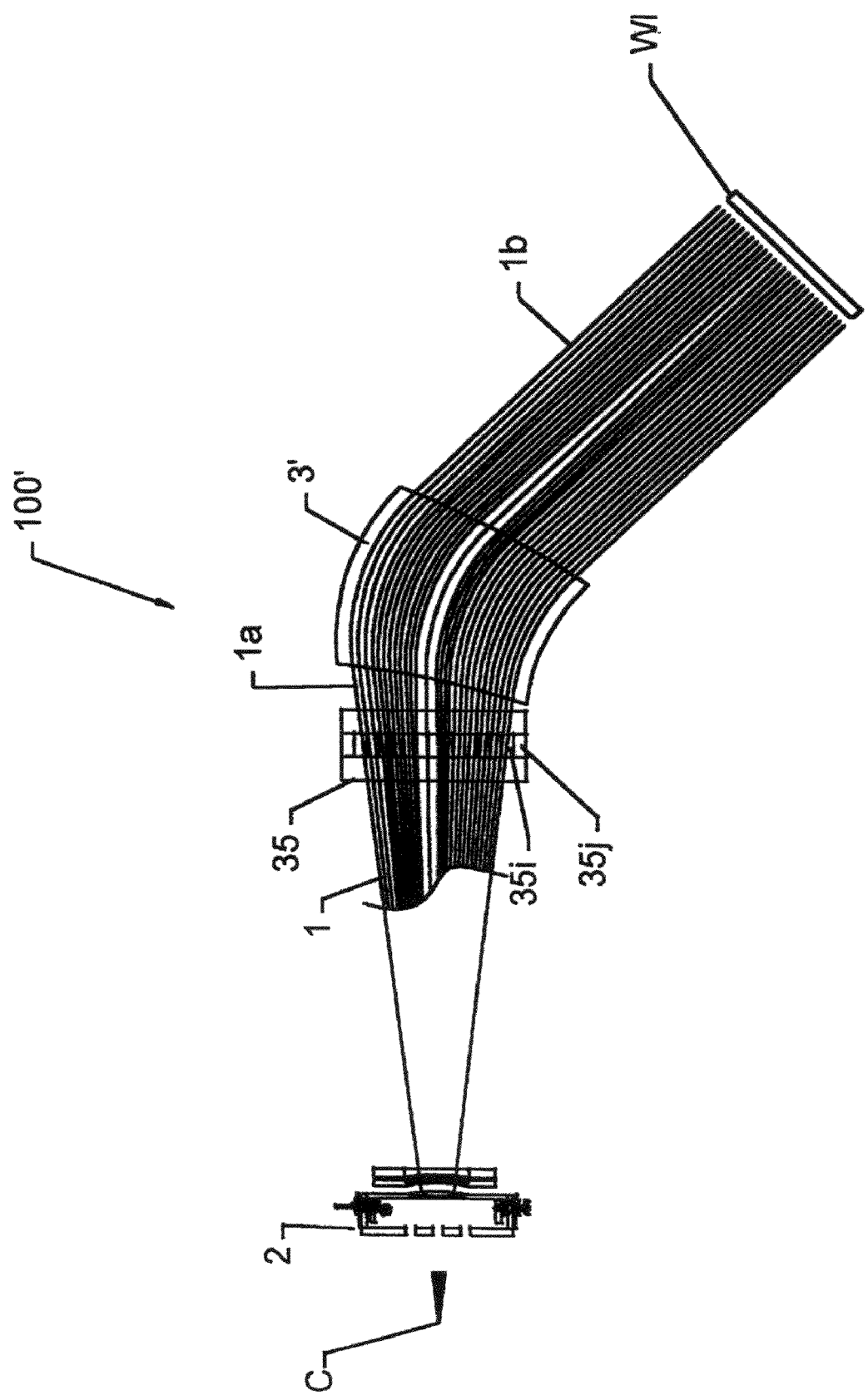
FIG. 2 illustrates a related art collimator magnet.

Exemplary embodiments of the present invention will be described in greater detail with reference to the accompanying drawings. In the following description, the same drawing reference numerals are used for the same elements in both drawings. The matters defined in the description such as a detailed construction and arrangement of elements are nothing but the ones provided to assist in a comprehensive understanding. Thus, it is apparent that the present invention can be carried out without being limited to those defined matters. Also, well-known functions or constructions are not described in detail since they would obscure the invention in unnecessary detail.

In the foregoing description, the following definitions will be used:

Directions X, Y and Z are defined as follows. Direction X is the direction normal to the target. Direction Y is normal to the X-axis, and is parallel with the magnetic pole faces. Direction Z is orthogonal to the XY plane. The X-axis direction is the desired direction for the exit ion beam. In the case of ribbon ion beams (i.e., an ion beam formed as a ribbon or sheet having two sides with different lengths at a portion of a collimator magnet), direction Y is the longer direction of the ion beam width.

"Collimator magnet" ("CM") refers to a dipole magnet that is composed of two identical magnetic poles, the identical electric coils, and a yoke. The yoke is an external connection between magnetic poles. For all of the foregoing elements, the XY plane defined by z=0 is a symmetry plane, such that all of the elements have a mirror position with respect to this XY plane. A magnetic pole is defined by the incident and exit edges of the collimator magnet, which can be described by functions, as disclosed in greater detail below.

The "beam" may be a scanning (spot) beam, a ribbon beam, or any other beam as would be understood by one skilled in the art. Further, the beam may be composed of electrons or ions (i.e., positive or negative charge). The mass, charge and energy of the ions must be substantially similar to each other.

Figure 3:
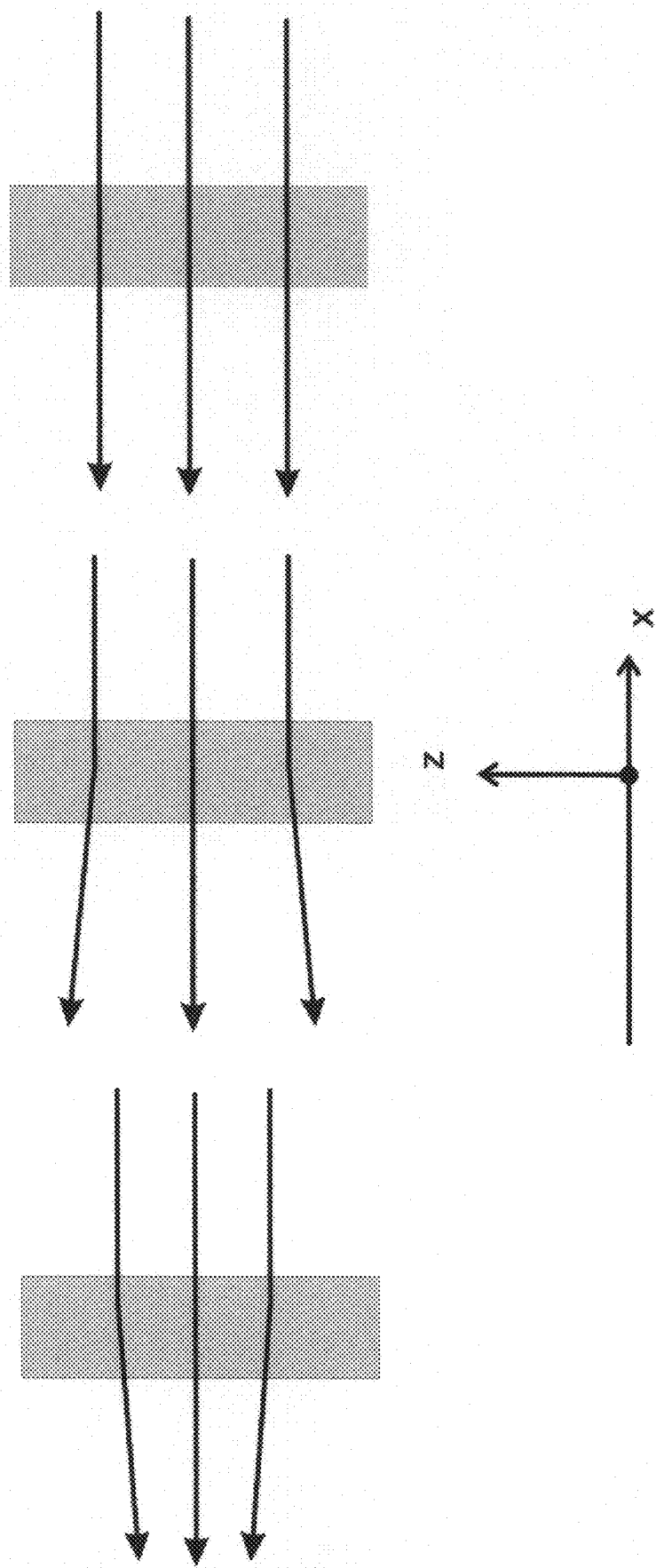
FIG. 3 illustrates the concept of orientation of Z direction deflection forces.
Figure 4:
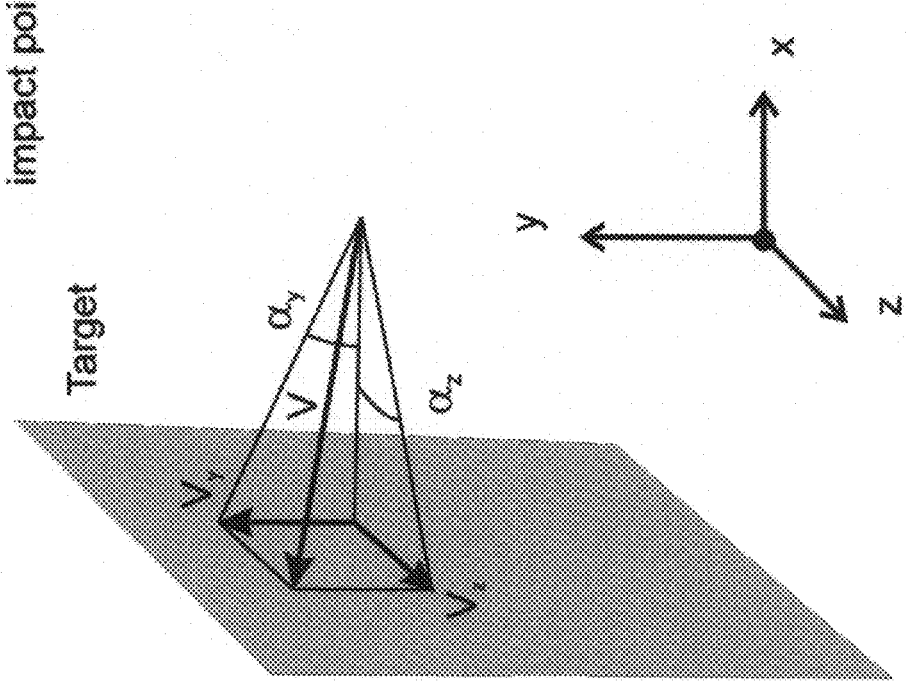
FIG. 4 illustrates the concept of impacts angles at a target.

"Collimation" refers to a beam having its degree of parallelism controlled by the use of a device (such as a magnet) in the XY plane as well as the XZ plane. As shown in FIG. 3, the rays can be made to converge, diverge, or to be parallel with respect to each other. Further, FIG. 4 illustrates the concept of beam collimation. The angle $\alpha_y$ refers to ion ray (and beam) collimation in plane XY. The angle $\alpha_z$ refers to ion ray (and beam) collimation in plane XZ. If the plane XY is considered horizontal (i.e., the plane that is parallel with the magnetic poles), the angle $\alpha_y$ may be called the "azimuth" angle (for beam deflection in "left" and "right" direction), while the angle $\alpha_z$ may be called the "elevation" angle (for beam deflection "up" and "down"). For a CM with ideal collimation properties, impact angles $\alpha_y$ and $\alpha_z$ should substantially take a value of zero for any ion ray in the ion beam (i.e., every exit ion trajectory is normal to the target).

Figure 5:
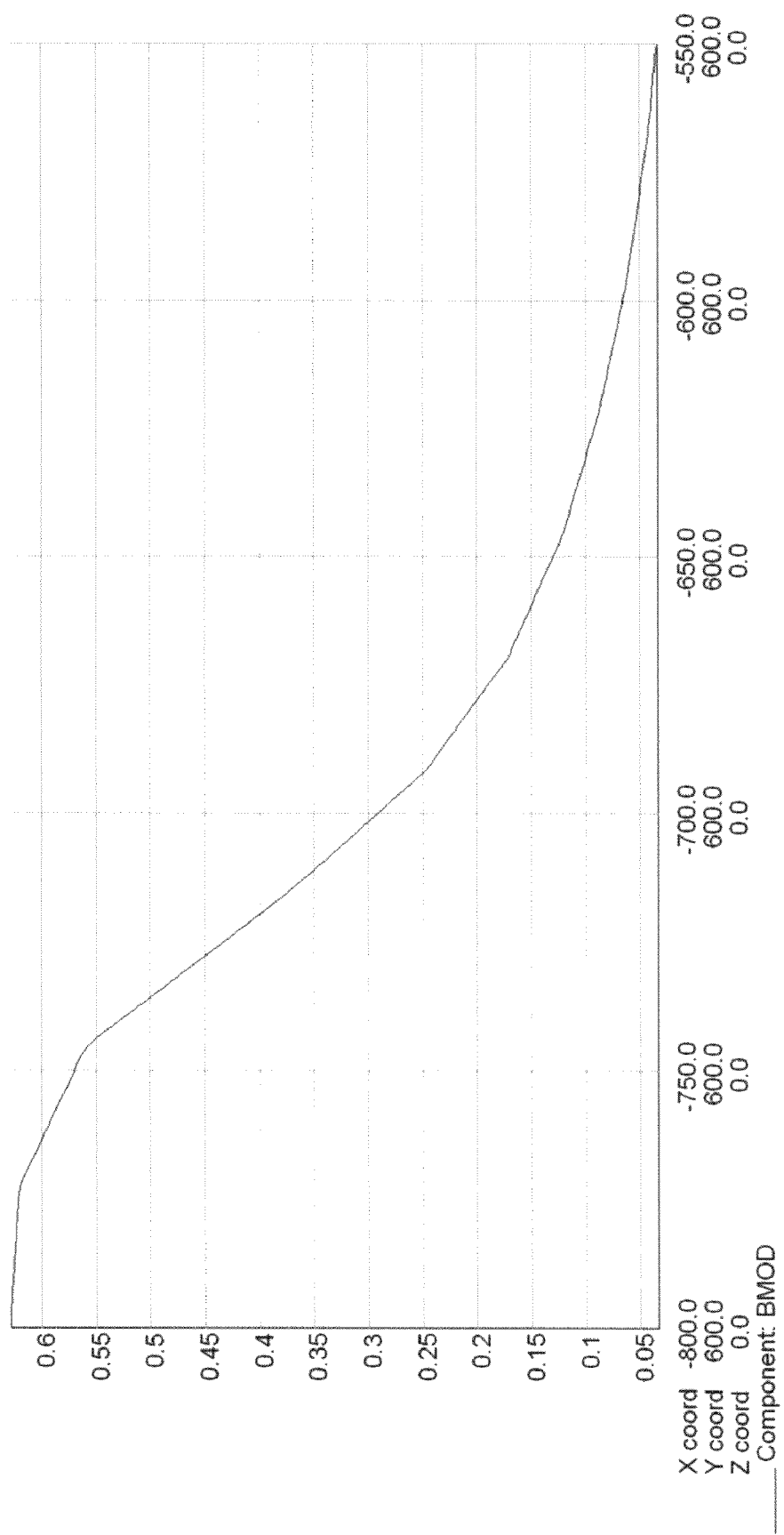
FIG. 5 illustrates the concept of a magnetic field of a CM with respect to the X-axis, to illustrate the field fringe effect.

The "fringe effect" refers to "magnetic field fringe", which is magnetic field that extends outside the physical borders of the CM and plays a role in the precision of beam collimation, as further explained below. FIG. 5 illustrates the magnetic field (expressed in T units) of a CM along a line parallel with the X-axis (line y=600 mm, z=0 mm). The geometrical position of the CM edge along this line is x=−740 mm. The magnetic field is constant inside the CM, and decreases to substantially zero outside. As the magnetic field extends far from the CM, the fringe effect can be significant. Magnetic field fringe effects also occur (to a lesser extent) within the geometrical CM area.

Figure 6:
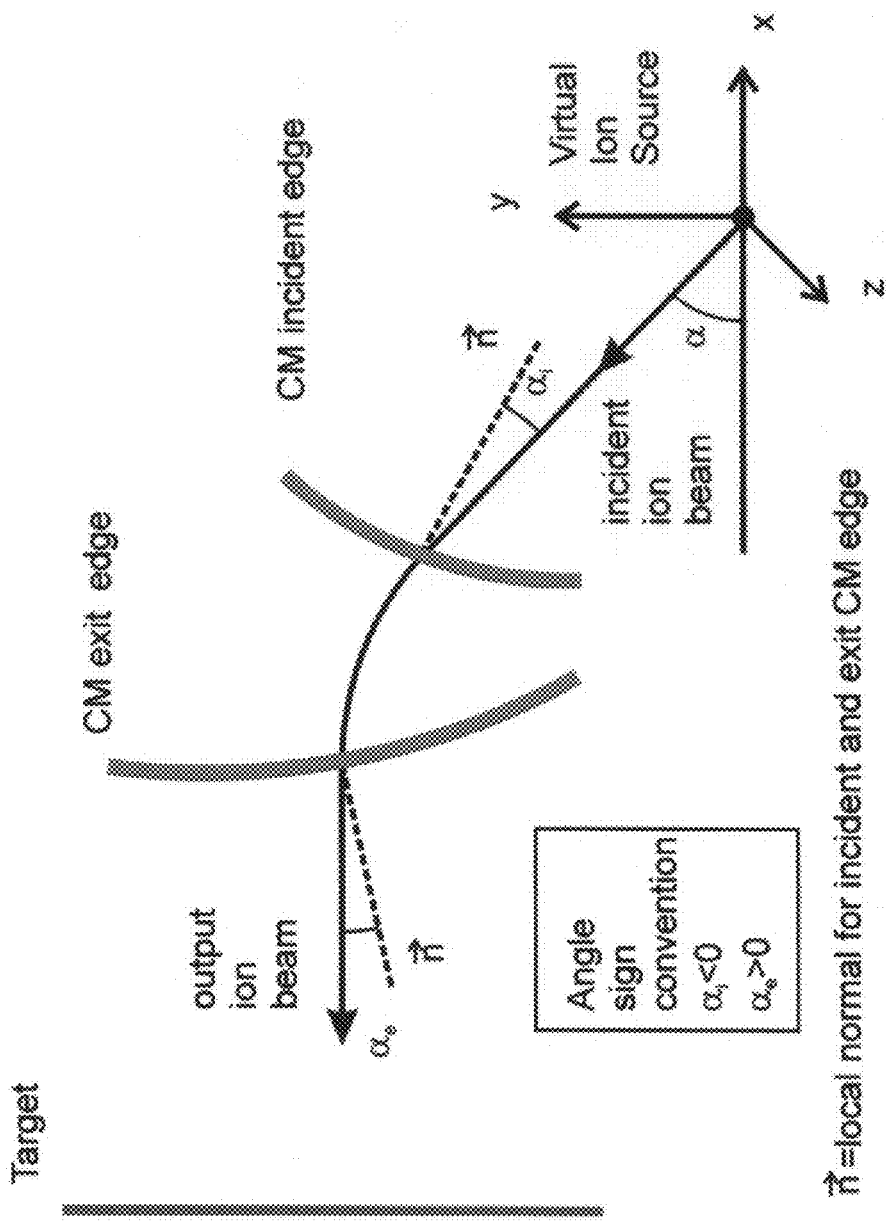
FIG. 6 illustrates the concept of "incidence angle" and "exit angle" and the sign concept.

FIG. 6 illustrates the concept of "incidence angle" and "exit angle" for the collimator magnet, and the convention chosen for the sign of the angles. A virtual ion source as shown in the bottom right area of FIG. 6 generates an ion beam composed of rays with angular position $\alpha$. The ion ray impinges upon the CM at an incidence angle $\alpha_i$ with respect to the local normal at the CM incidence edge, and exits the collimator magnet at an exit angle $\alpha_e$ with respect to the local normal at the CM exit edge. The incident edge faces the virtual ion source and the exit edge faces target (e.g., wafer) side. The sign angle convention for situation shown in FIG. 6 is $\alpha_i<0$ and $\alpha_e>0$. Incident and exit angles change sign if the ion ray and the local normal exchange their relative position.

Aspects of the exemplary, non-limiting embodiments relate to a collimator magnet ("CM") for an ion implantation system that compensates for the fringe field effect in achieving parallelism of an ion beam in the ion implantation system, and optionally for the space charge effect. The beam is composed of charged particles that have the same charge, and the charge is either positive or negative. The CM receives a beam composed of ions and performs angular deflection for each ray in the beam so as to generate parallel rays in the exit beam. The CM according to the exemplary, non-limiting embodiments addresses the fringe field effects at both edges of the CM, considering beam deflection in one plane (XY) or in two orthogonal planes (XY and XZ). For example, one or both surfaces (incoming and/or exit) of the CM is shaped so that all rays impinge at the same angle, or exit at the same angle, or, alternatively, a relationship between incidence and exit angles exists for each ray in the beam.

The CM according to the exemplary embodiments includes three exemplary, non-limiting embodiments, as disclosed below. These exemplary embodiments consider the type of compensation that is performed.

In the first exemplary, non-limiting embodiment, the CM takes into account the fringe field effect and accomplishes precise parallelism of a ion beam in the XY plane. This is referred to as CIACM and CEACM below.

In the second exemplary, non-limiting embodiment, the CM takes into account the fringe field effect and accomplishes precise parallelism of an ion beam in the XY plane as discussed above, and further, accomplishes precise parallelism of the ion beam in Z direction, namely XZ plane. This is referred to below as CSACM with a sum of the incident and exit angles being substantially zero.

In the third exemplary, non-limiting embodiment, the CM takes into account the fringe field effect and accomplishes precise parallelism of an ion beam in the XY plane and the accomplishes precise parallelism of the ion beam in Z direction, namely the XZ plane, as discussed above, and further, compensates for the space charge effect. The space charge effect refers to the interaction between ions which, at high current, generates coulomb forces that create divergence. As a result, the beam may be undesirably diverged in the XZ plane. The space charge effect is discussed in greater detail below. This is referred to below as CSACM with the sum of the incidence angles being constant or non-constant.

The exemplary embodiments of the CMs include a Constant Incidence Angle Collimator Magnet (hereinafter called "CIACM"), Constant Exit Angle Collimator Magnet (hereinafter called "CEACM"), and Constant Sum Angle Collimator Magnet (hereinafter called "CSACM"). The incidence angle and the exit angle are defined above with respect to FIG. 6, for example.

When a CM is designed for practical use as part of ion implantation systems, there are constraints such as ion beam width, aperture size of the CM, overall CM size, etc., which should be fulfilled by the CM. However, the exemplary embodiments are directed to the primary function of beam collimation, which is related to two constraints. The first constraint applies commonly to respective CMs, and the second constraint differs in respective CMs.

According to the first constraint, the exit ion beam is "perfectly" parallel according to the model (i.e., it is recognized that a model can produce a "perfectly" parallel exit ion beam, whereas the physical implementation is subject to external considerations and is thus "substantially" parallel). Thus, the shape of the exit edge curve of the CM must generate a "perfectly" parallel exit beam according to the model. The exit edge curve is derived as function of an incident edge curve of the CM, so as to achieve ion beam parallelism of exit beam. There is no other limitation on the CM that must fulfill the first constraint.

The second constraint is considered in the context of CIACM, CEACM and CSACM, as explained in greater detail below.

With respect to CIACM, the second constraint is that the incidence angle (IA, referred to as $\alpha_i$) of the beam at the magnet incident edge curve is substantially constant. Imposing a "constant incidence angle" (CIA) permits the incident edge curve of the collimator magnet to be defined. In the case of CIACM, the magnetic field fringe effects (which otherwise are unavoidable) are at least held to be substantially similar for all ions in the beam.

Figure 7:
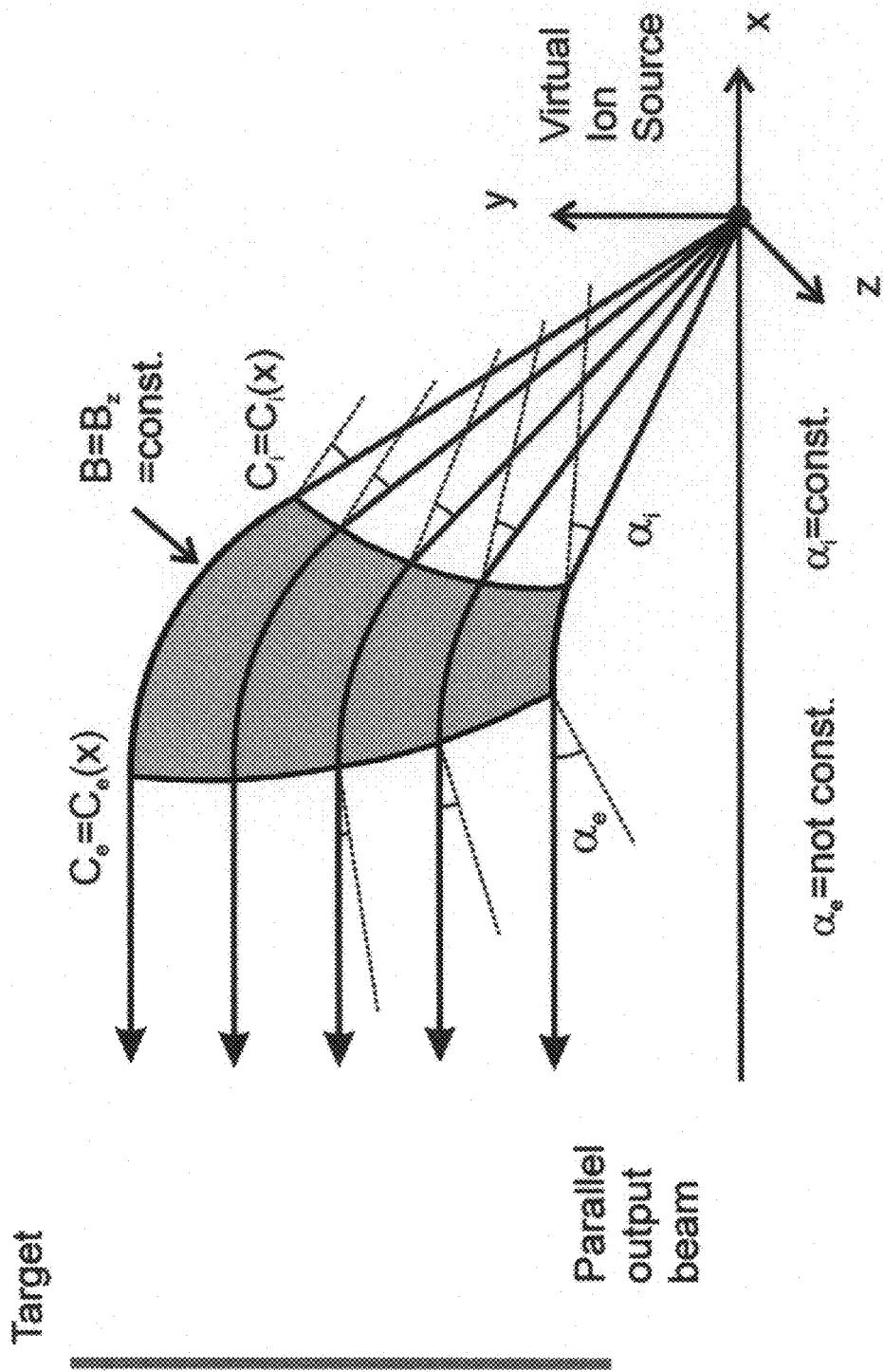
FIG. 7 illustrates an exemplary, non-limiting embodiment of a Constant Incidence Angle Collimator Magnet (hereinafter called "CIACM")

FIG. 7 illustrates an exemplary, non-limiting embodiment of CIACM. More specifically, an ion beam enters the CM from a virtual ion source (VIS), in the XY plane. It should be noted that the VIS represents a physical unit of the implantation system from which the CM ultimately receives ions, such as a beam sweep magnet (BSM), as explained below in greater detail. The region of the uniform magnetic field corresponds to the gap space of sector magnets, as defined by non-circular edge curves at Ci=Ci(x) and Ce=Ce(x) for respective incident and exit edge curves. The magnetic field also extends beyond the CM edges with decreasing field values, defining the region of magnetic field fringe effects. For example, Ci represents the CM incident edge and Ce represents the CM exit edge. The CM transforms the convergent ion beam from the virtual ion source into a parallel ion beam at the CM exit. Further, for any ray in the beam, the incidence angle $\alpha_i$ between the incident ray and the local normal to the Ci curve is substantially constant. In view of this requirement, the edge curves of the CM at the incident and exit edge are defined as explained below.

Figure 8:
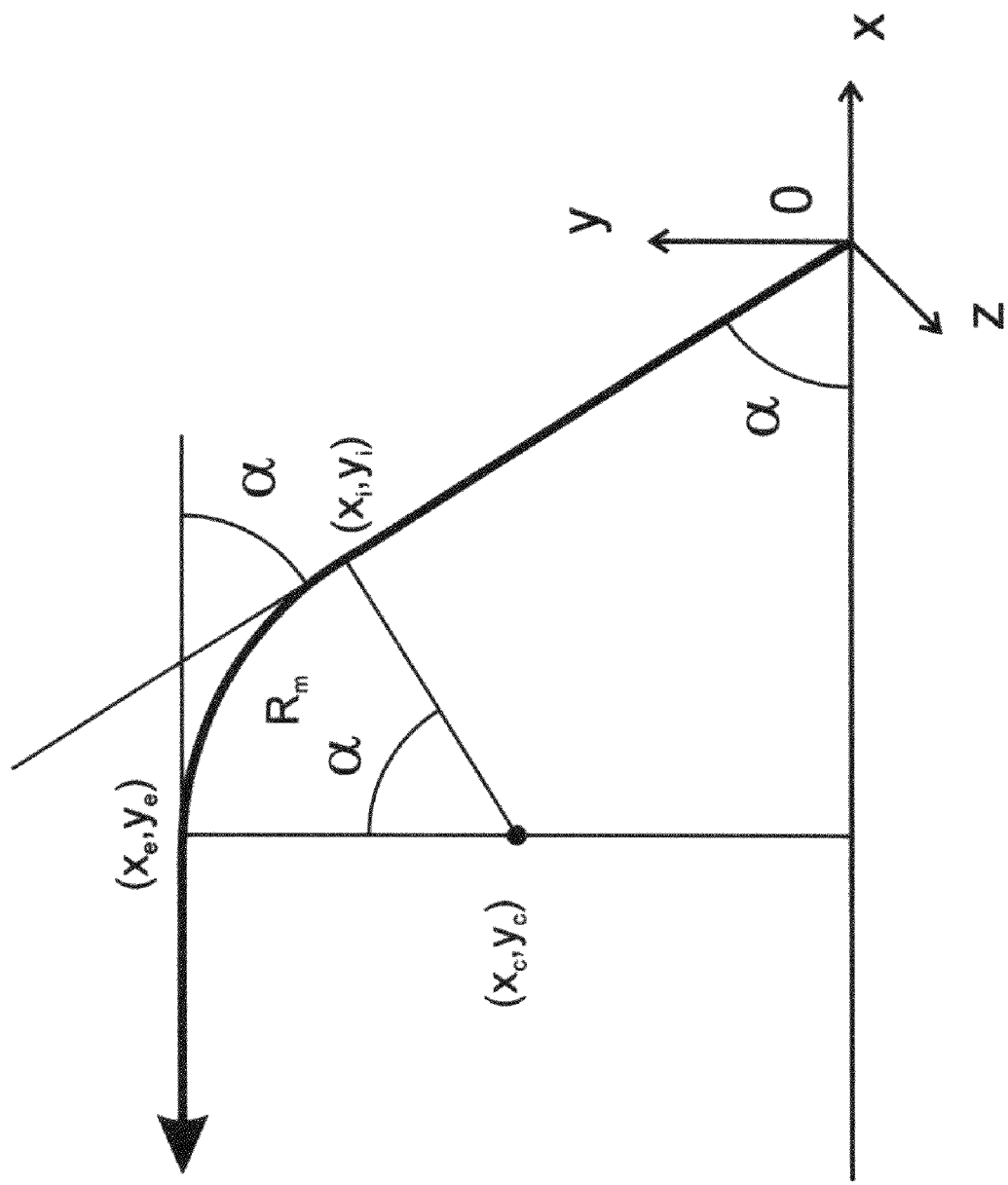
FIG. 8 illustrates the ion trajectory deflected by the CM when no magnetic field fringe effects are considered, according to an exemplary, non-limiting embodiment.

FIG. 8 illustrates the ion trajectory deflected by CM when no magnetic field fringe effects are considered, according to an exemplary, non-limiting embodiment of the present invention. As shown in FIG. 8, total beam deflection angle for a ray described by angular position $\alpha$ is equal with $\alpha$. The ion trajectory inside the CM is represented by $R_m$, wherein the arc of the circle is also $\alpha$. FIG. 8 applies to the below-discussed equations with respect to the determination of the edge shapes for CIACM, CEACM, and CSACM.

In terms of choosing the shape of the edge curves for the CIACM, the CM incident edge curve with respect to virtual ion source is chosen in a manner that results in a substantially constant incidence angle $\alpha_i$ for the incident beam. (i.e., the angle between an ion ray and the local normal to the CM incident curve at the point where the ray contacts the incident edge). Additionally, the shape of the CIACM exit edge curve must also be configured. For the CIACM, the exit profile of the CM assures a parallel ion beam at the exit of the CM.

The selection of the shape of the CIACM is as follows. The exit coordinates of the beam can be determined based on the incident coordinates, and the exit edge of the CM is determined by the following equations, when the incident edge of the CM is known.

$$x_e = x_i + \Delta x \quad (1)$$
$$y_e = y_i + \Delta y$$
$$\Delta x = -R_m \sin(\alpha)$$
$$\Delta y = R_m(1 - \cos(\alpha))$$
$$\alpha = a\tan\left(\frac{y_i}{|x_i|}\right)$$

The following equation is applied when magnetic field fringe effects are taken into account and intended to be compensated. In this case, the total beam deflection is $\alpha-\alpha_c$, where $\alpha$ is the angular position of the beam and $\alpha_c$ is the compensation angle.

$$x_e = x_i + \Delta x \quad (2)$$
$$y_e = y_i + \Delta y$$
$$\Delta x = -R_m(\sin(\alpha) + \sin(\alpha_c))$$
$$\Delta y = R_m(\cos(\alpha_c) - \cos(\alpha))$$
$$\alpha = a\tan\left(\frac{y_i}{|x_i|}\right)$$

Figure 9:
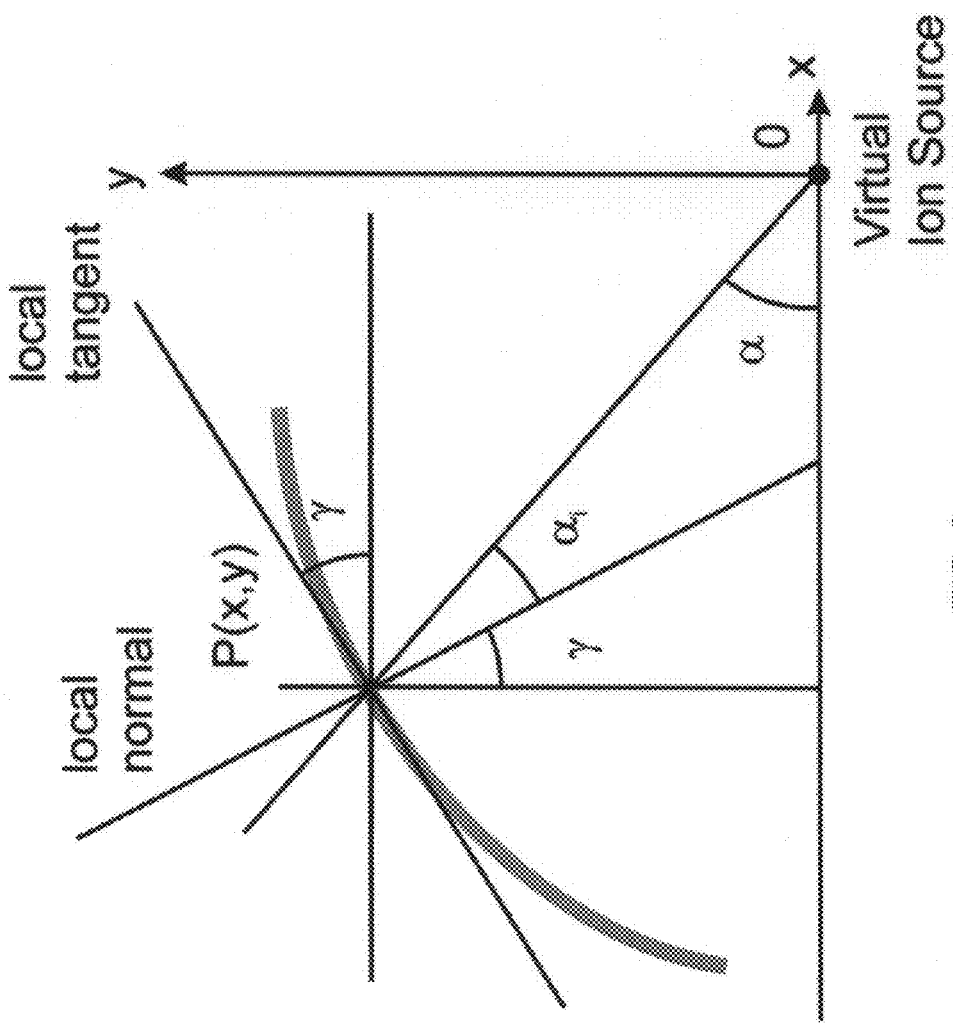
FIG. 9 illustrates the definition of the constant incidence angle curve in terms of y(x), for CIACM, according to an exemplary, non-limiting embodiment.

The exit edge of the CM has been defined so far as a function of the incidence edge, which is yet unknown. To apply the foregoing equations, it is necessary to obtain (or define) the CM incident edge. Moreover, the input profile Ci(x) of the collimator magnet is defined by the CIA property, which is explained above as the angle between the ion ray and the local CM normal, being constant for different rays within the beam. FIG. 9 illustrates the definition of the constant incidence angle curve in terms of y(x), which defines the incident edge of the CM and is obtained as a solution of the following differential equation:

$$\frac{dy}{dx} = \tan\left(-\alpha_i + a\tan\left(\frac{|x|}{y}\right)\right) \quad (3)$$

Figure 10:
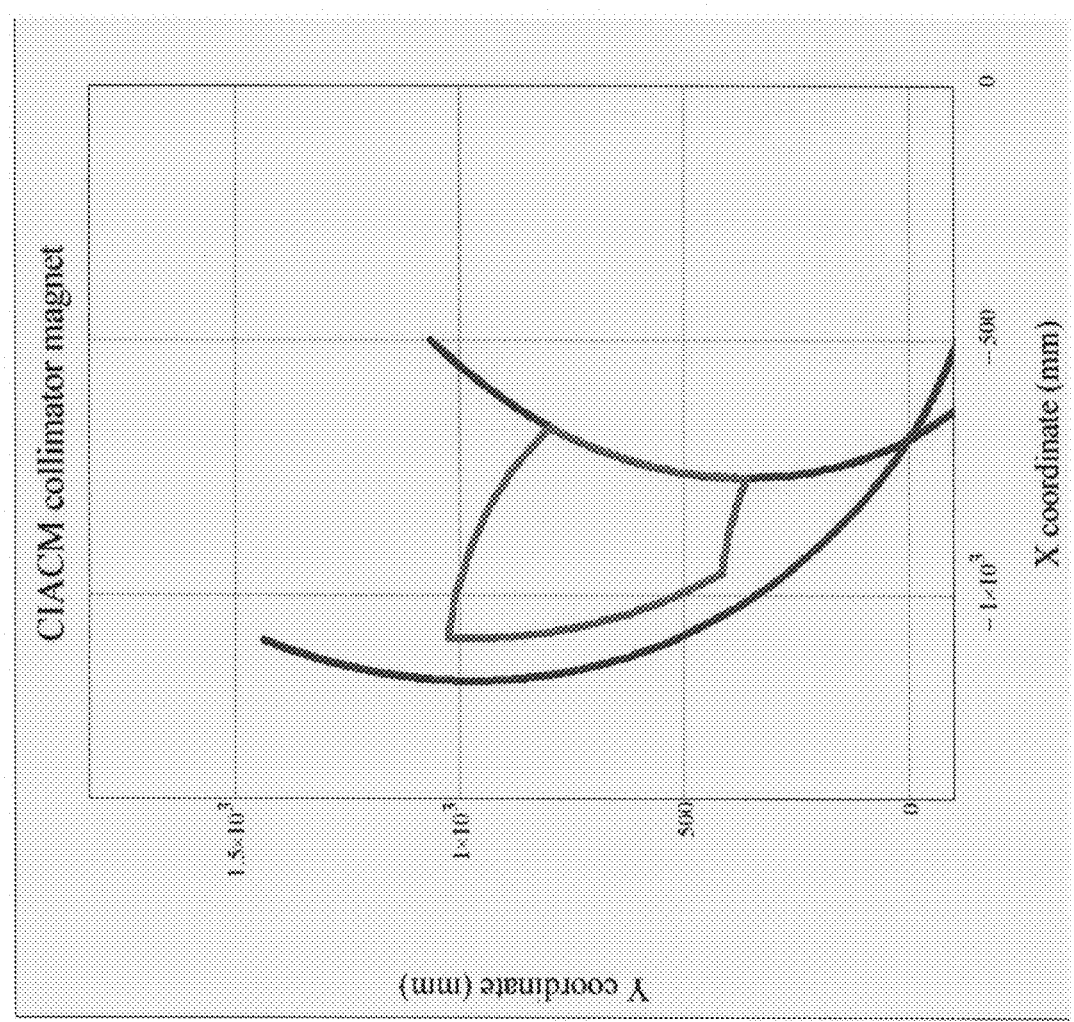
FIG. 10 illustrates an exemplary, non-limiting solution of the foregoing differential equation for CIACM, according to an exemplary, non-limiting embodiment.

Thus, the exit edge curve is structured as a function of the incident edge curve of the CM, according to CIACM. FIG. 10 illustrates an exemplary, non-limiting solution of the foregoing differential equation according to the present invention. The right side curve represents the CM incident edge solution of the differential equation. Accordingly, the left side curve is obtained from the preceding equations, using the solution of the differential equation. The close-loop shaped curve placed between the left and right no-end curves represents the shape of the CM after basic and fine tuning corrections have been applied for the magnetic field fringe effects have been applied. The foregoing curves are only intended to be exemplary in nature, and may be adjusted without departing from the scope of the invention. Adjusting may include, but is not limited to, at least one of the following: overall size of the CM, which corresponds to the allowable aperture of the beam used for ion implantation; position of the first ray in the beam, which is used for connecting the CM with previous elements in the line beam (the BSM, beam sweeping magnet); and strength of the magnetic field used for ion beam deflection (CM with higher magnetic field values may be thinner in size between incidence and exit edges).

Additionally, three-dimensional (3-D) numerical simulation may be employed for magnetic field computation and ion beam trajectories, so as to quantify the magnitude of magnetic field fringe effects and use this data to determine the CIACM exit curve.

In determining the incident and exit edge curves of the CIACM, two kinds of magnetic field fringe effects are considered: (a) ion beam deflection as a whole and (b) additional deflection of individual rays within the beam. This separation and classification is used as a logical tool that helps build the CM model, but for real ion beams the two effects always occur simultaneously.

With respect to (a), this is the difference angle between the exit ion trajectory for the "CM reference model" and the desired direction of collimation (i.e., along the X-axis). The CM reference model is initially taken as the CM model without consideration of magnetic field fringe effects, and then updated and refined as described below with respect to field fringe effects.

With respect to (b), this is considered for evaluating deflection of each ray within the ion beam, deflection that differs from ray to ray. For this purpose, an arbitrary reference ion ray within the beam is chosen, and for example, can be chosen as the ion ray which is deflected the least, such that all other rays in the exit beam are deflected more than the chosen "reference ray".

The angle for ion beam deflection ((a) above) as a whole is a constant angle ($\alpha_{c0}$) for all the rays in the exit ion beam. The additional deflection of individual rays within the beam ((b) above) are angles between the CM exit ion trajectories and the reference ion ray, referred to as $\alpha_{cv}$, which are not constant, but are actually different for different rays in the exit ion beam.

Compensation of (a) "ion beam deflection as a whole" and (b) "additional deflection of individual rays within the beam" are also referred to as "basic" and "fine tuning" compensation of beam deflection. "Basic" compensation for ion beam deflection is performed using the above-noted equations with respect to FIG. 8, to define the CIACM, where $\alpha_{c0}$ is constant. "Fine tuning" compensation of ion beam deflection, in addition to "basic" compensation, uses the total angle of compensation $\alpha_{c0}+\alpha_{cv}(x)$ in the above discussed equations to define the new CIACM. Basic and fine tuning compensation are discussed in greater detail below.

The foregoing steps of simulation, basic compensation and fine tuning, may be repeated iteratively, considering each time the previous level CIACM as reference model, so as to increase the precision of the exit beam parallelism. In one exemplary embodiment, only a single iteration of the foregoing steps is required to obtain sufficient precision of beam parallelism. However, the exemplary embodiments are not limited thereto, and iteration may be performed as needed to obtain the desired result.

Figure 11A:
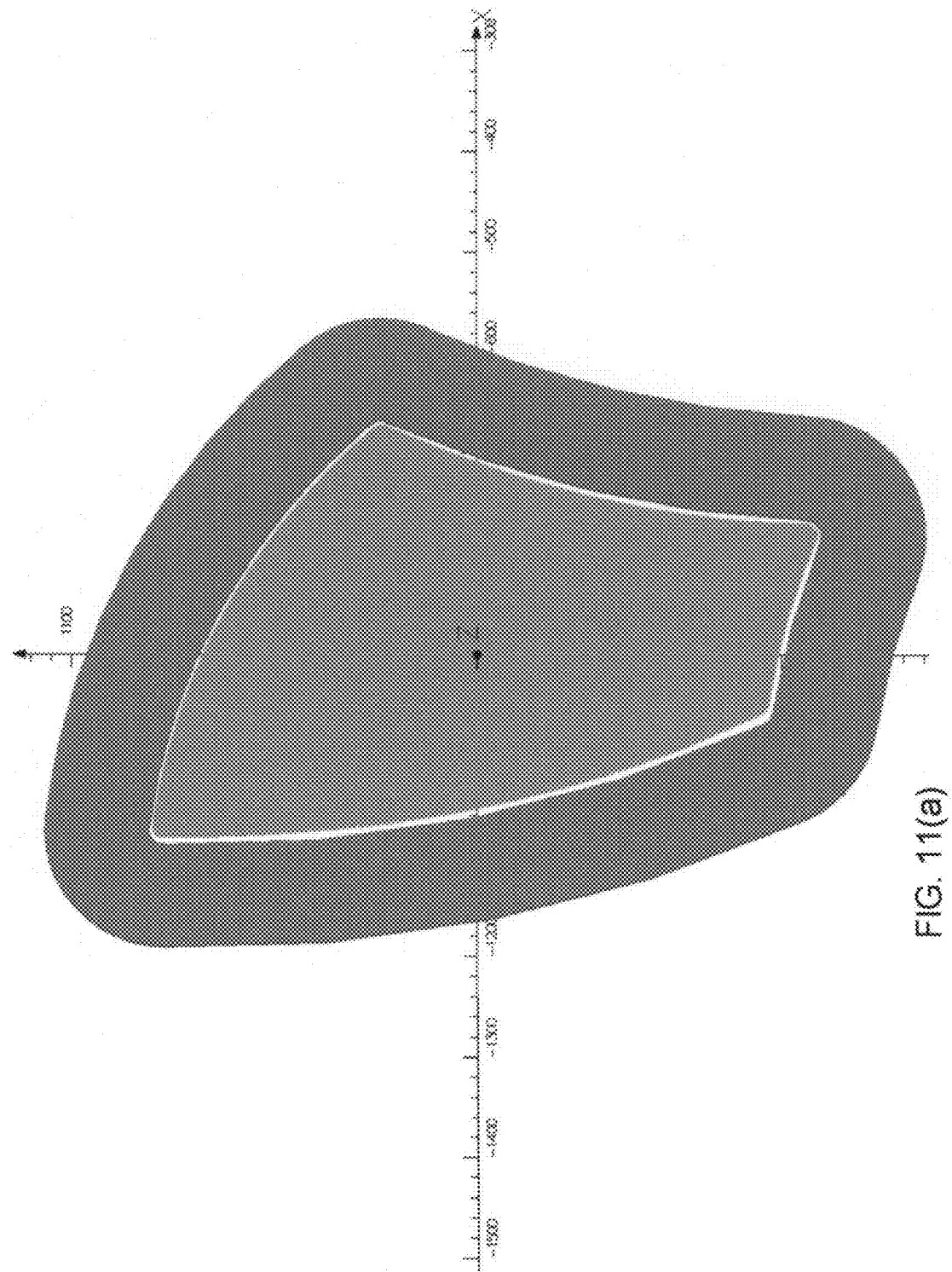
FIGS. 11(a)-(d) provide illustrations of shapes of the CIACM according to the exemplary, non-limiting embodiments of the present invention.
Figure 11B:
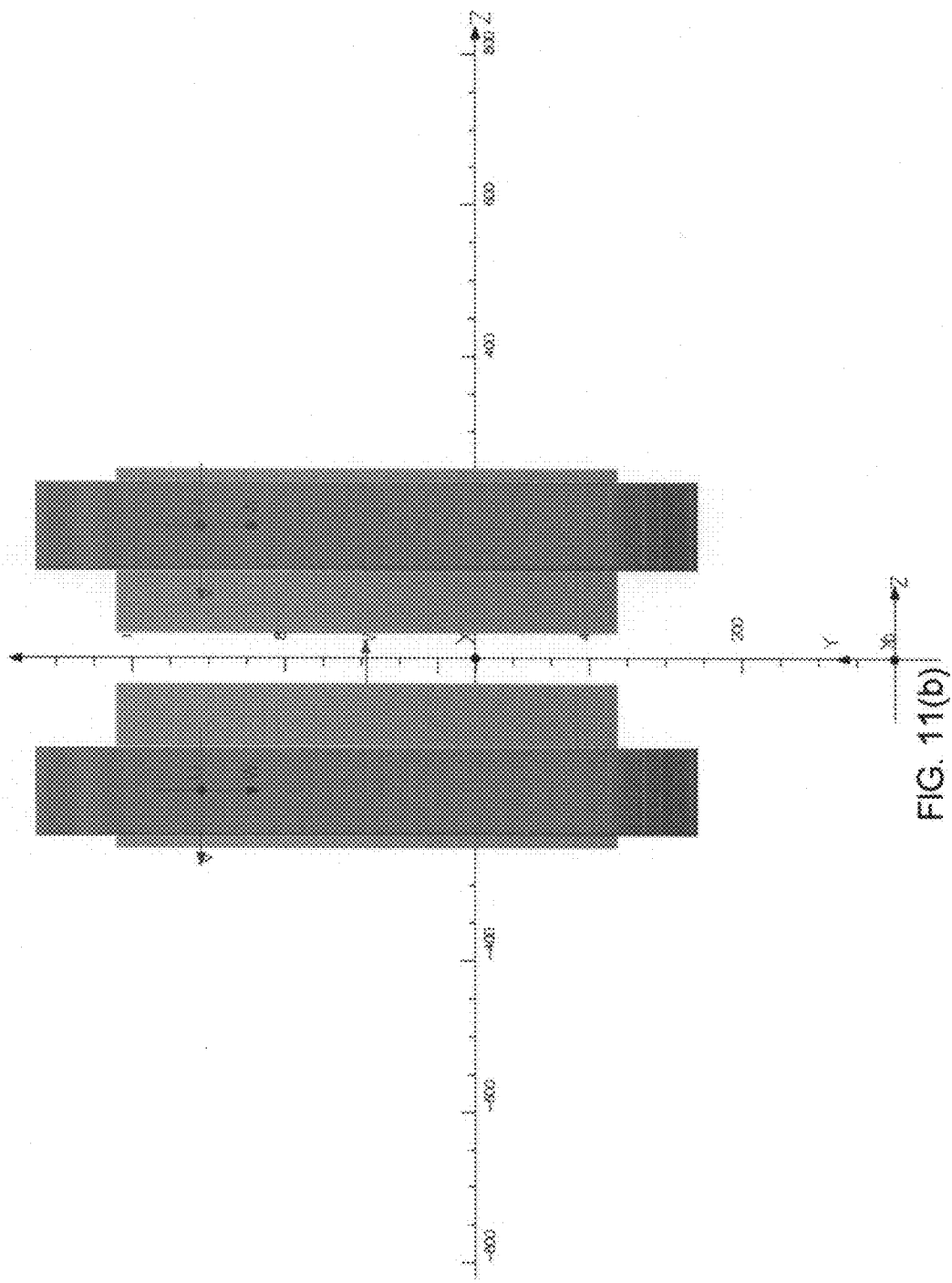
Figure 11C:
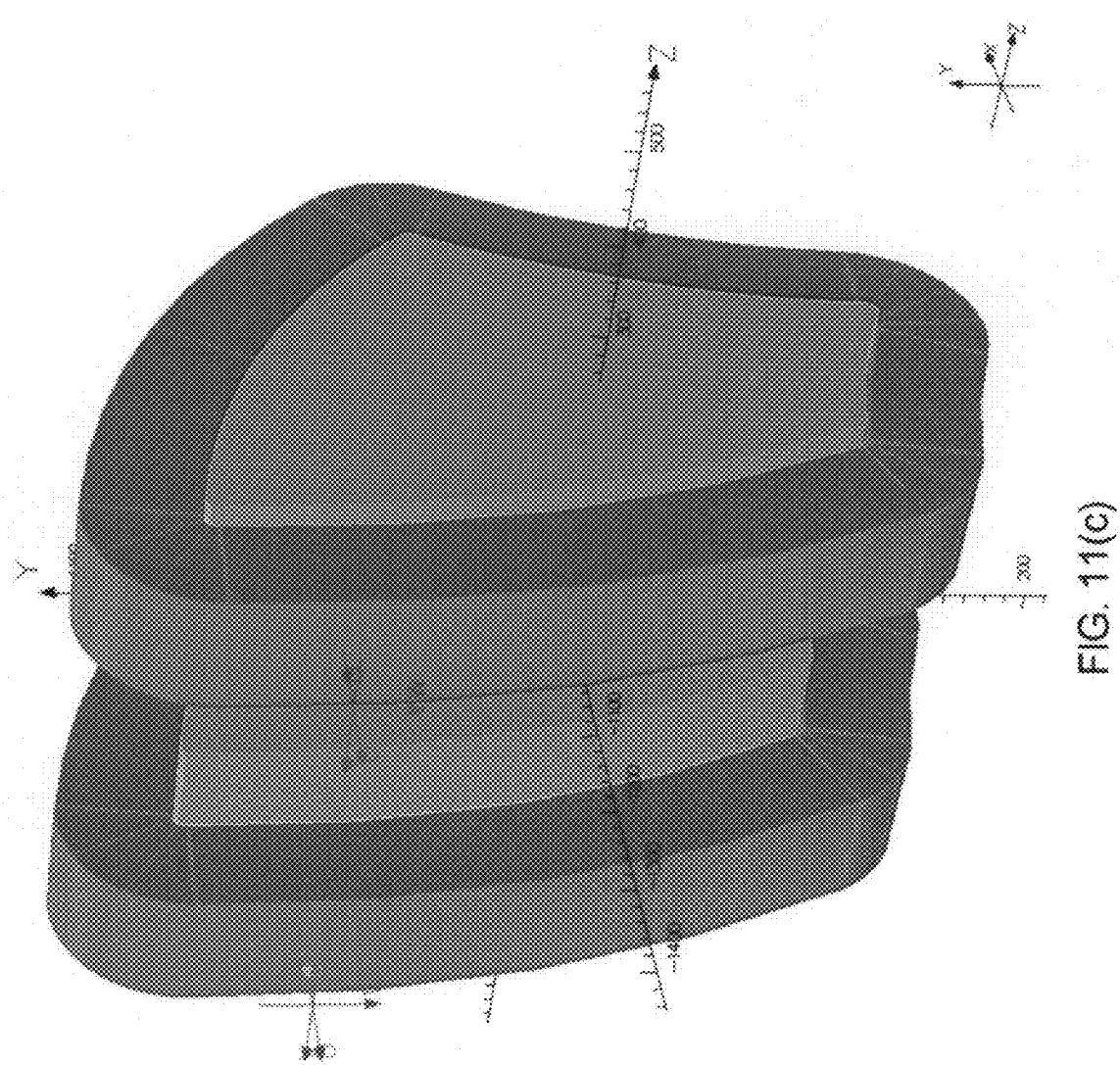
Figure 11D:
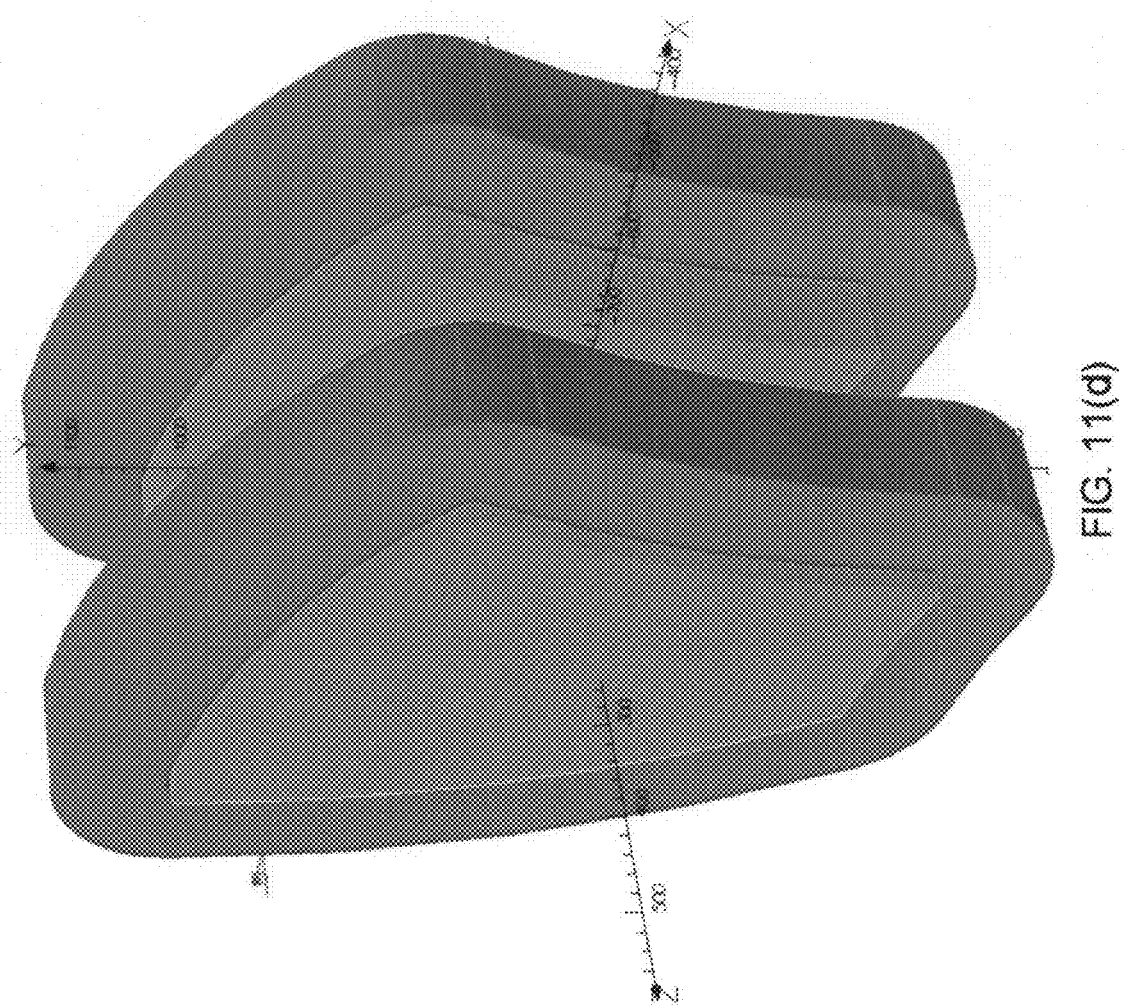

FIGS. 11(a)-(d) provide illustrations of shapes of the CIACM for ion beam trajectory with $R_m$=650 mm, according to the exemplary, non-limiting embodiments of the present invention. FIG. 11(a) and FIG. 11(b) show a projection of the CIACM in plane XY and YZ, respectively. FIGS. 11(c) and (d) show perspective views of the CIACM from front and back, respectively. The electrical coils are included in the drawing.

Figure 12:
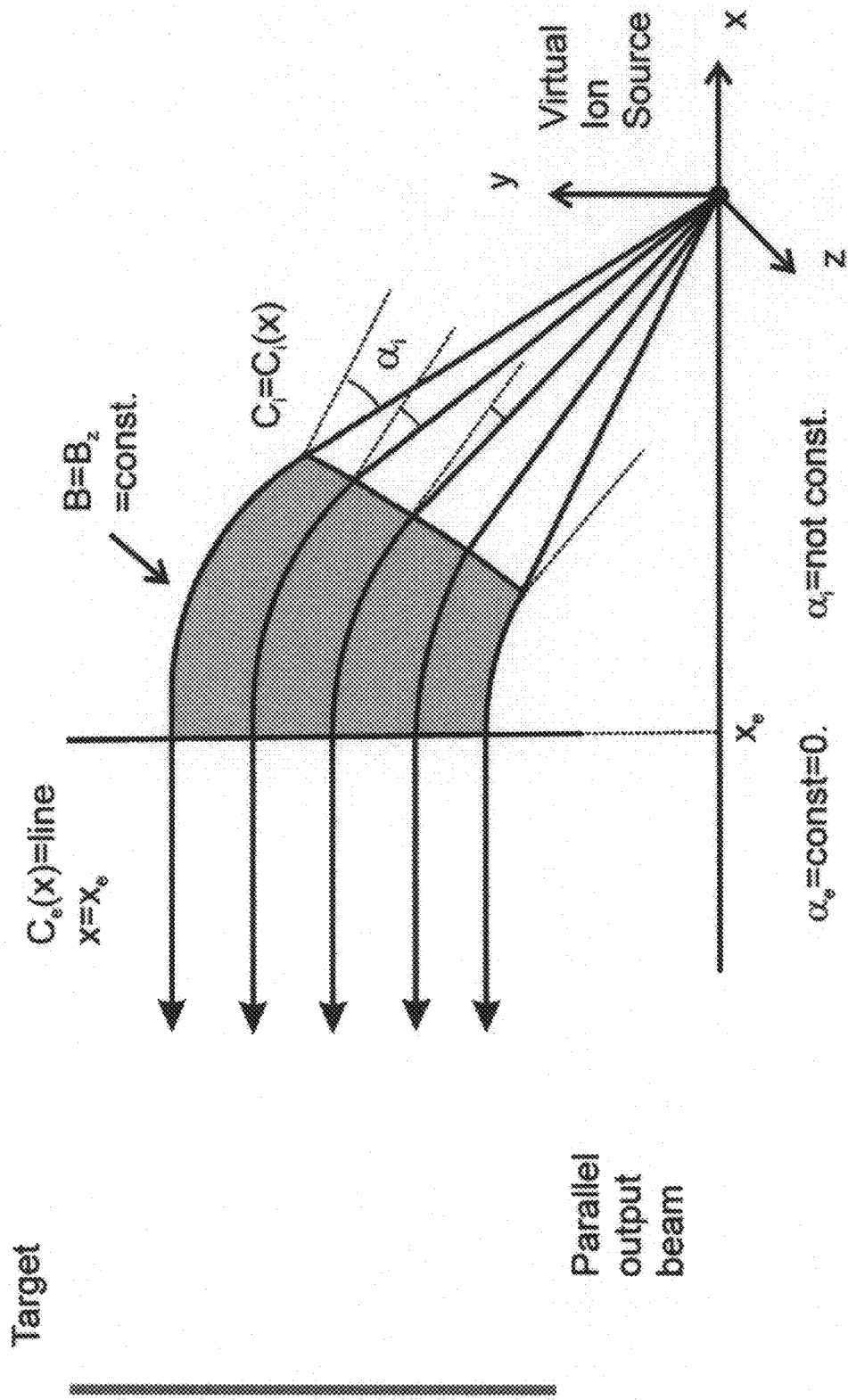
FIGS. 12 and 13 illustrate a Constant Exit Angle Collimator Magnet (hereinafter called "CEACM") according to exemplary, non-limiting embodiments.

According to CEACM, for the second constraint, the CM shape is chosen based on the exit angle being substantially constant. In other words, the angle between the exit beam that leaves the CM and the local CM normal is constant. FIG. 12 illustrates CEACM according to the exemplary embodiment. The CM exit edge $C_e$ is shown as a line with a slope that corresponds to the exit angle $\alpha_e$. One exemplary embodiment of CEACM is directed to the case where $\alpha_e$ is 0.

Figure 13:
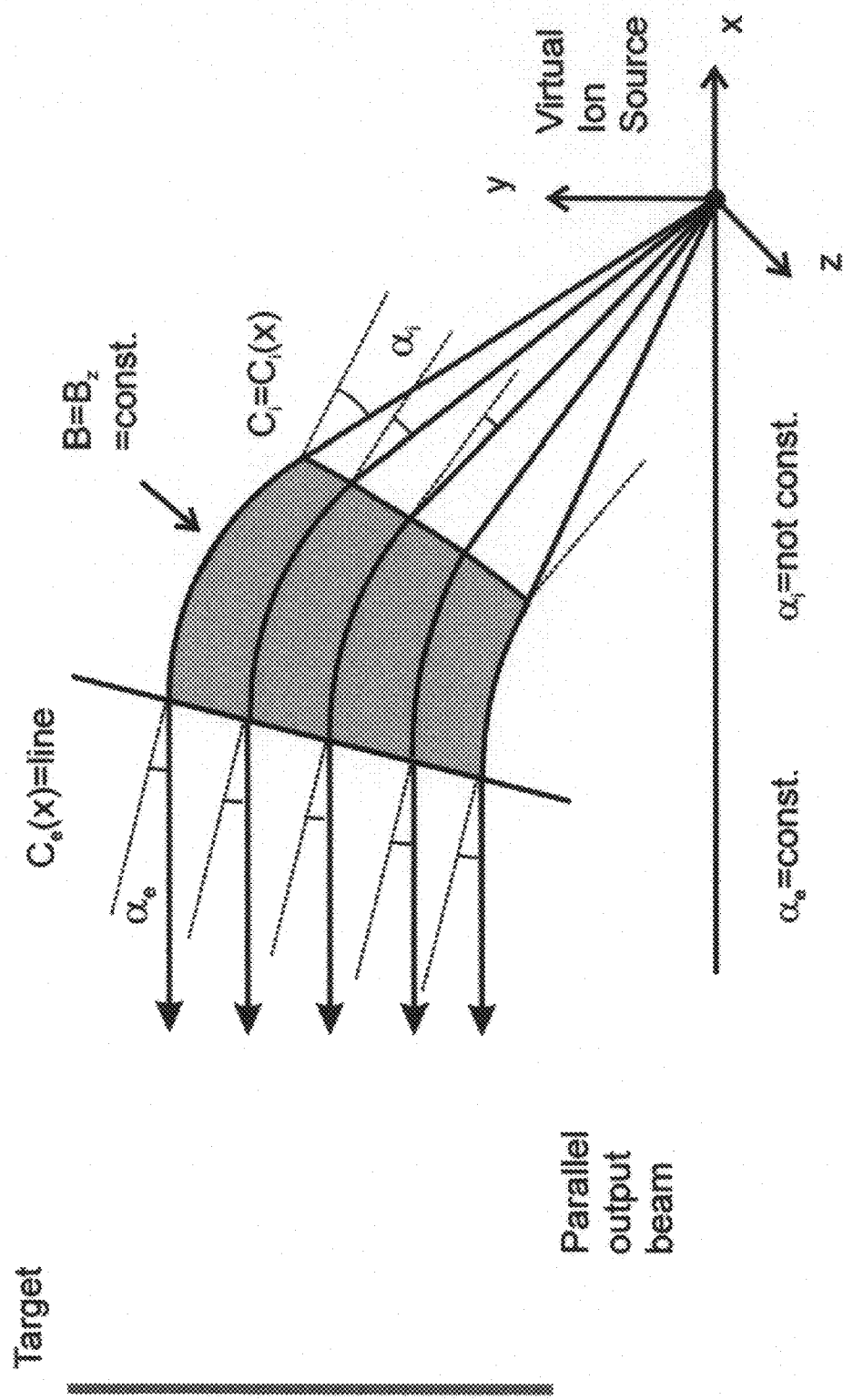

As shown in FIG. 12, the CM exit edge $C_e$ may be parallel with respect to the target. Alternatively, the CM exit edge $C_e$ of the CEACM may be non-parallel with respect to the target, as shown in FIG. 13.

The magnetic field fringe area is an area outside the physical border of the CM. While the magnetic field has uniform values inside the CM, on the outside of the CM, the magnetic field has values that decrease with distance from the CM. This magnetic field fringe field provides deflection for the ion beam in addition to the deflection due to the uniform magnetic field inside the CM. Magnetic field fringe effects cannot be "deleted", as well as the corresponding additional deflection of the beam. However, if all the rays in the beam experience substantially similar additional deflection, then magnetic field fringe effects can be considered. For CIACM and CEACM, the additional ray deflection depends on the angle of incidence or exit of the ray (which are related to the length of the trajectory in magnetic field fringe area). Imposing a constant $\alpha_i$ or $\alpha_e$ assures similar additional deflection for all rays in the beam.

The additional beam deflection is only approximately equal for all rays in the beam (i.e., when $\alpha_i$ is constant, then $\alpha_e$ is not constant anymore, and vice versa). For CSACM, each ray in the beam has different $\alpha_i$ and different $\alpha_e$, but $\alpha_i+\alpha_e=0$, which assures that the total additional deflection is (substantially) similar for each ray in the beam. While some rays have shorter length of incident path and longer length of exit path and vice-versa, the total length of path is similar for all rays in the beam. This condition is also related to beam deflection in XZ plane, assuring beam collimation with respect to Z direction.

The selection of the shape of the CEACM is as follows. The general concepts that apply to the incident edge curve structure and the exit edge curve structure for CIACM also apply to CEACM. The substantial difference is the equation to be used in the calculations discussed below with respect to FIGS. 8 and 14. More specifically, the incident coordinates can be calculated based on the exit coordinates, which are known based on the exit edge curve of the CM. Accordingly, the incident edge curve of the CM has been defined parametrically, in view of the parameter $\alpha$ giving the angular position of the ray. The equations are as follows:

$$x_e(\alpha)=x_{e0}=\text{const}$$

$$x_i(\alpha)=R_m \sin(\alpha)-|x_e|$$

$$y_i(\alpha)=|x_i|\tan(\alpha)$$

$$y_e(\alpha)=y_i(\alpha)+R_m(1-\cos(\alpha)) \quad (4)$$

Figure 14:
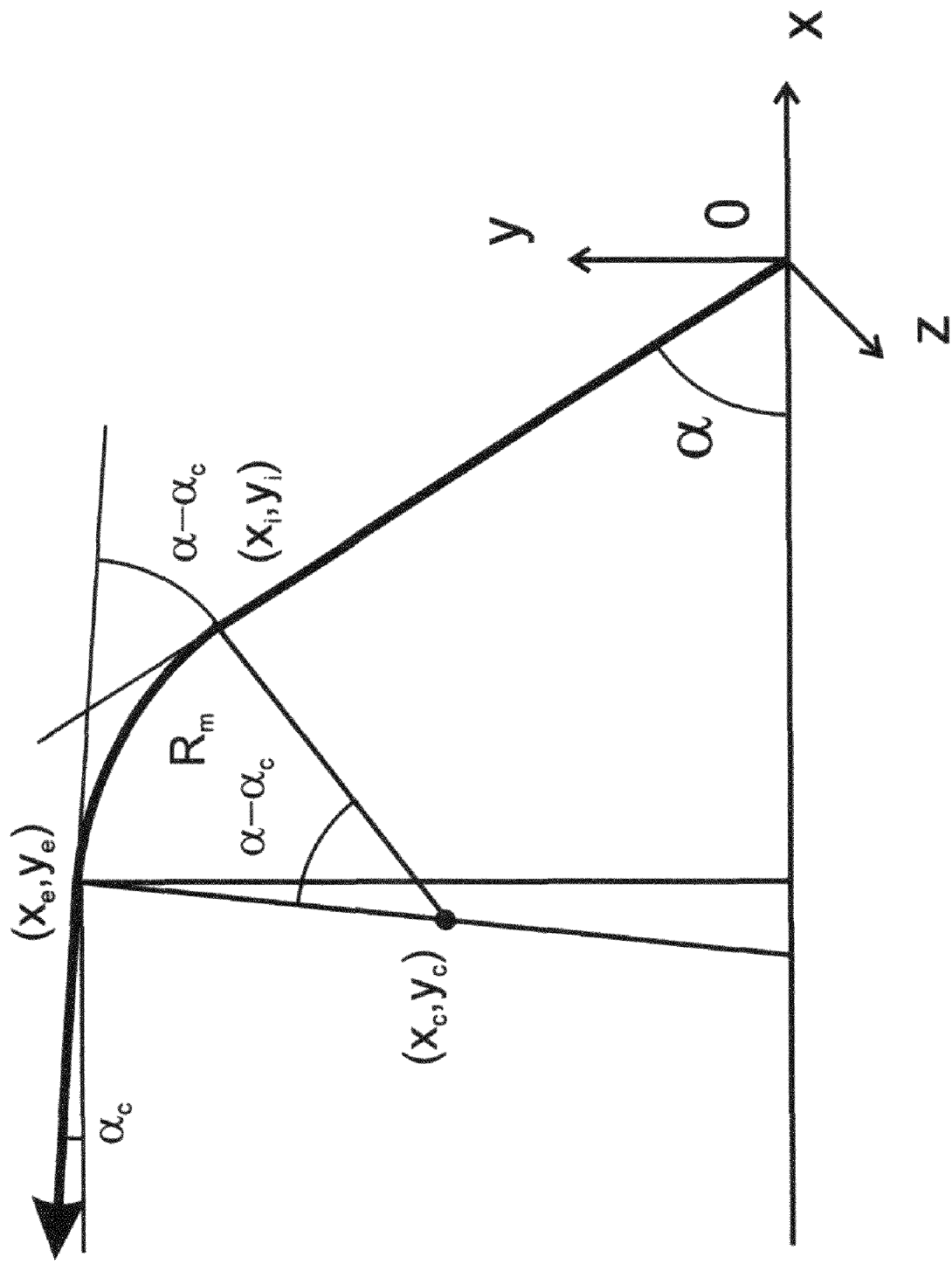
FIG. 14 illustrates the ion trajectory deflected by the CM when magnetic field fringe effects are considered for compensation, according to an exemplary non-limiting embodiment.
Figure 15A:
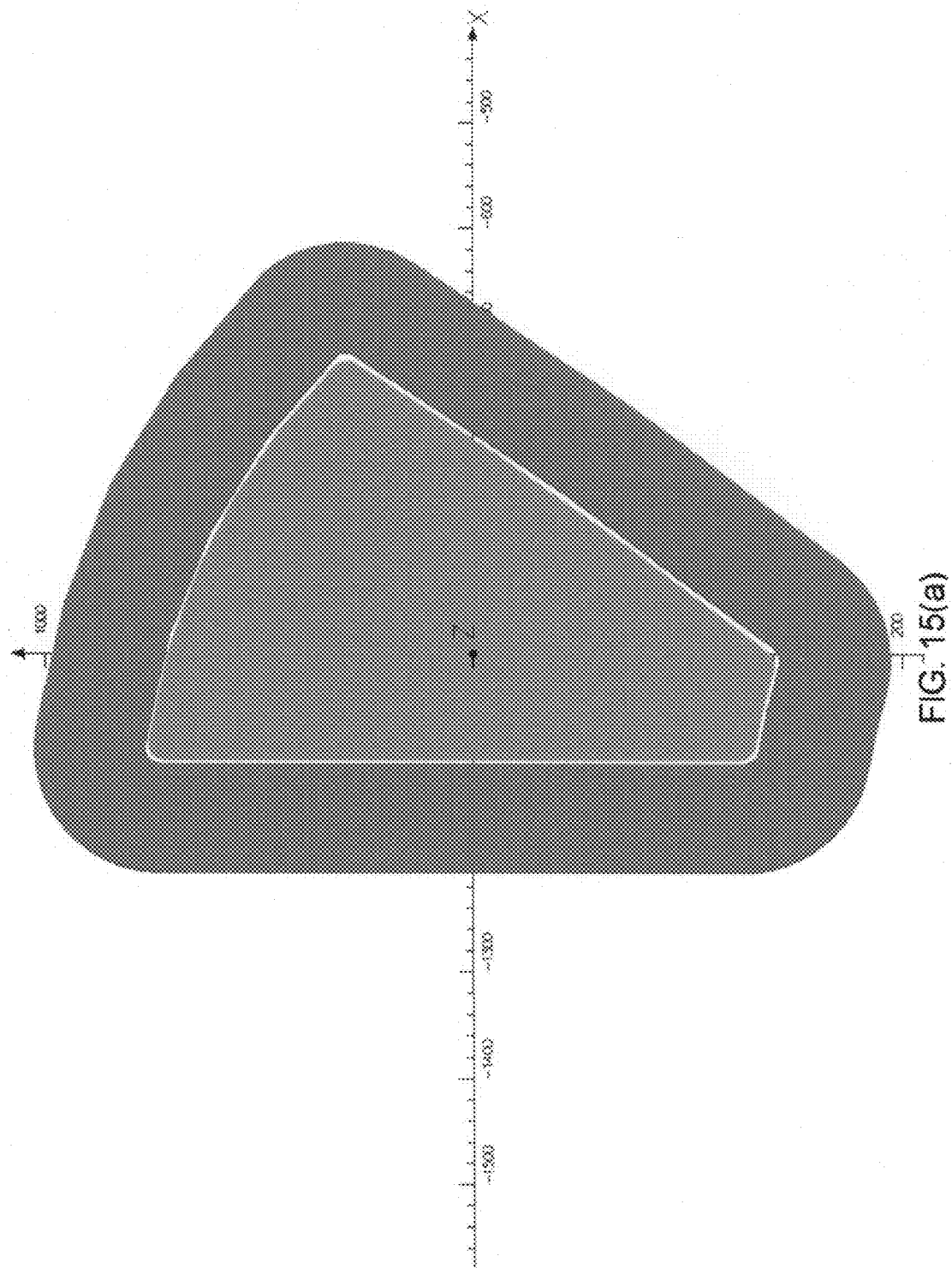
FIGS. 15(a)-(d) provide illustrations of shapes of the CEACM according to the exemplary, non-limiting embodiments of the present invention.
Figure 15B:
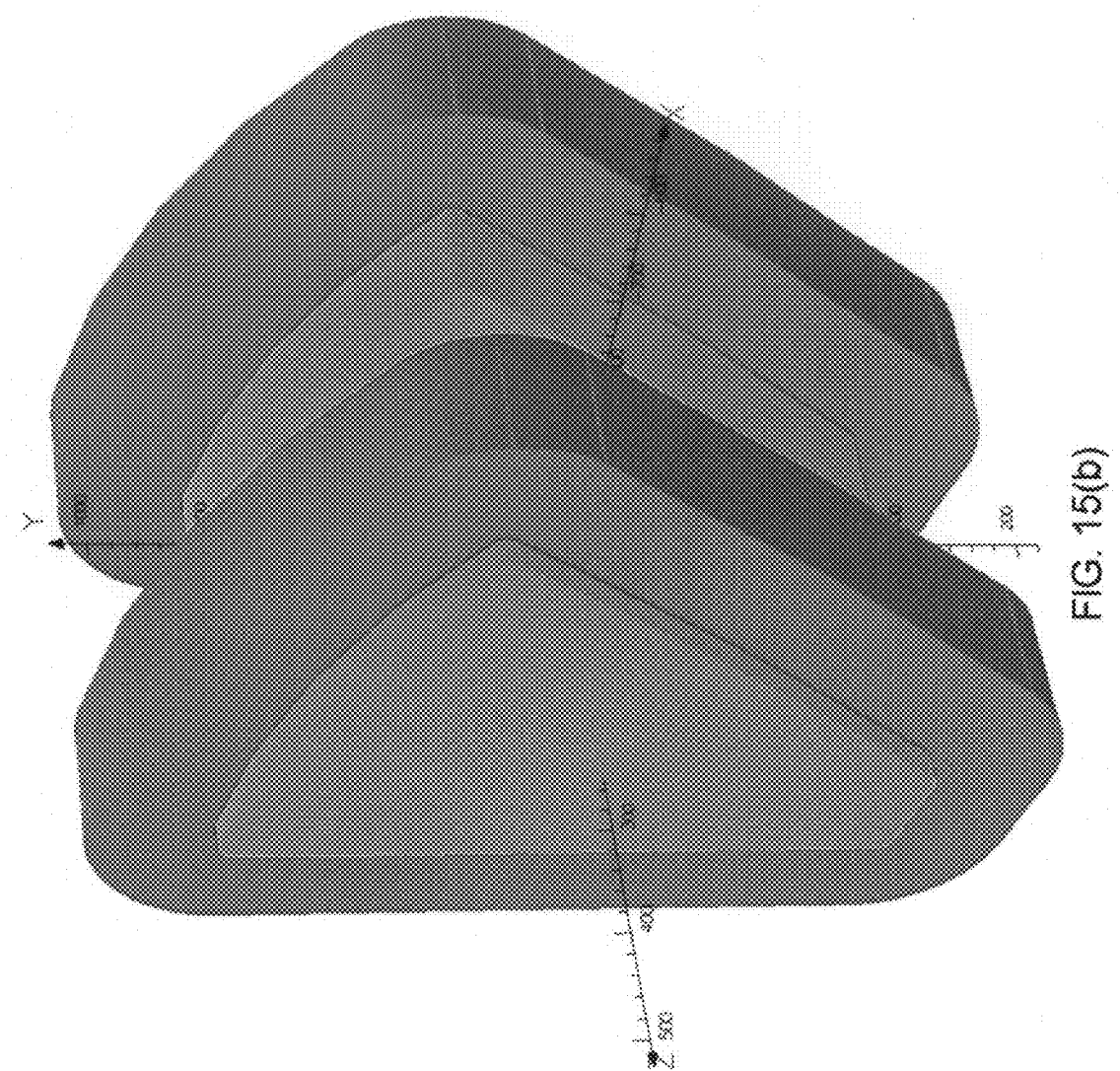
Figure 15C:
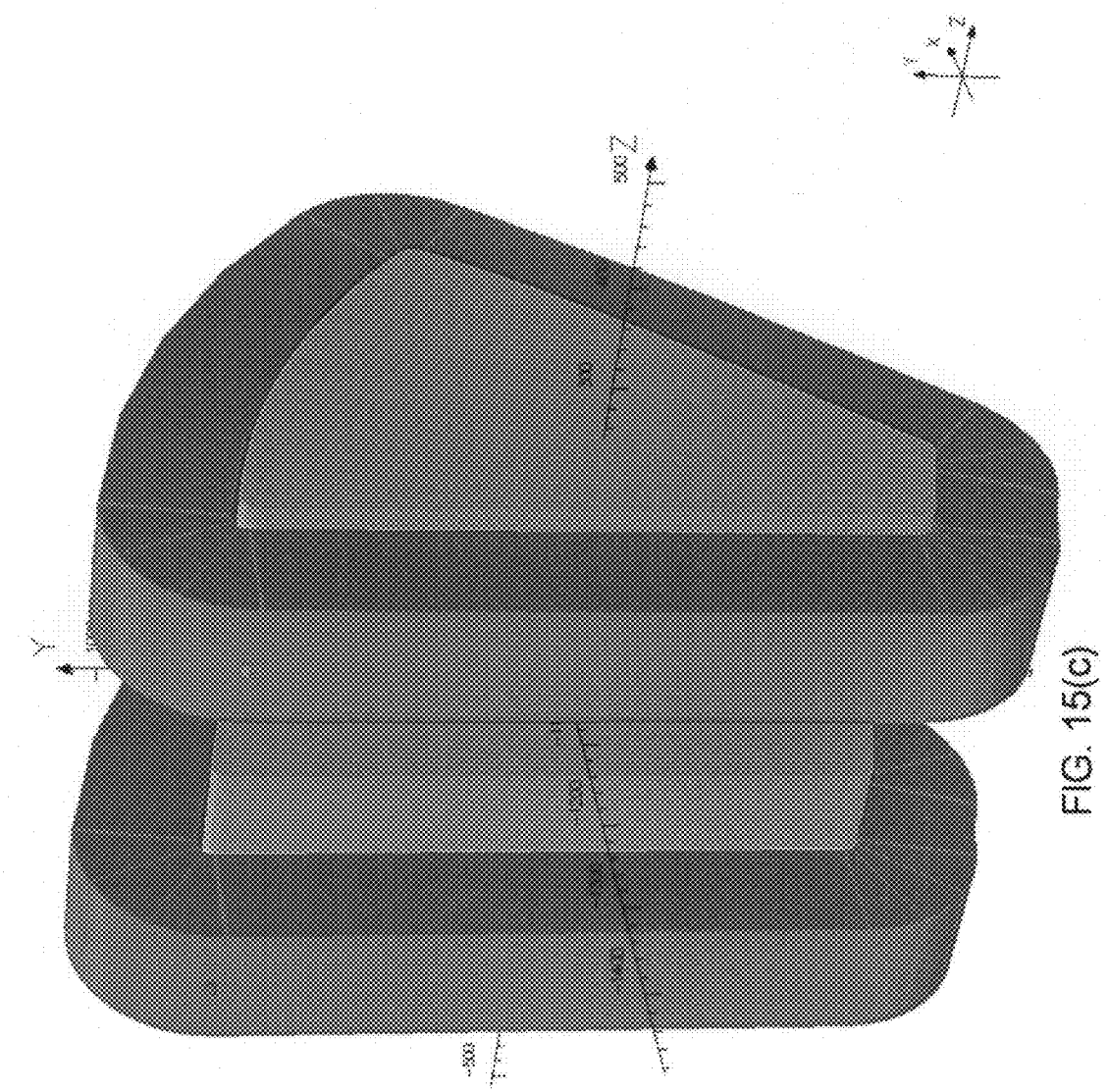
Figure 15D:
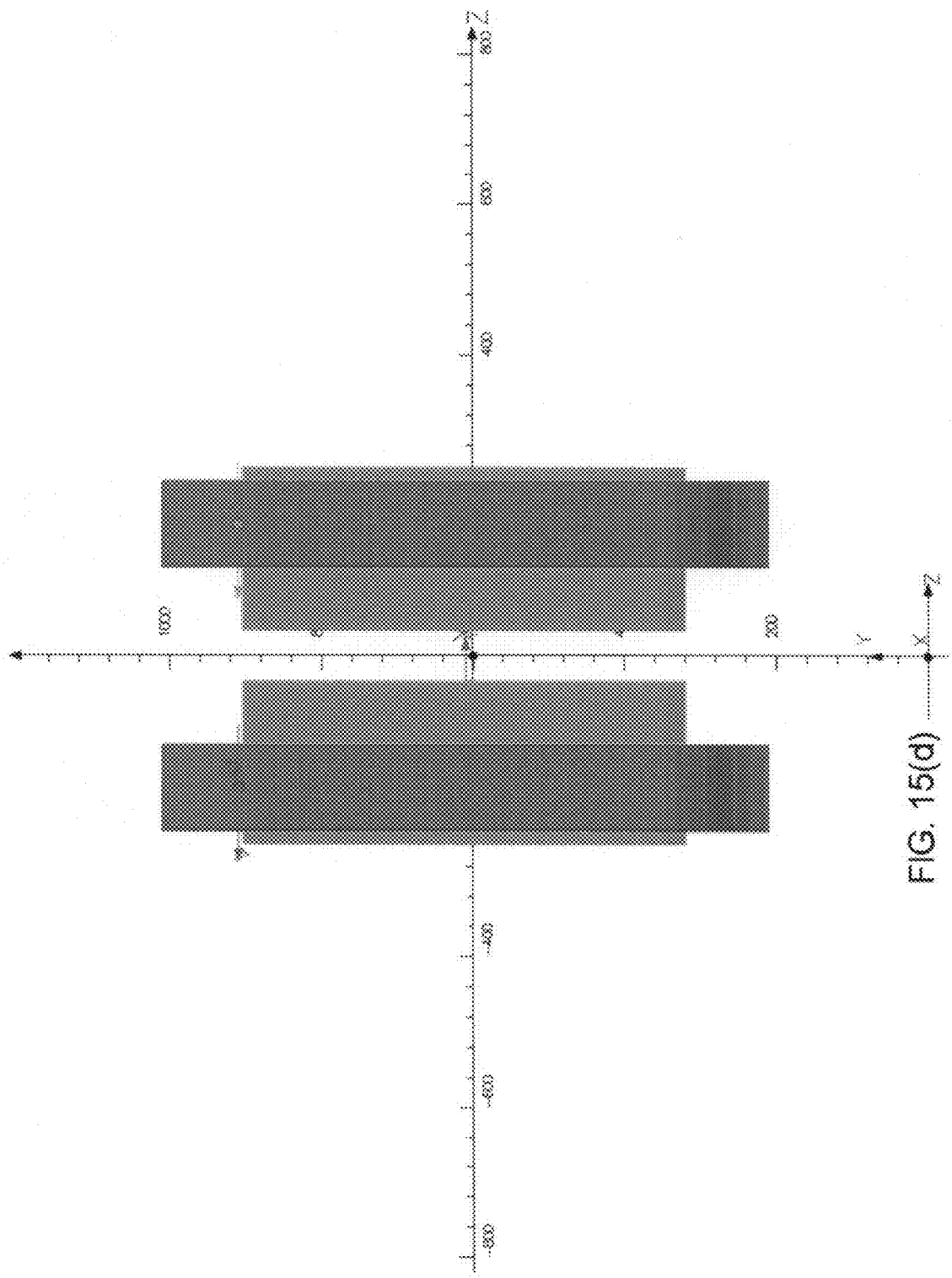

FIG. 14 illustrates the equations applied to define the incident edge curve of the CM, while taking into consideration for compensation magnetic field fringe field effects:

$$x_e(\alpha)=x_{e0}=\text{const}$$

$$x_i(\alpha)=R_m(\sin(\alpha)+\sin(\alpha_c))-|x_e|$$

$$y_i(\alpha)=|x_i|\tan(\alpha)$$

$$y_e(\alpha)=y_i(\alpha)+R_m(\cos(\alpha_c)-\cos(\alpha)) \quad (5)$$

In the example, the desired direction of the exit ion rays of the ion beam is parallel with the X-axis. Measuring ray angles with respect to X axis, the angular ray deflection due solely to magnetic field fringe effects is noted $-\alpha_c$. In the non magnetic field fringe model, the exit ion ray is allowed to make angle +α$_c$ with respect to desired direction, ray deflection due to magnetic field fringe effects being thus compensated.

Figure 16:
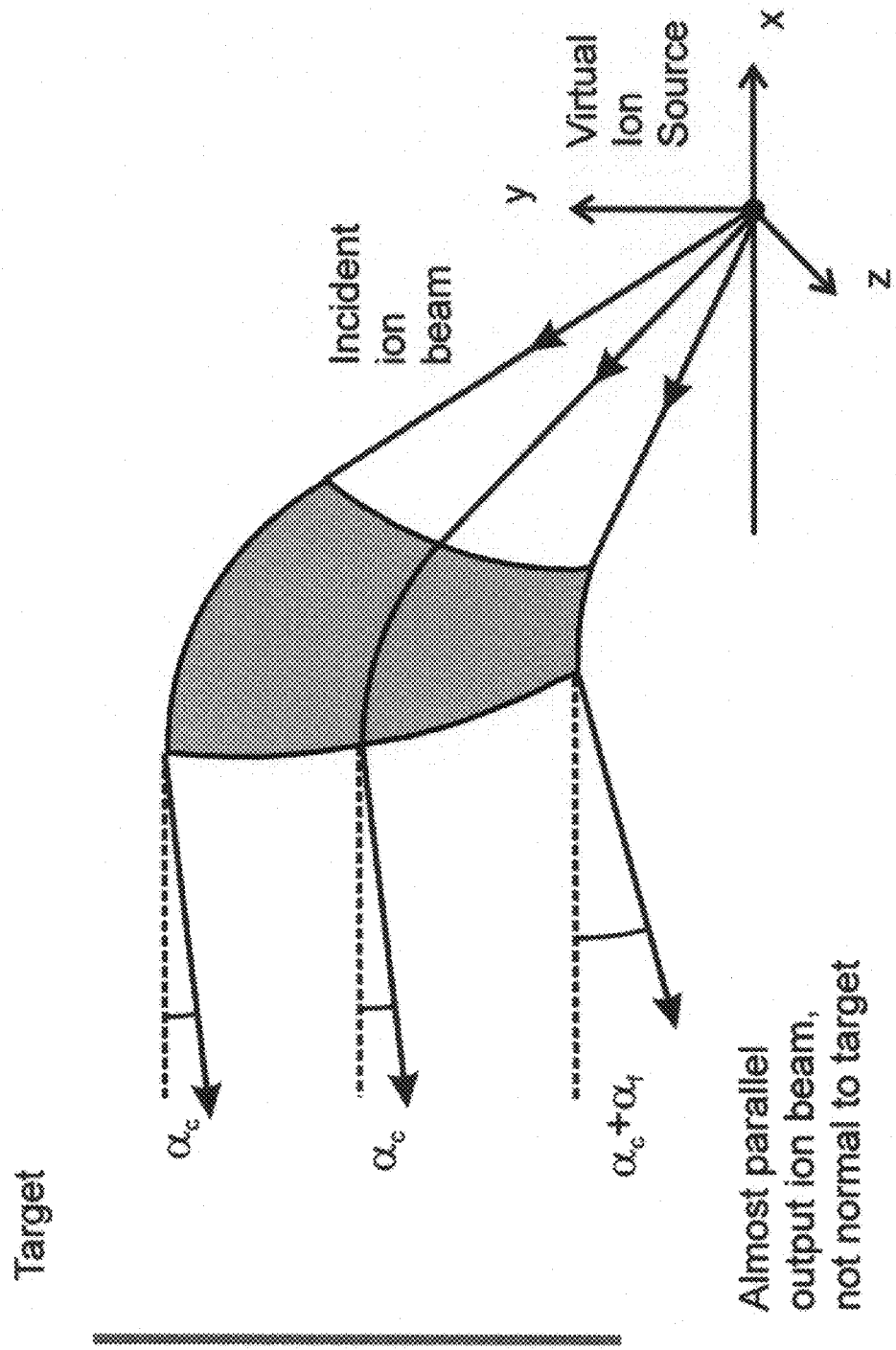
FIG. 16 illustrates an exemplary embodiment in which there has been no basic or fine tuning compensation.
Figure 17:
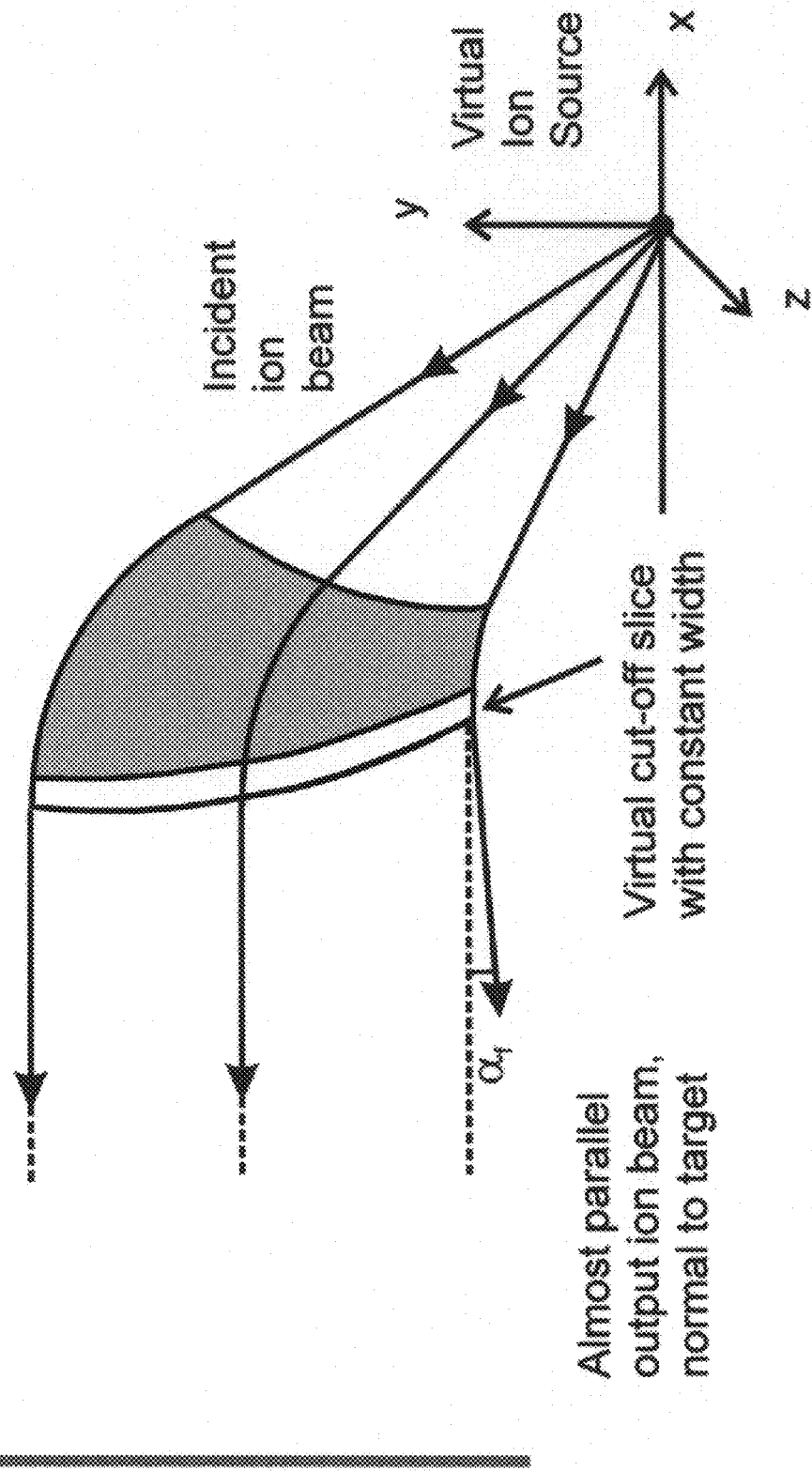
FIG. 17 illustrates the effect of basic compensation for magnetic field fringe effects according to an exemplary, non-limiting embodiment.
Figure 18:
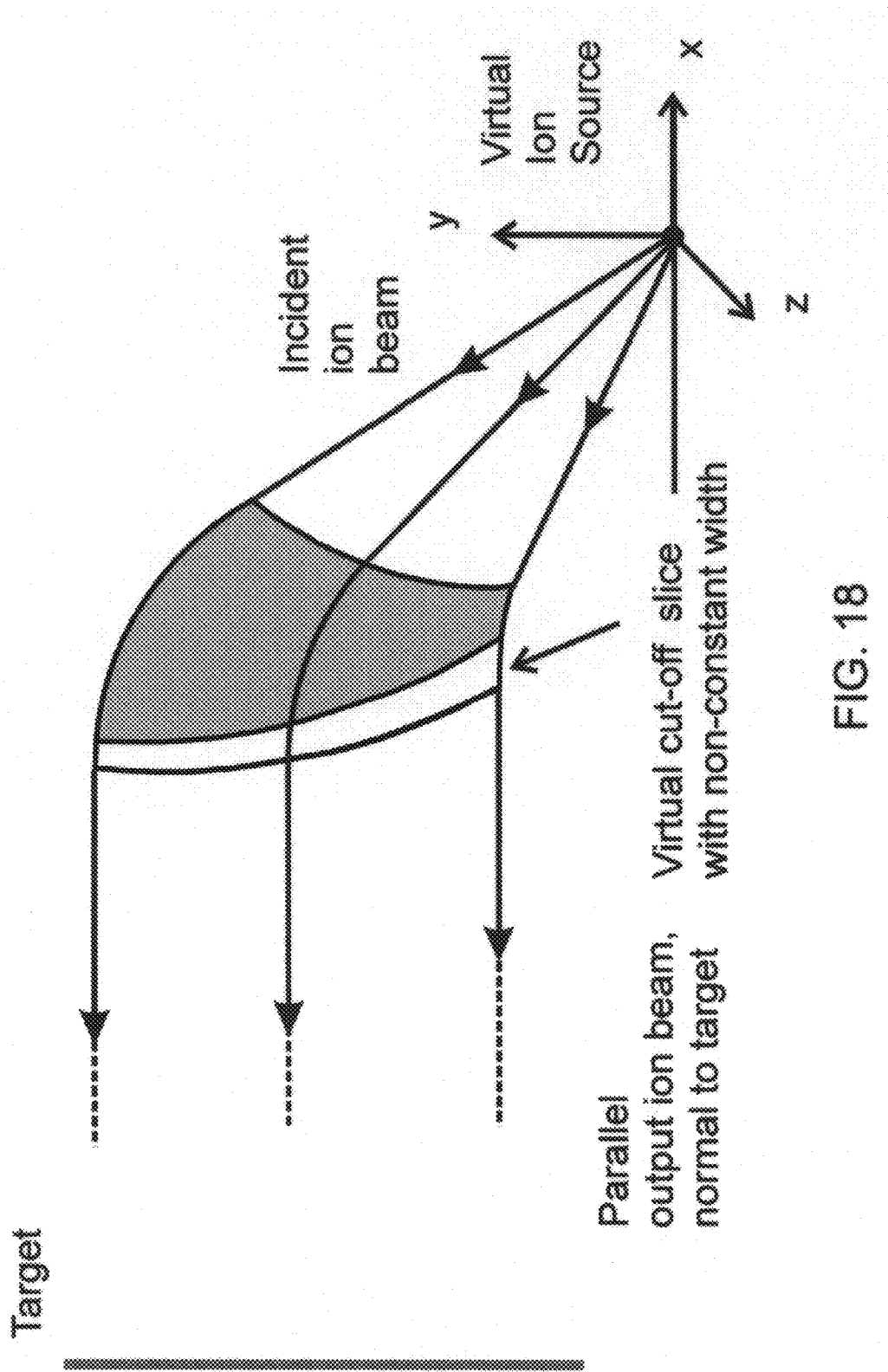
FIG. 18 illustrates simultaneous basic and fine tuning compensation for magnetic field fringe effects according to an exemplary, non-limiting embodiment.

For CEACM as well as CIACM as discussed above, once the basic structure has been considered, basic tuning and fine tuning must be performed to account for magnetic field fringe effects. FIGS. 16-18 illustrate this implementation for CIACM and CEACM. In this illustration, the example of CIACM is used, but may be similarly applied to CEACM.

FIGS. 15(*a*)-(*d*) provide illustrations of shapes of the CEACM for ion beam trajectory with R$_m$=650 mm, according to the exemplary, non-limiting embodiments of the present invention. FIG. 15(*a*) and FIG. 15 (*b*) show projection of the CEACM in plane XY and YZ, respectively. FIG. 15(*c*) and FIG. 15 (*d*) show perspective views of the CEACM from front and from back, respectively. The electric coils are included in the drawing.

FIG. 16 illustrates CIACM, in which there has been no compensation for the magnetic field fringe effects. The magnetic field will extend beyond the physical edge of the CM and gradually decrease to substantially zero over distance from the CM. While the exit beam is collimated, there may be an unacceptable level of deflection (e.g., about 7 degrees) with respect to the X-axis due to magnetic field fringe effects. This CM shape is used as an initial configuration for beam deflection compensation, as discussed below.

FIG. 17 illustrates the effect of basic compensation for magnetic field fringe effects according to an exemplary, non-limiting embodiment. More specifically, a virtual "slice" (i.e., computer model) of the CM is cut away at the exit edge. Because beam deflection is cumulative, the virtual slice may be removed from the incident edge, the exit edge, or both. As a result of this basic compensation, the slight differences in the direction of the exit beam are reduced to about 0.5 degrees or less. However, further tuning is possible as explained below.

FIG. 18 illustrates fine tuning compensation for magnetic field fringe effects according to an exemplary, non-limiting embodiment. More specifically, the virtual slice that is cut from the CM has a variable thickness, depending on its position, so as to further compensate for the magnetic field fringe effect. For example but not by way of limitation, the fine-tuned CM compensates for the magnetic field fringe effect at various points along the incident or exit edge.

In view of the foregoing discussion as to the qualitative aspects of consideration of magnetic field fringe effects, an explanation of quantitative aspects of determination of the "virtual slice" is discussed below. In order to obtain this information, the CM is modeled using the OPERA3D/Tosca/Scala program, as discussed above. This program computes magnetic fields and trajectories for charged particles. Instead of building a physical model CM and measuring its beam deflection properties, the program permits prediction of the trajectories for rays in a beam using numerical methods. The ion trajectories depart from a desired direction (which is normal to target, X direction) with a given amount for each ray in the beam. These values are then used as correction values (feedback values) for defining the new shape of the CM, for example, by interpolation. This approach is possible due to available computation power, which has increased compared to the situation when other previous art results have been obtained. "Computation power" includes computer hardware (computation speed) and software (advanced programs available for electromagnetic computations, etc.).

While the foregoing methods of tuning are applied in the exemplary embodiment, the exemplary embodiments are not limited thereto, and any other tuning method may be applied as would be understood by one skilled in the art without departing from the scope of the invention. For example, but not by way of limitation, one skilled in the art may understand that parabolic and linear tuning are named as the tuning to be applied according to the exemplary embodiments. However, other methods of interpolation may also be used.

The foregoing basic and fine tuning compensates for the field fringe effect at multiple positions. Moreover, the number of multiple positions may be decreased for the sake of speed, or further increased for the sake of further preciseness.

As discussed above, a first type of exemplary solution takes into account the XY plane, and includes CIACM and CEACM. However, CSACM includes the second and third types of exemplary solution take into account the XZ plane as well as the Z-direction, and is discussed in greater detail below.

Incident angle, for CIACM, and exit angle, for CEACM, are constant for any ray in the ion beam. However, if the incident edge has a chosen value, then the angle at the exit cannot be arbitrarily specified, and vice versa. According to CSACM, the incidence angle may have the same absolute value as the exit angle, although this value changes with ray angular position. CSACM is discussed in greater detail below.

CSACM addresses, for planes z>0 and z<0, respectively, the principle of the Z-direction forces. A ray in the beam that starts at the VIS point is defined by its angular position α. At the point of entry into the CM, as well as at the point of exit from the CM, there are forces in the Z-direction, i.e., in the magnetic field fringe region. For example, when considering the magnetic field as directed along the −Z direction and positive ions, at the CM entry point, the F$_z$ force is a converging force, while at the CM exit point, the F$_z$ force is a diverging force.

Figure 19:
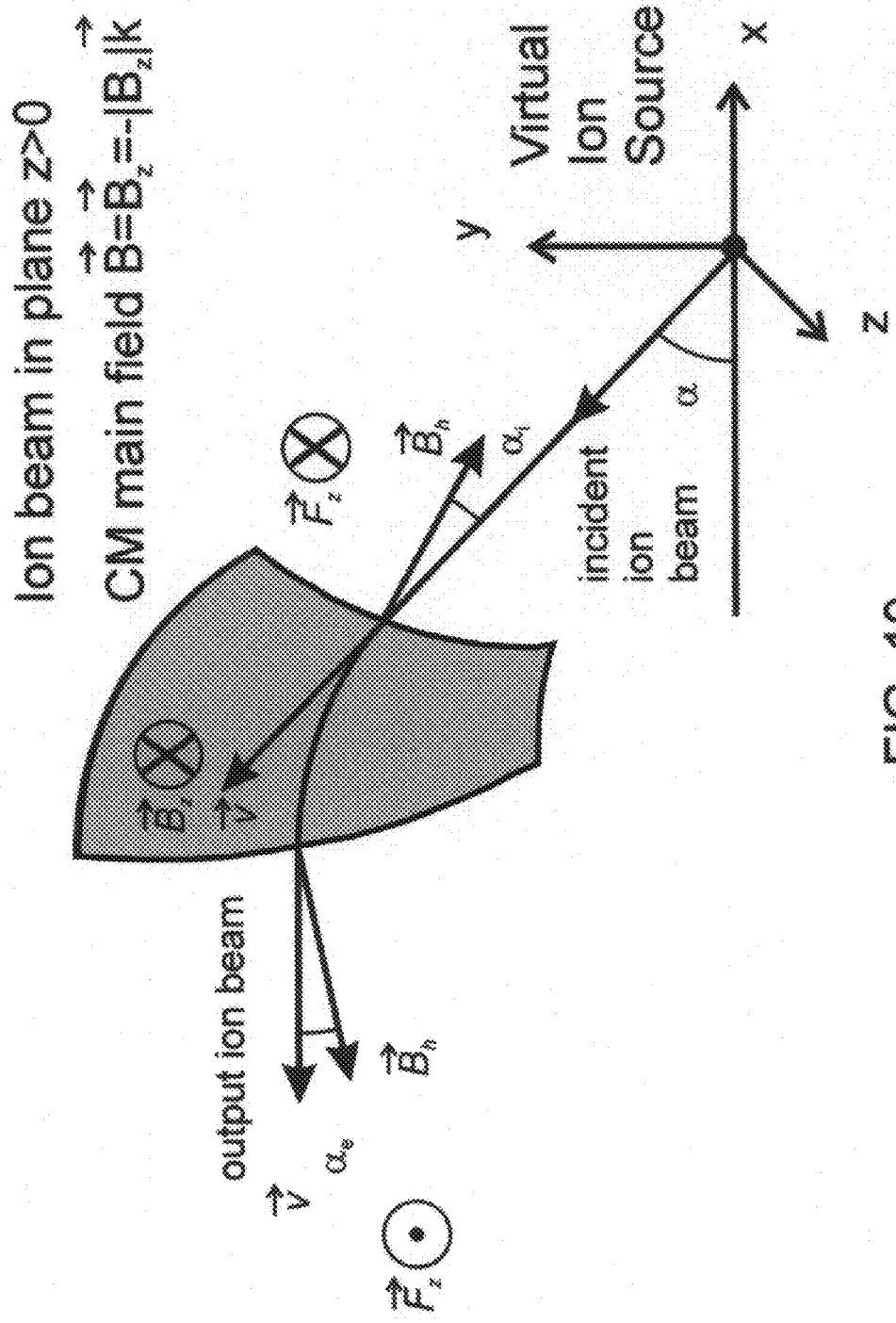
FIG. 19 illustrates a model, such that the current in the coils results in a main magnetic field $B_z$ that has an orientation along the −Z direction, according to an exemplary, non-limiting embodiment.

As shown in FIG. 19, the model was established such that the current in the coils results in a main magnetic field B$_z$ that has an orientation along the −Z direction. B$_h$ field is the component of the magnetic field in plane XY ("horizontal plane") B$_h$=$\sqrt{B_x^2+B_y^2}$, where B$_x$ and B$_y$ are magnetic field components along X and Y axis. For most of the trajectory of the ions, B$_h$=0, and thus there is no force F$_z$ except at the entrance and exit of the CM in the magnetic field fringe region. At the entrance, the force F$_z$ converges the beam, and at the exit, the force F$_z$ diverges the beam. The velocity of the ion remains substantially constant. Accordingly, compensation of the opposite deflection effects occurs when the incidence and exit angles have substantially equal absolute values.

Figure 20A:
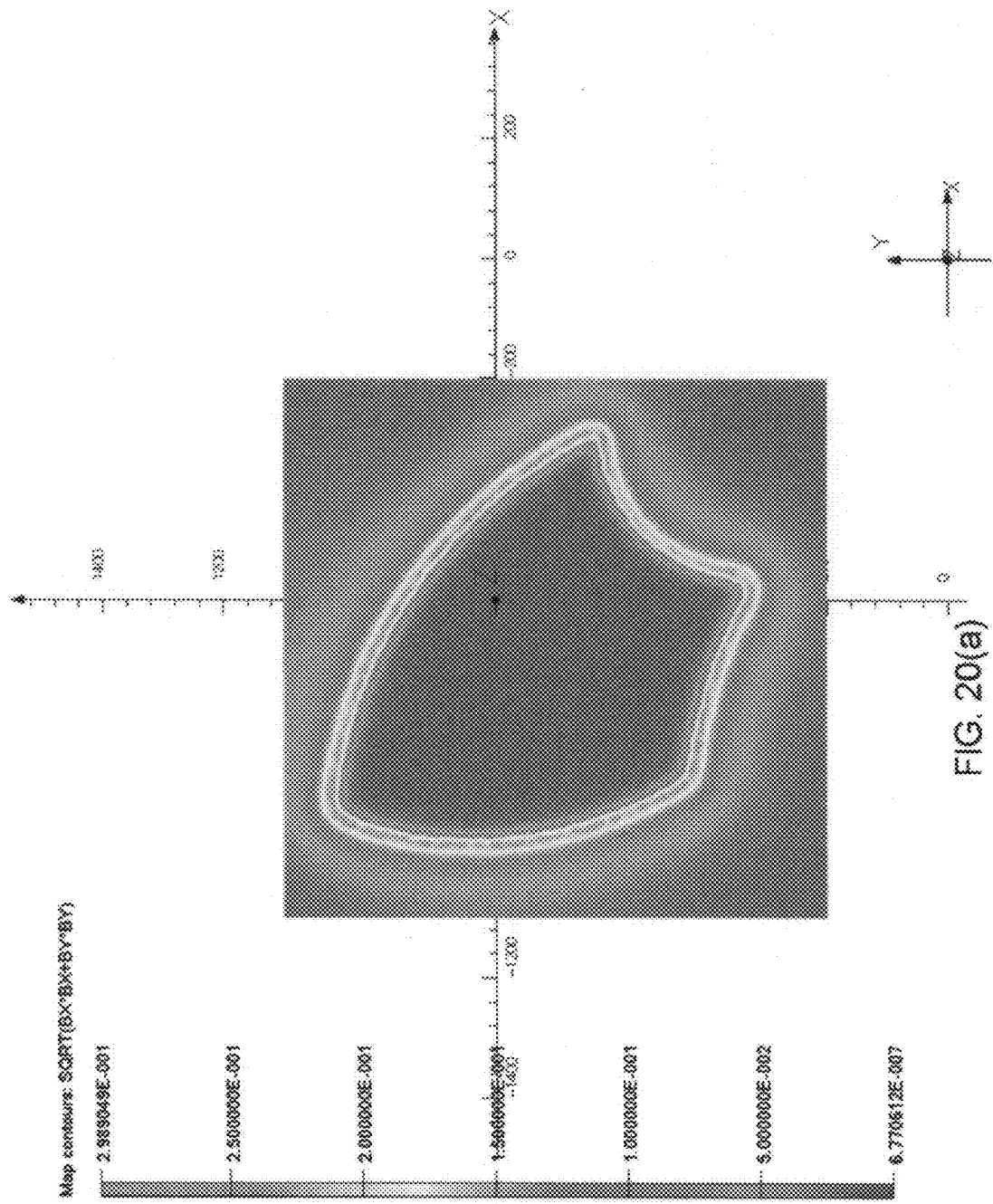
FIGS. 20(a)-(b) illustrate $B_h$ field components in XY planes at z=25 mm and z=0, respectively, according to an exemplary, non-limiting embodiment.
Figure 20B:
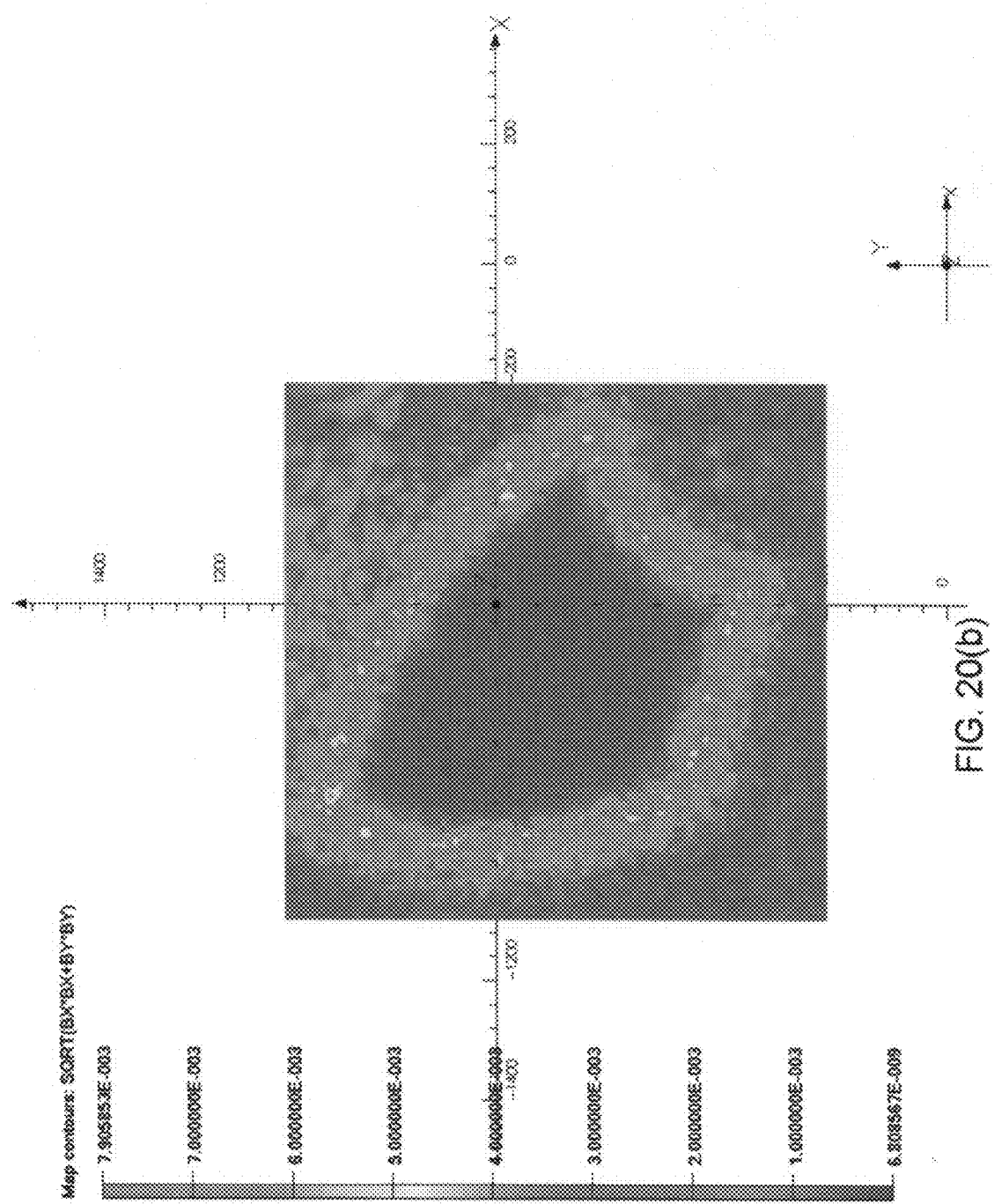

As an illustration of the foregoing explanation of B$_h$ field components only appearing at the CM incidence and exit edges, FIGS. 20(*a*)-(*b*) are provided. FIG. 20(*a*) illustrates that in the plane at z=25 mm, the magnetic field component B$_h$ has a non-negligible value. However, as shown in FIG. 20(*b*), in the plane at z=0 mm, which is the median or symmetry plane, there is no deflection along the Z axis for an ion beam originating in the median plane.

Further, the horizontal component of the magnetic field has substantially similar values at the incident and exit points. By making the shape of the incident and exit parts of the CM such that the incidence and exit angles have equal absolute values, these opposite deflection effects can be compensated for.

According to CSACM, the second constraint can take the form of (a) the sum of the incidence angle and the exit angle is substantially zero (allowing for errors, for example if the absolute value of the difference between the angles is less than about 5 degrees), (b) the algebraic sum of the incidence angle and the exit angle is constant, or (c) the algebraic sum of the incidence angle and the exit angle is not constant. Each of the options (a) to (c) is described in more detail below. For CSACM, the procedure of deriving the CM shape starts from solution of the differential equation that corresponds to "sum angle=0" or similar condition, "sum angle=constant" or "sum angle=not constant". This solution addresses the issue of beam deflection in XZ plane. When also considering the CM modification for compensation of beam deflection in XY plane, CSACM results in complete collimation in the XY plane as well as the XZ plane.

The selection of the shape of the CSACM is as follows. The exit edge of the CM is determined by the same equations as discussed above with respect to CIACM, when the incident edge of the CM is known. Also, a differential equation is used to determine the incident CM edge, which is yet unknown. More specifically, the differential equation is related to the sum of incident and exit angles, and thus includes two unknown functions: (1) a function that describes the incident edge $y_i(x_i)$, and (2) a function that describes the exit edge of the CM, $y_e(x_e)$. Separation of the differential equation in a standard form suitable for numerical integration is difficult. Therefore, $y_e(x_e)$ is expressed as function of $y_i(x_i)$ using the above-described equations with respect to the exit edge for CIACM (including both cases of with and without consideration of the magnetic field fringe effects), and substituting in the differential equation. As a result, the differential equation has a single unknown function $y_i(x_i)$ and can be solved numerically.

The differential equation with only one unknown function is shown below. $R_m$ represents the nominal radius of curvature inside the collimator magnet. The function in the differential equation is $y_i(x_i)$, but index i has been dropped out for convenience, writing simply y(x) (and solving from $\alpha_i(\alpha)+\alpha_e(\alpha)=0$):

$$\frac{dy}{dx} = f(x, y) \quad (6)$$

$$f(x, y) = \frac{-B \pm \sqrt{B^2 - 4AC}}{2A}$$

$$A = -ah - c$$

$$B = a - d - h(b + c)$$

$$C = -hd + b$$

$$a(x, y) = (x^2 + y^2)^{3/2} - R_m xy$$

$$b(y) = R_m y^2$$

$$c(x) = -R_m x^2$$

$$d(x, y) = (x^2 + y^2)^{3/2} + R_m xy$$

$$h(x, y) = \frac{y}{-x}$$

Accordingly, the coupling (simultaneous solving) of the differential equation for the XY and XZ plane can be used to obtain the solution for the incident and exit CM edges in the CSACM.

Option (a) represents the second type of solution (collimation in the XY plane and XZ plane). Options (b) and (c) both represent the third type of solution (collimation in the XY and XZ planes while taking into account space charge effects). The difference between options (b) and (c) consists in how precisely space charge effects are taken into account. The space charge effect has a magnitude that depends on the actual travel path of the ion rays. It is noted that the traveling path of each of the ion rays in the beam through the CM is different. Accordingly, in order to precisely compensate for the "space charge effect", the foregoing must be taken into consideration. Option (b) compensates for space charge effects that are similar for all rays in a beam. However, due to different angles of scanning, different beam properties are implicated. To compensate for this effect, option (c) can be applied to address these different beam properties and space charge effects.

According to one exemplary embodiment, option (b) is used for designing the CM for an ion implantation system. As a result of taking into consideration space charge effects, the ion implantation system can achieve substantially better collimation properties of the ion beam compared to related art ion implantation systems, especially in the higher current range where space charge effects become significant.

Figure 21A:
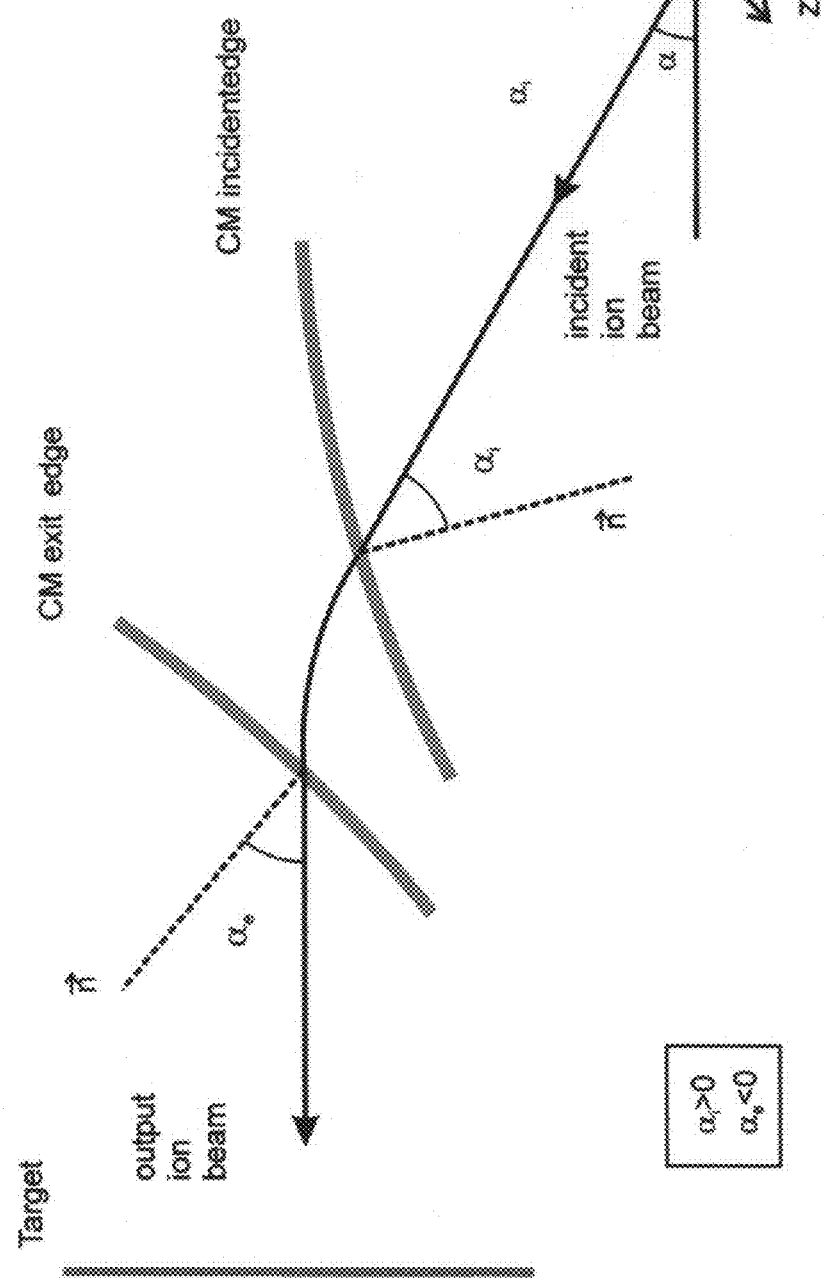
FIGS. 21(a)-(b) illustrate a principle for designing the magnetic pole for a Constant Sum Angle Collimator Magnet (hereinafter called "CSACM") according to exemplary, non-limiting embodiments.
Figure 21B:
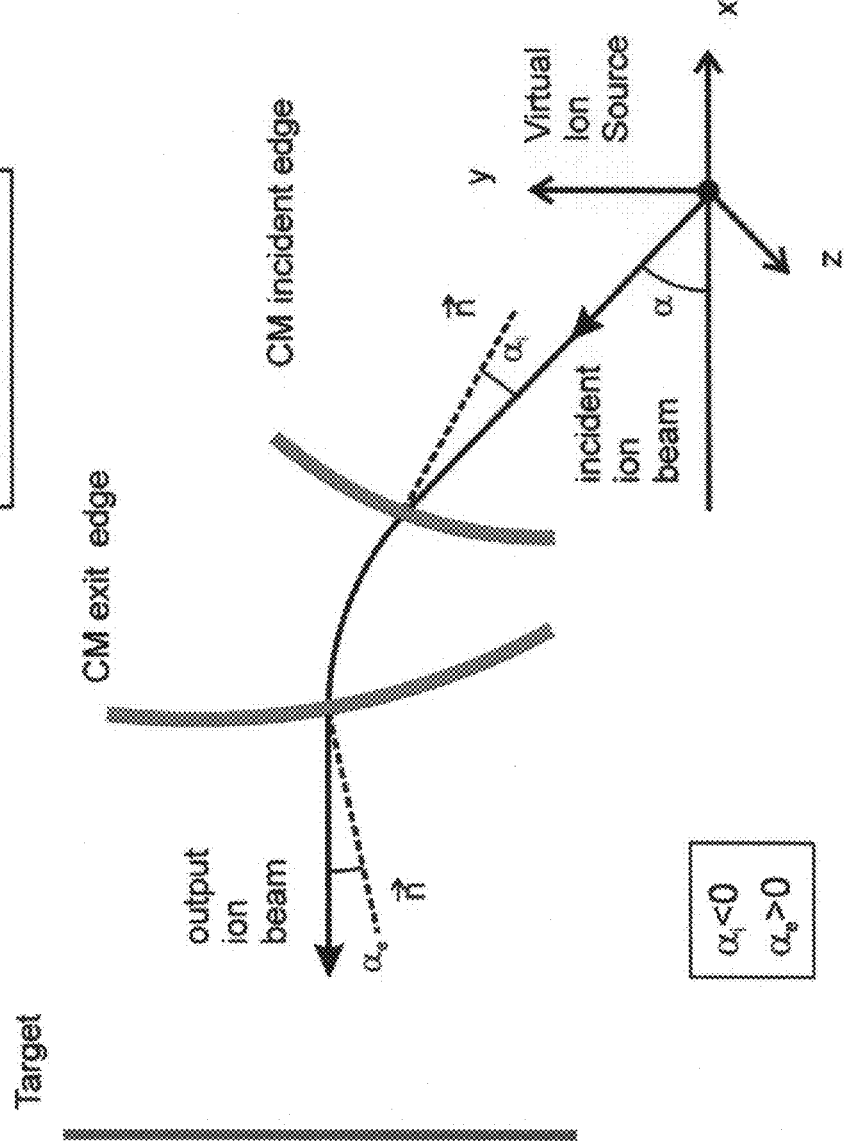

FIGS. 21 (a)-(b) illustrate CSACM according to option (a). The incident and exit edges are each chosen in such a way that the sum of incidence angle and exit angle, as defined above and discussed with respect to the CIACM and CEACM, is substantially equal to zero for all ion rays in the beam. The CSACM edges in FIG. 21 (a) are defined choosing the sign "+" (plus) from the "+/−" option in the differential equation at Equation (6), this case corresponding to $\alpha_i>0$ and $\alpha_e<0$. The CSACM edges in FIG. 21 (b) are defined choosing the sign "−" (minus) from the "+/−" option in the differential equation in Equation (6), this case corresponding to $\alpha_i<0$ and $\alpha_e>0$. It is noted that the iterative procedure for beam deflection compensation related to magnetic field fringe effects, as discussed above, may also be applied to CSACM.

Figure 22:
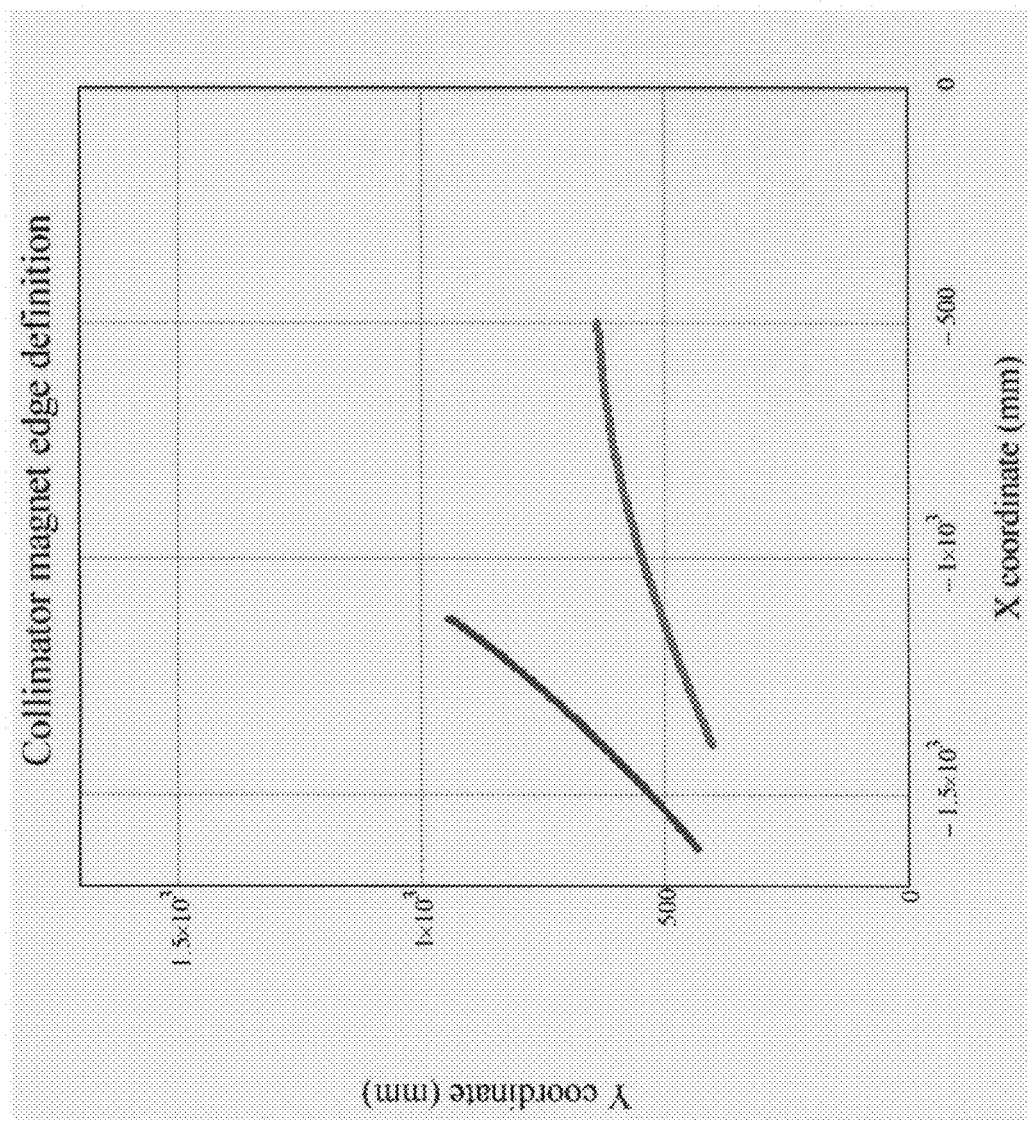
FIG. 22 illustrates another exemplary, non-limiting solution of the differential equation for CIACM, according to an exemplary, non-limiting embodiment.

The case presented in FIG. 21 (a) is illustrated as a non-limiting embodiment of the present invention in FIG. 22. This case corresponds to $\alpha_i>0$ and $\alpha_e<0$, the angles being equal in absolute value. The case presented in FIG. 21 (b), corresponding to $\alpha_i<0$ and $\alpha_e>0$ with angles equal in absolute value, is illustrated in embodiments of the CSACM in the following paragraphs.

Figure 23A:
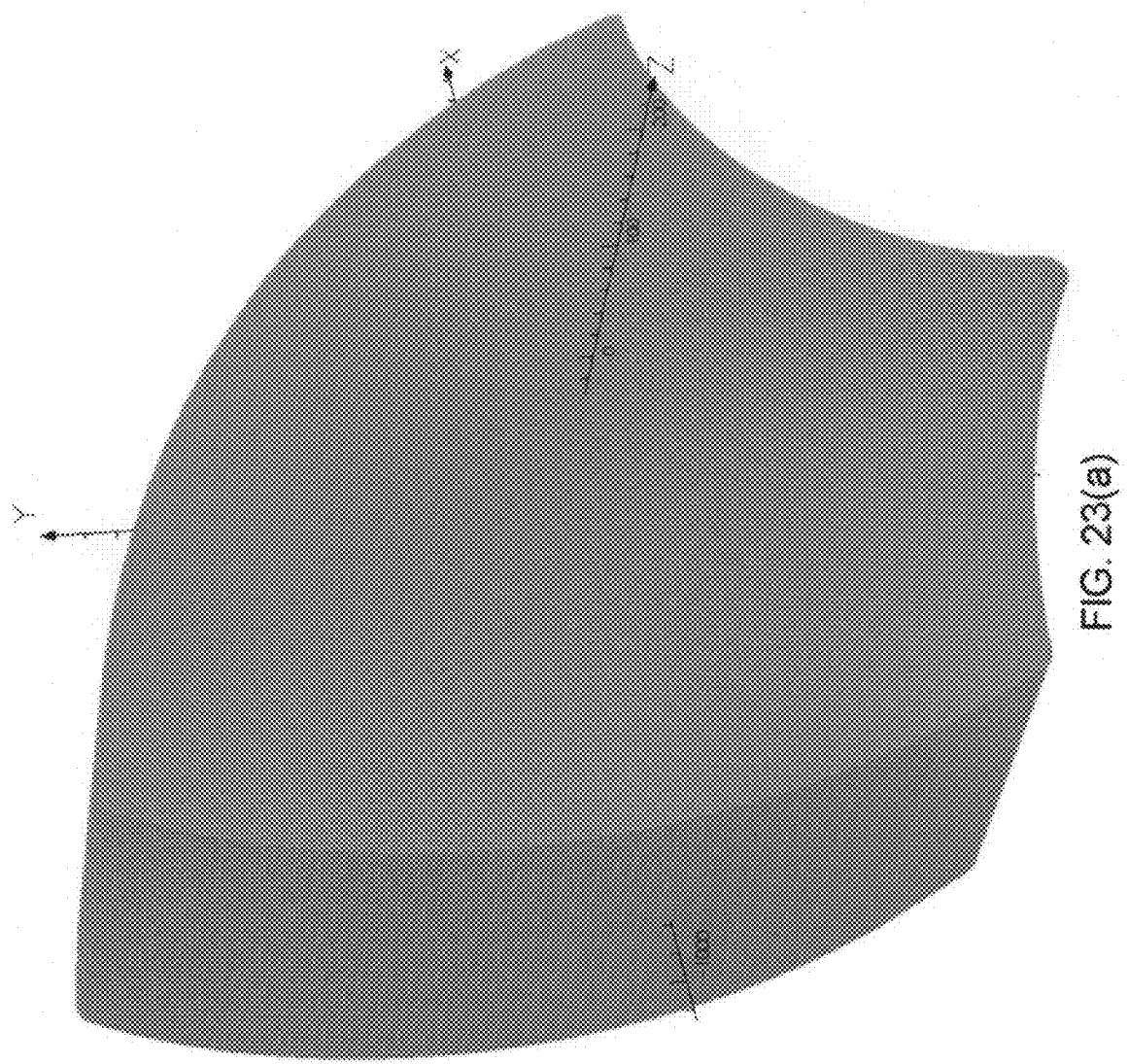
FIGS. 23(a)-(b) illustrate a perspective view of a CSACM according to an exemplary, non-limiting embodiment.
Figure 23B:
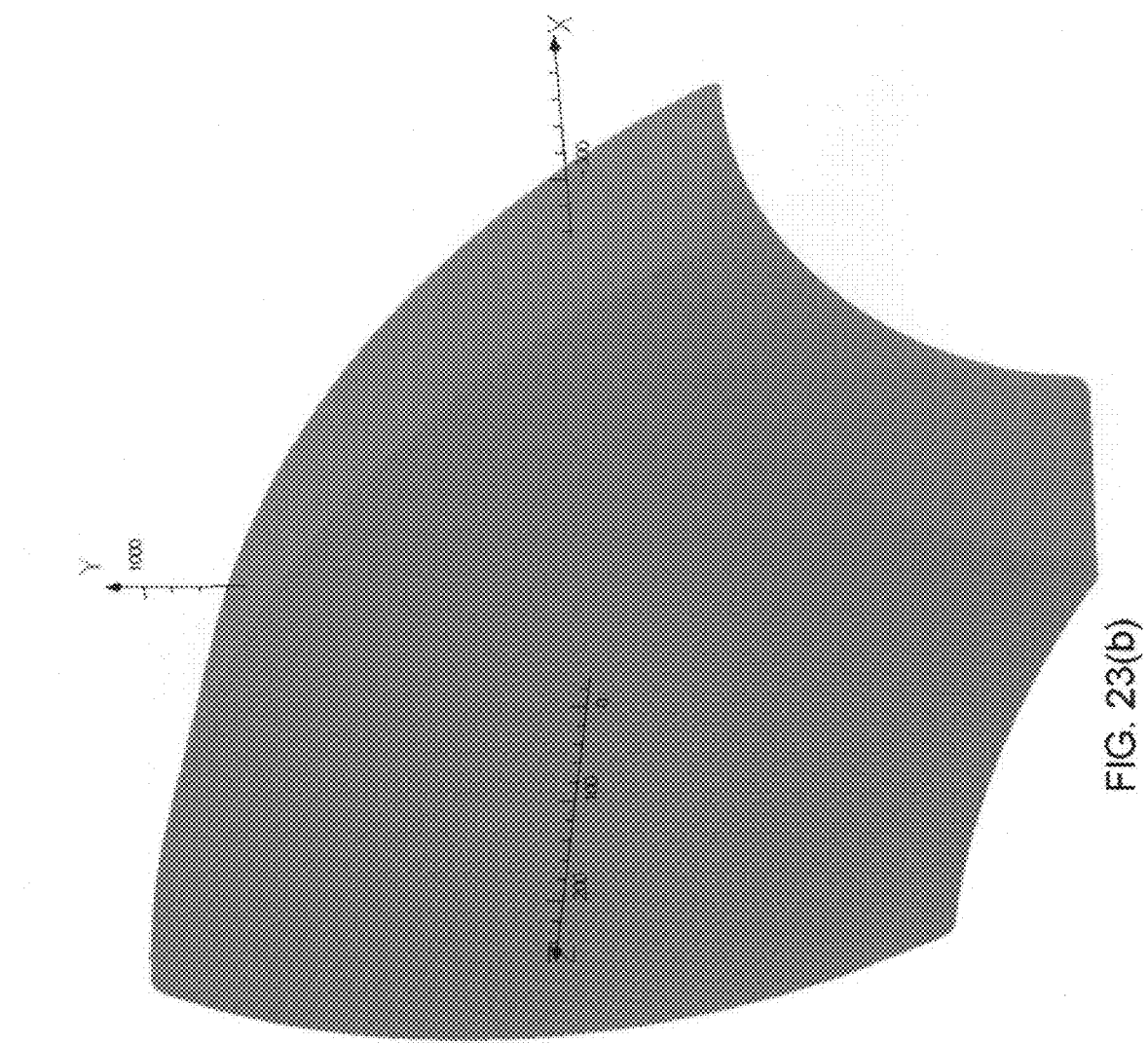

FIGS. 23(a) and (b) illustrate CSACM according to an exemplary, non-limiting embodiment. More specifically, a perspective view of the shape of the magnetic pole is shown. The magnetic pole edges may be defined by general functions, and the incident and exit CM faces may appear as a collection of surfaces, depending on the set of pair points used for discretization of the functions. Additional illustrations of CSACM are provided with respect to FIGS. 25(a)-(d).

Figure 24:
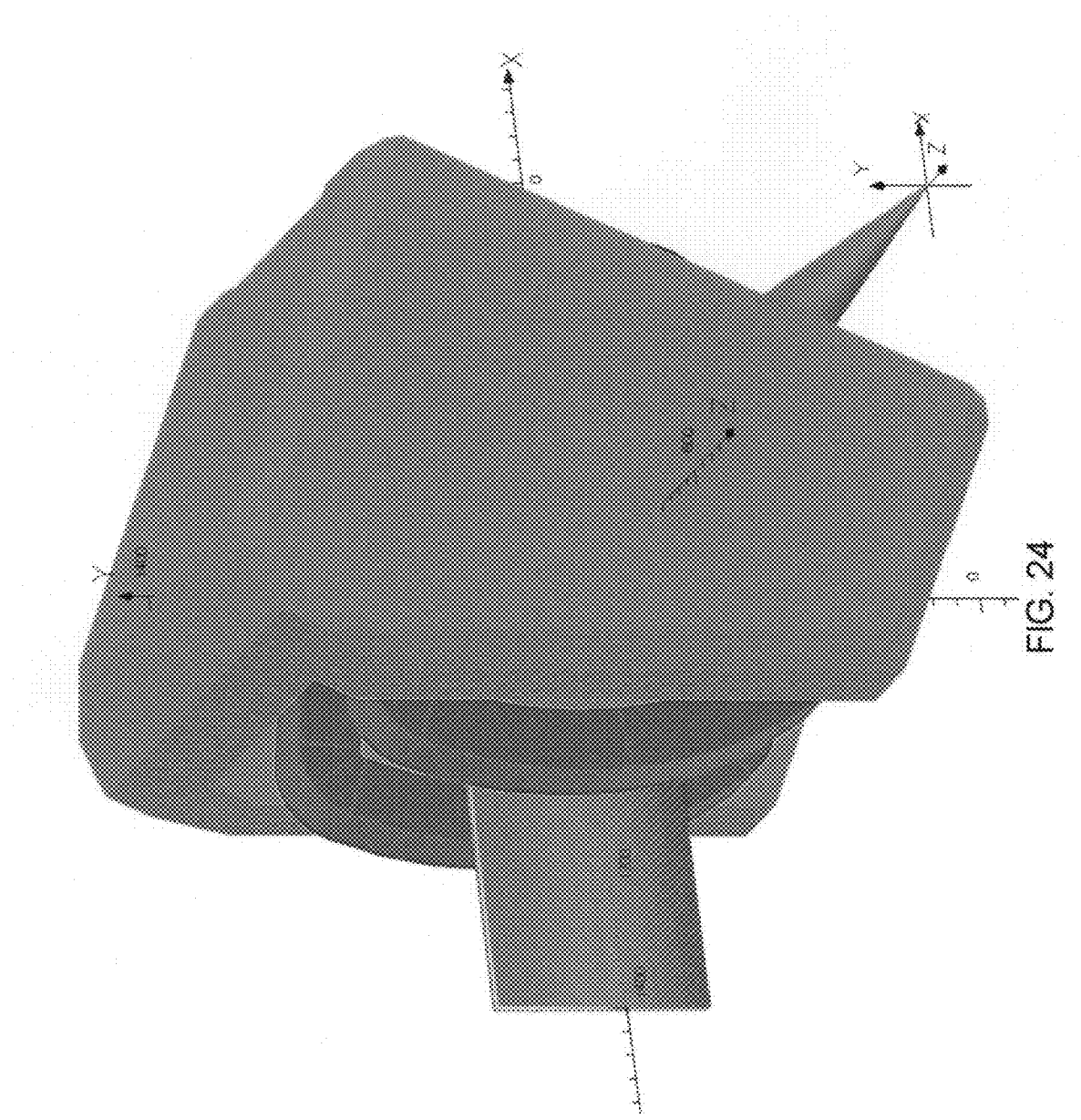
FIG. 24 illustrates an ion beam trajectory for CSACM according to an exemplary, non-limiting embodiment.

FIG. 24 illustrates the exemplary ion beam trajectories for a CSACM according to an exemplary, non-limiting embodiment. For example, the ion beams are projected from the virtual ion source at point x=0, y=0 in different XY planes (bottom right). The beam passes through the CM, and specifically, between the coils. The ion beam extends into the CSACM having an incident face and an exit face with a shape such that the sum of the incident and exit angles is substantially constant. As can be seen on the left side, the ion beam has parallel rays at the exit side of the CSACM.

Figure 25A:
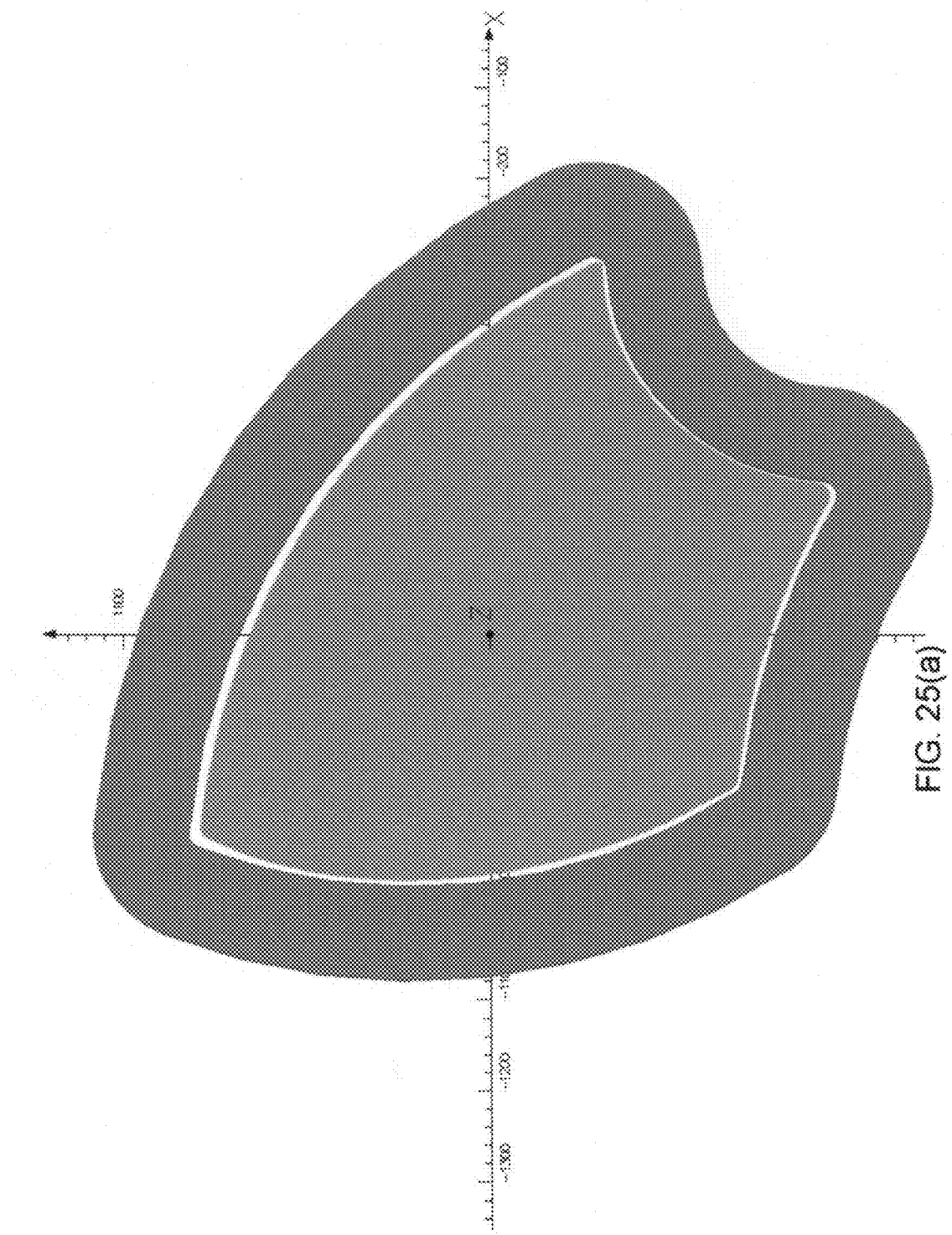
FIGS. 25(a)-(d) provide illustrations of shapes of the CSACM according to the exemplary, non-limiting embodiments.
Figure 25B:
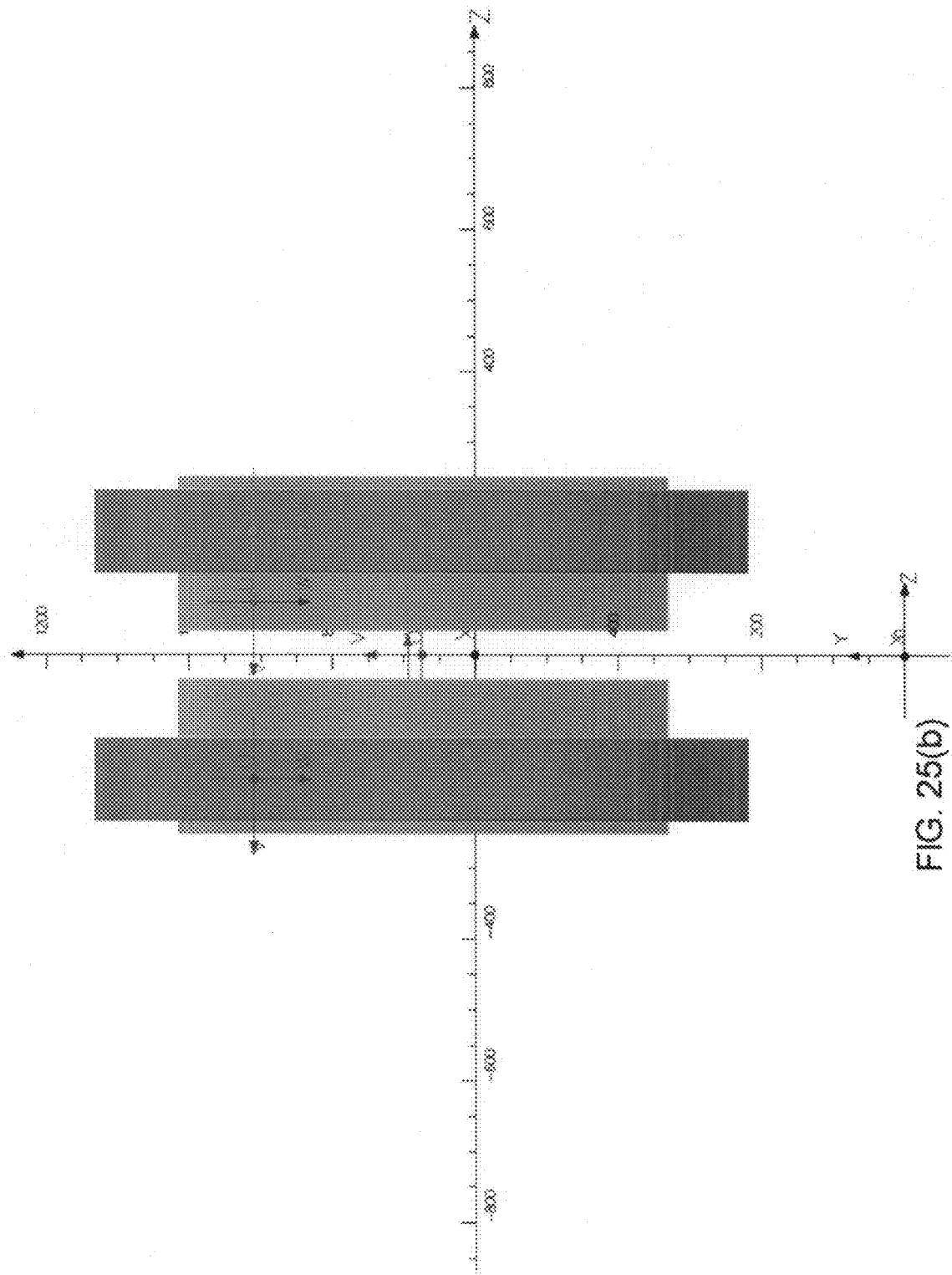
Figure 25C:
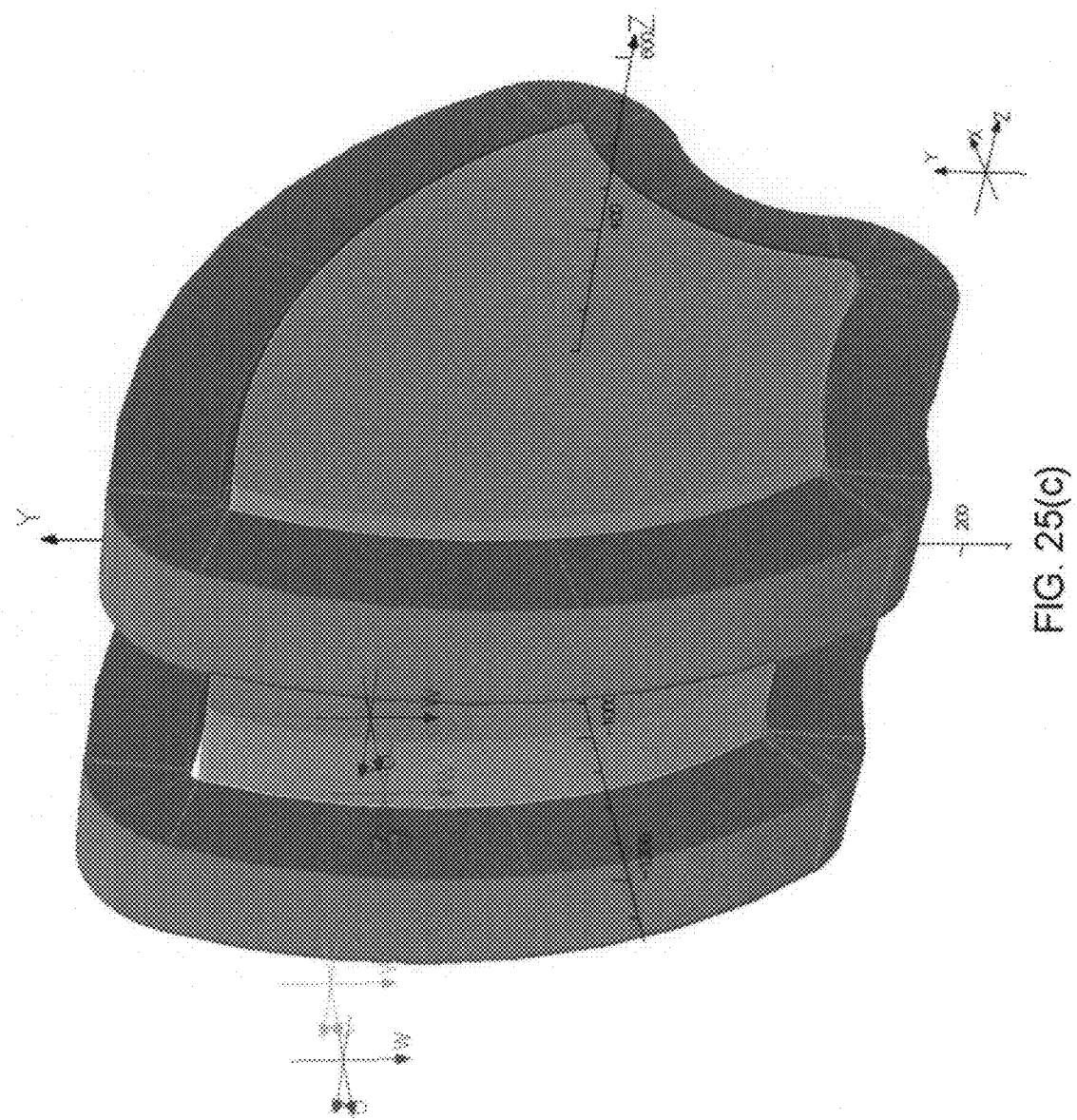
Figure 25D:
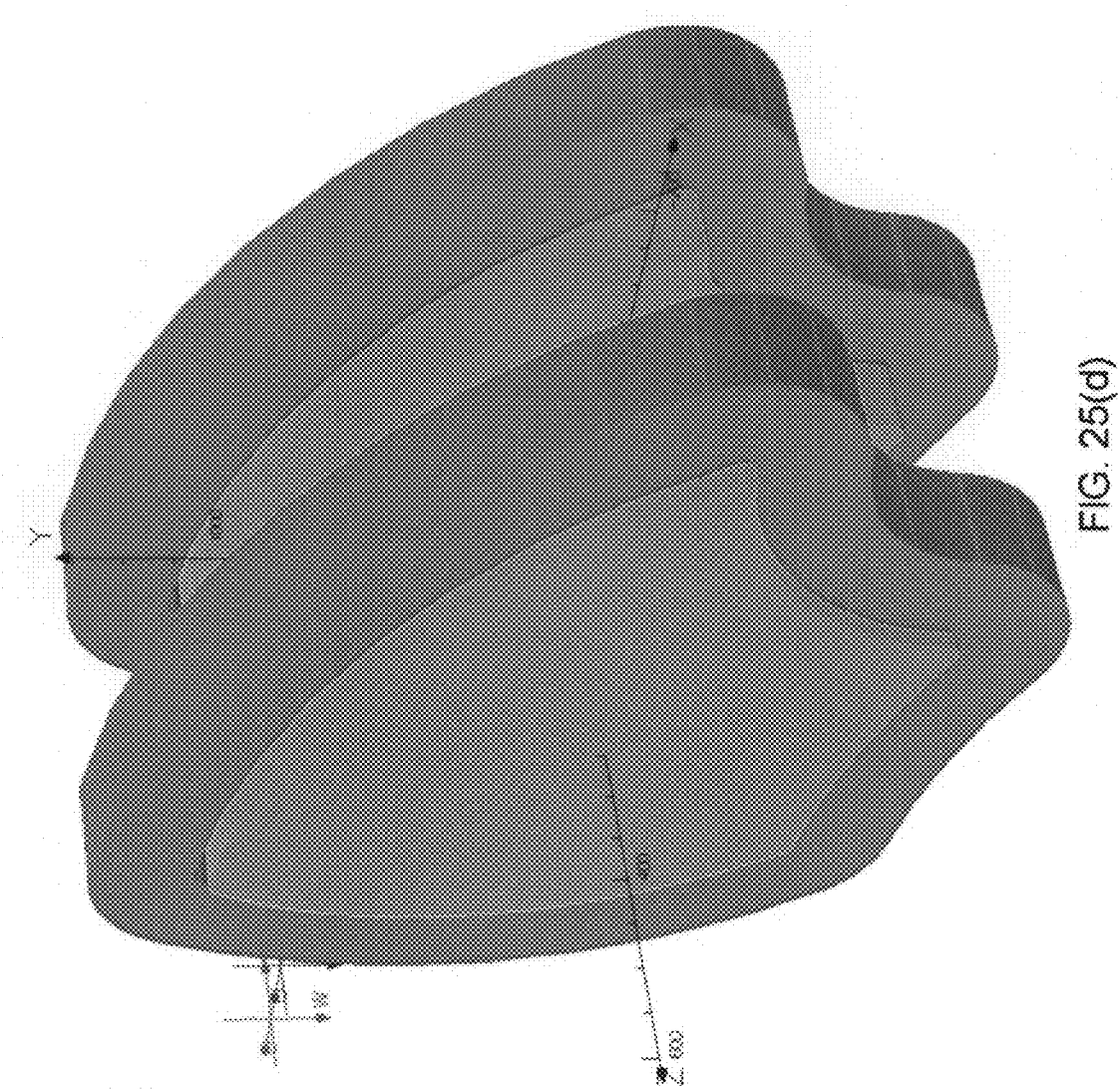

FIGS. 25(a)-(d) provide illustrations of shapes of the CSACM for ion beam trajectory with $R_m$=800 mm, according to the exemplary, non-limiting embodiments of the present invention. FIG. 25(a) and FIG. 25(b) show projections of the CSACM in plane XY and YZ, respectively. FIG. 25(c) and FIG. 25(d) show perspective views of the CSACM from front and from back, respectively. The electric coils are included in the drawing.

In addition, for each of the foregoing exemplary embodiments, the CM may be configured in the form of a double circular collimator magnet (DCCM), as disclosed below.

Figure 26:
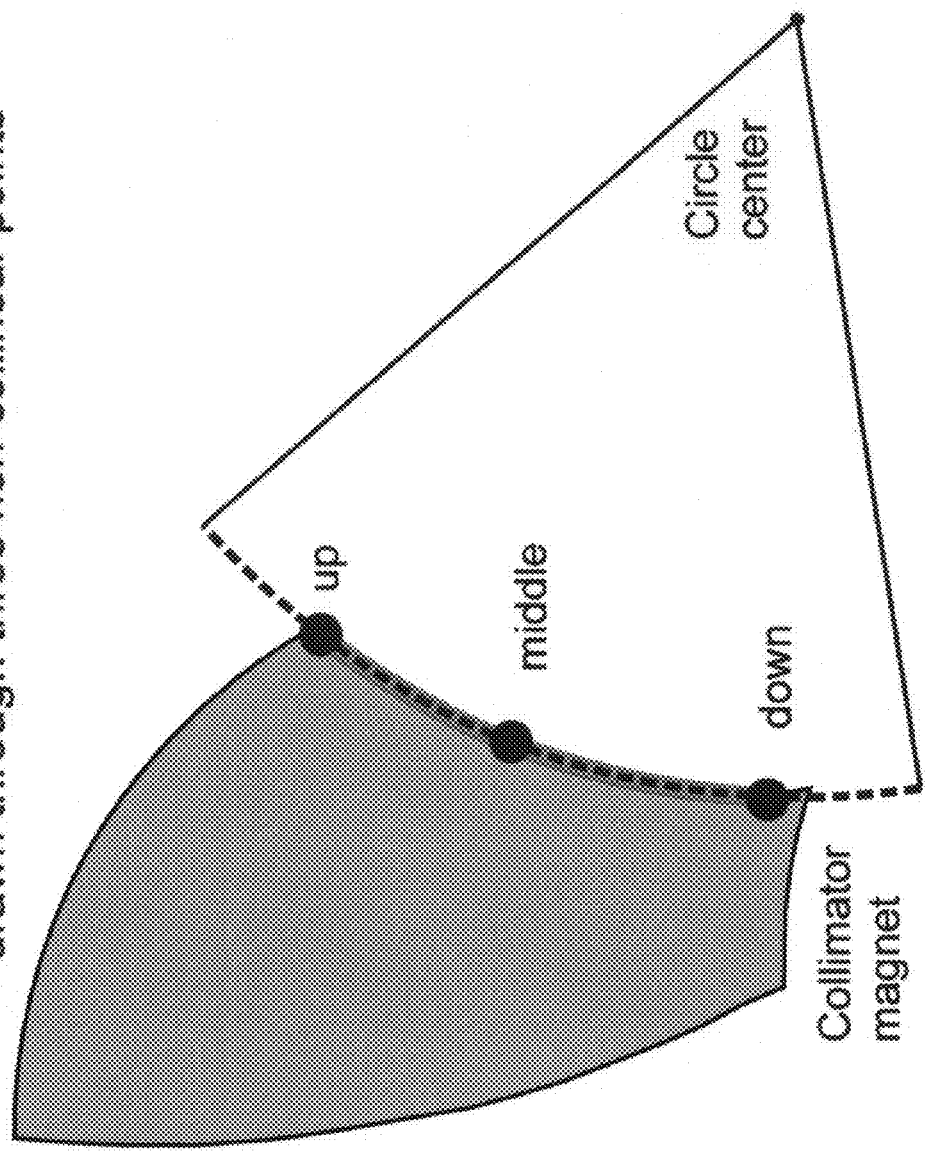
FIG. 26 illustrates approximation of the double circular collimator magnet (hereinafter called "DCCM") using three non-co-linear points, according to an exemplary, non-limiting embodiment.

DCCM involves the approximation of curves that define the CM edges by using arcs of a circle. As shown in FIG. 26, three non-co-linear points (up, middle, down) are used in the approximation, although the exemplary embodiments are not limited thereto. DCCMs may be chosen for ease of fabrication of the curvatures.

While DCCM is disclosed, it is noted that other methods of approximation may be used as would be understood by one skilled in the art. For example, each CM edge might be approximated with two arcs of circle (instead of only one), one arc of circle taken for the "upper" CM half and another one for the "lower" CM half. Alternatively, each CM edge might be approximated by multiple arcs of circle, or approximation, a spline function approximation for the CM edges might be used. In yet another exemplary, non-limiting approximation, a non-linear mathematical function depending on one or more parameters might be used to describe the CM edges.

CIA-DCCM, CEA-DCCM and CSA-DCCM are implemented in a simplified form, and although the second constraint may not be "perfectly" met, it is substantially met, to the extent that the above-discussed effects can be obtained with a DCCM configuration. Accordingly, the above exemplary embodiments may be implemented as DCCM without departing from the scope of the invention.

Figure 27:
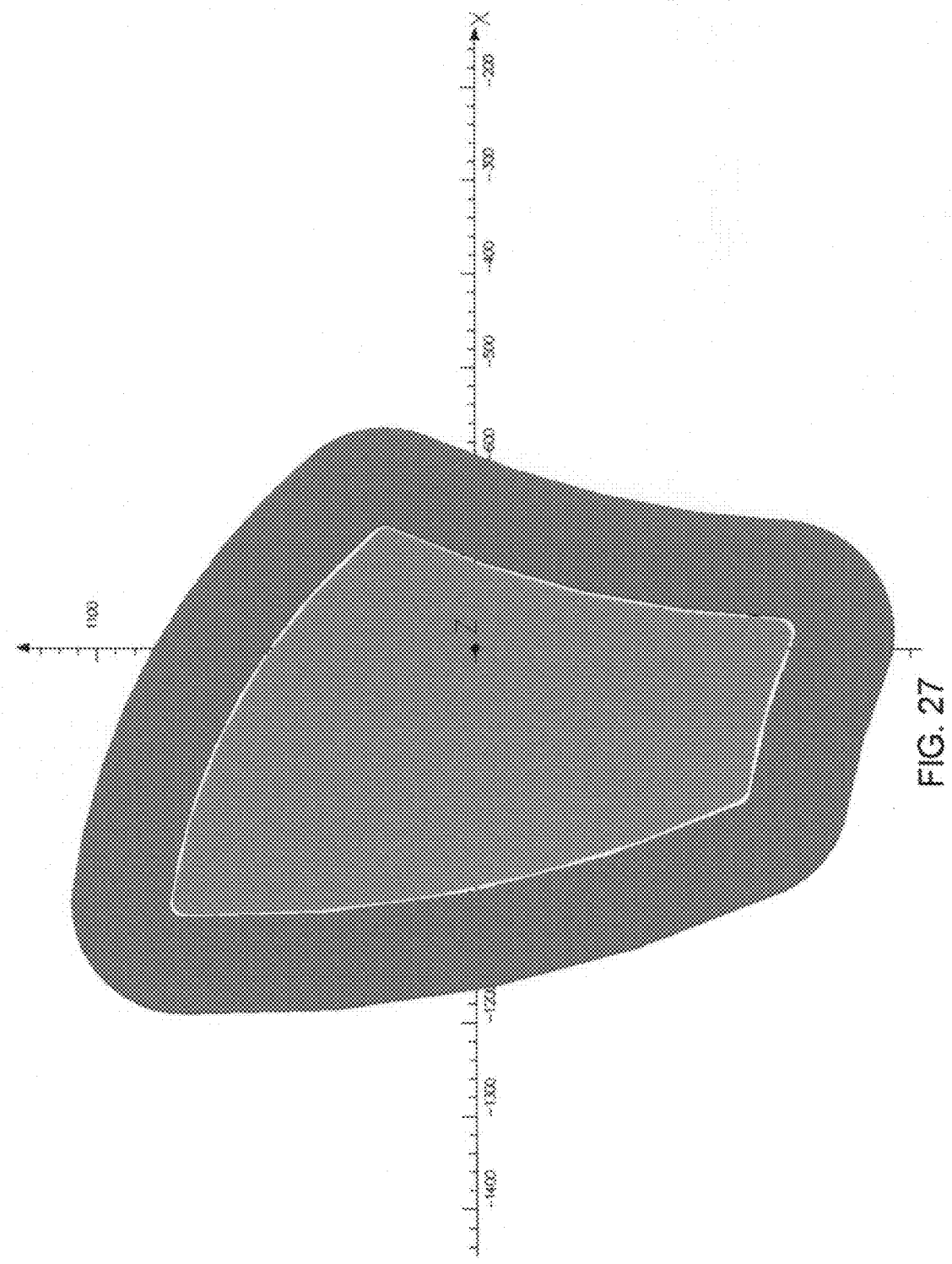
FIG. 27 provides an illustration of a shape of the CIA-DCCM according to the exemplary, non-limiting embodiments.

FIG. 27 provides an illustration of a shape of the CIA-DCCM as a projection in the plane XY, according to the exemplary, non-limiting embodiments of the present invention. The electrical coils are included in the drawing.

Figure 28:
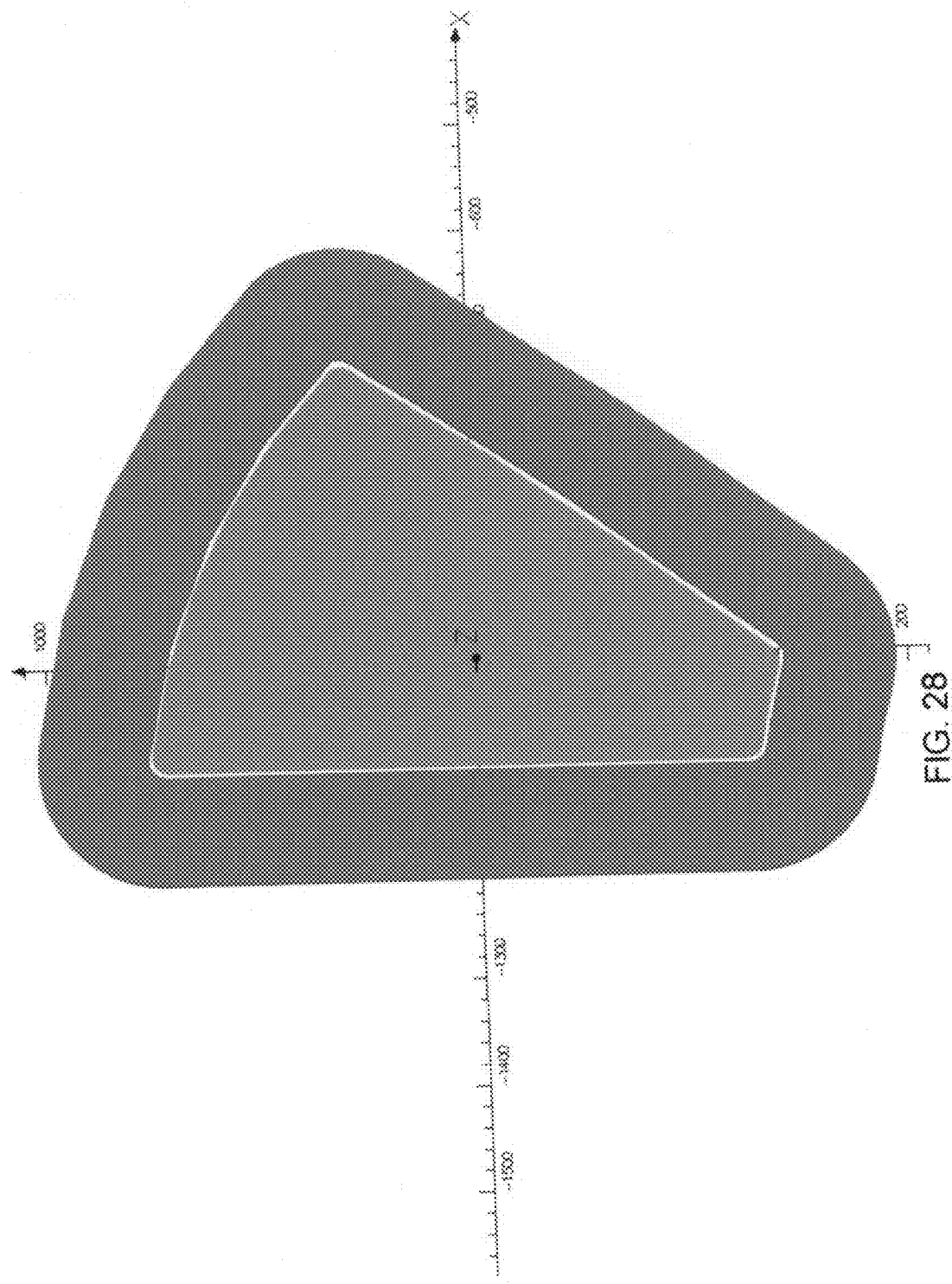
FIG. 28 provides an illustration of a shape of the CEA-DCCM according to the exemplary, non-limiting embodiments.
Figure 31A:
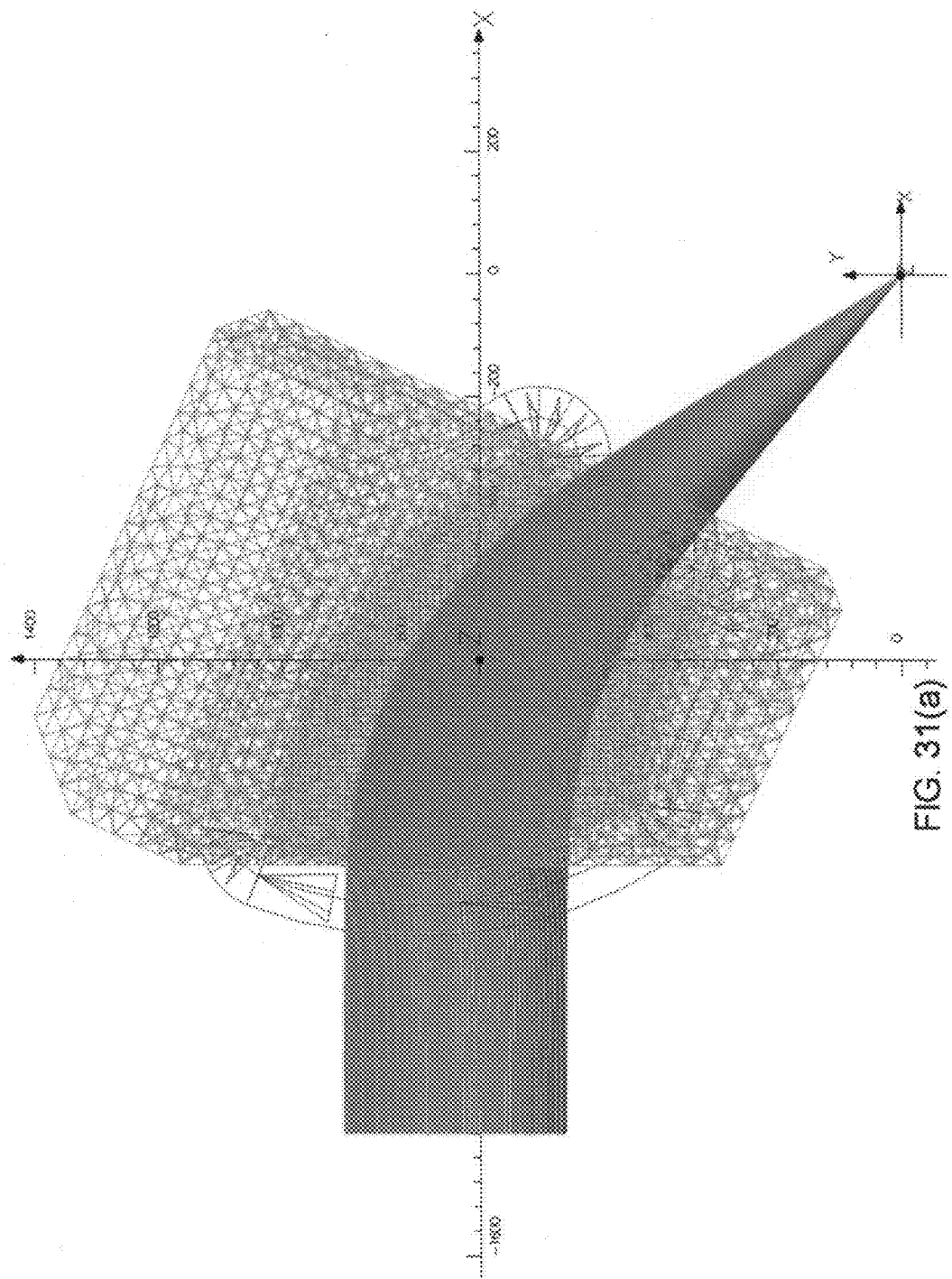
FIGS. 31(a)-(c) illustrate the ion beam trajectory, including the collimator magnet for CSACM according to an exemplary, non-limiting embodiment.
Figure 31B:
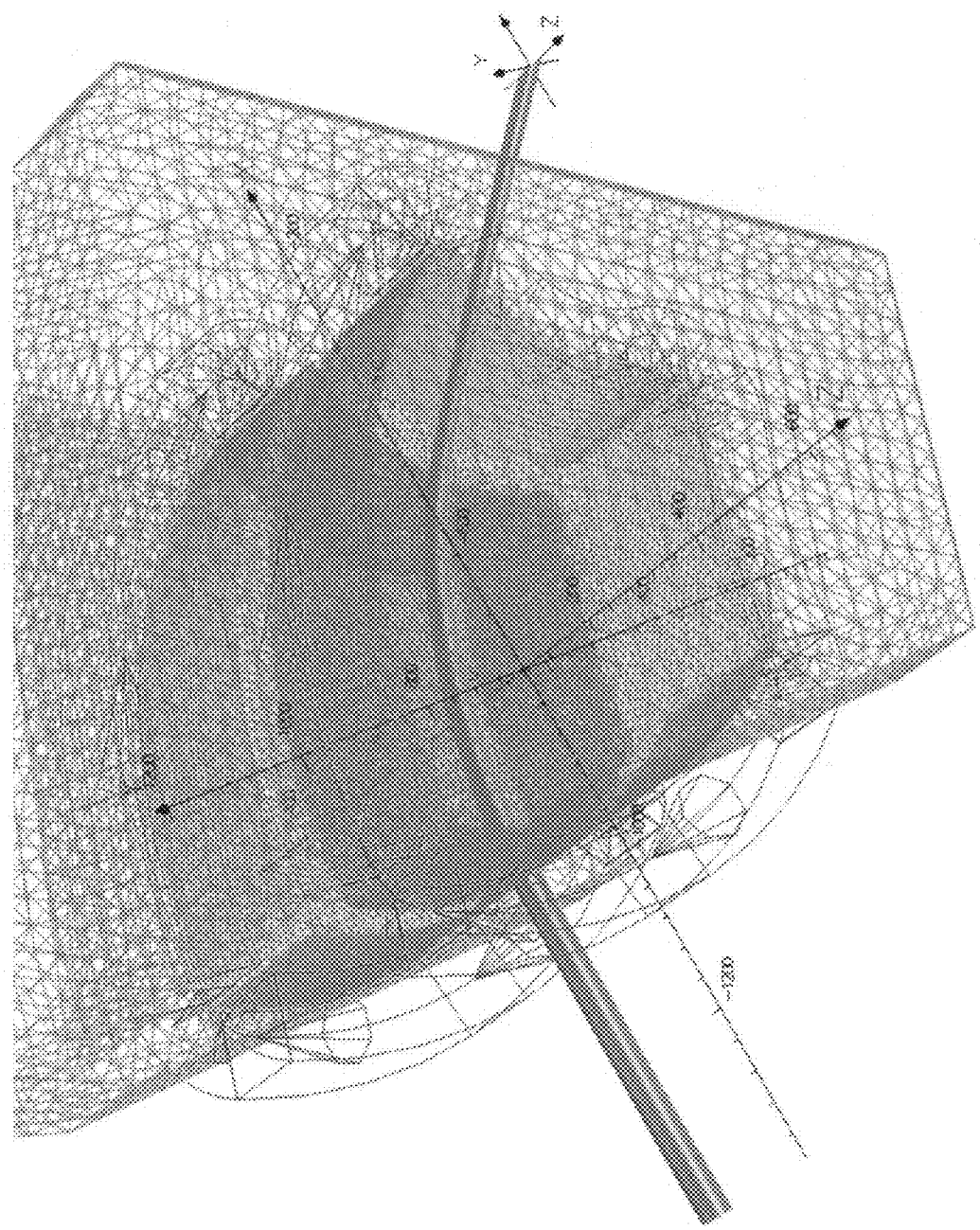
Figure 31C:
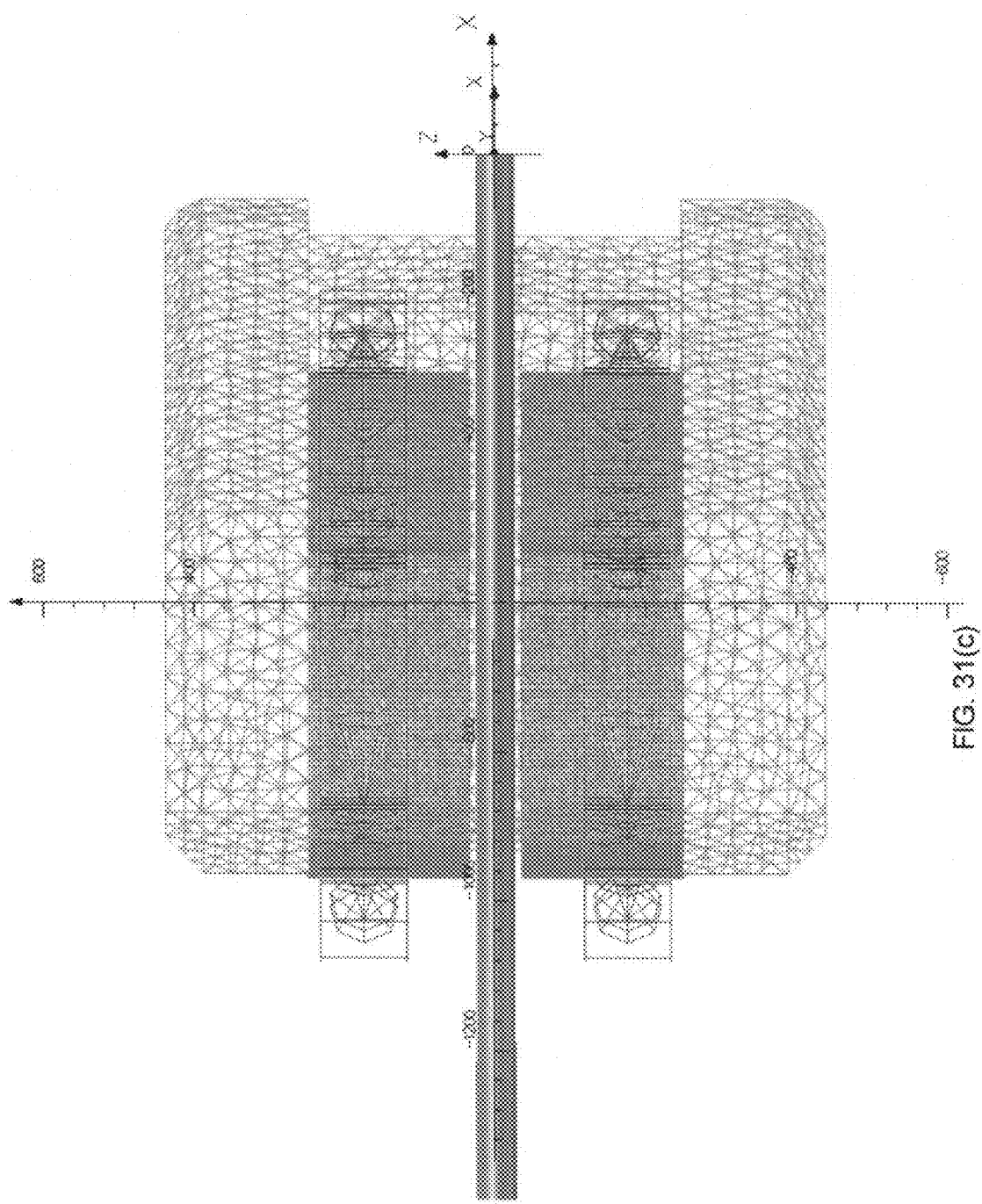

FIG. 28 provides an illustration of a shape of the CEA-DCCM as a projection in plane XY according to the exemplary, non-limiting embodiments of the present invention. The electrical coils are included in the drawing.

FIG. 29 provides an illustration of a shape of the CSA-DCCM as a projection in plane XY according to the exemplary, non-limiting embodiments of the present invention. The electrical coils are included in the drawing.

Applicants conducted detailed simulations of the foregoing exemplary embodiments, and also in comparison with the above-described related art system. For example, the OPERA3D modeling software was used by applicants as a tool to obtain the 3-dimensional results related to the exemplary embodiments, together with modules TOSCA for magnetic field computation and SCALA for ion ray trajectories when considering space charge effects. An essential part of the computation framework is a user-developed interface program for OPERA3D. The interface program, developed as a stand-alone unit using Mathcad, allows definition of the CM by solving the appropriate differential equation, and makes further changes for compensation of ion beam deflection using a "virtual cut" of slices from the CM. Also, the interface program exports information for 3D definition of the collimator body using Autocad, specifies initial parameters for the ion beam (mass, charge, position and direction of velocity, energy) and analyses beam properties after collimation, at target. Extensive results were obtained. In view of the simulation of the foregoing exemplary embodiments, the results with respect to parallelism of the CMs can be analyzed as follows, in consideration of the precision of the parallelism.

Figure 30:
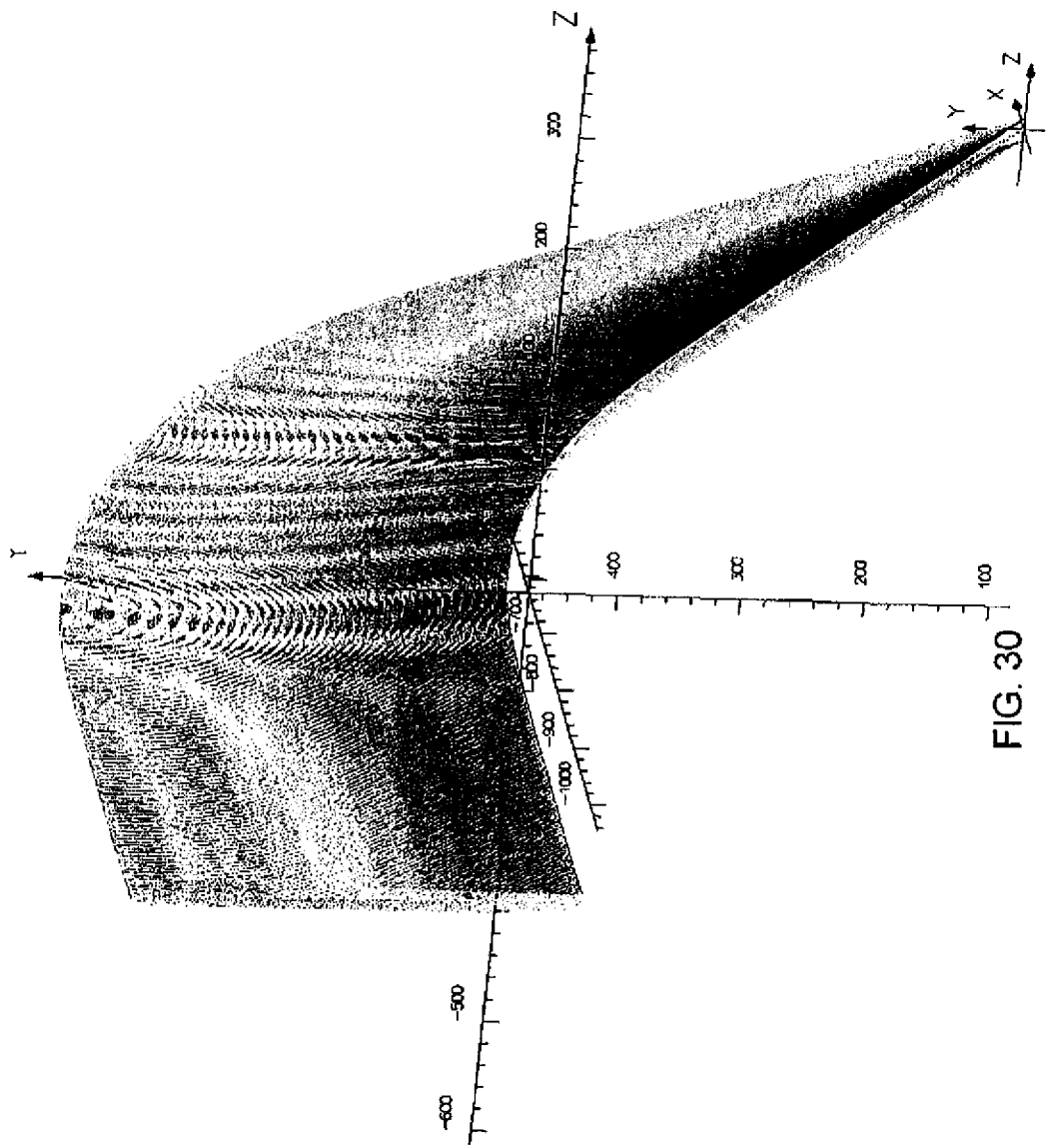
FIG. 30 illustrates trajectory of ion rays originating from different positions along the Z direction for CSACM.

FIGS. 30-33 provide illustrations of the exemplary, non-limiting ion beam trajectories and collimation for CSACM, based on the above-explained computer simulations. For example, but not by way of limitation, FIG. 30 illustrates an ion beam trajectory alone for CSACM, and FIG. 31(a) illustrates the ion beam trajectory, including the collimator magnet. Ion rays incident to CM have different position angles and belong to different XY planes, while exit ion rays from CSACM are substantially parallel. Numerical values (in units of mm) are provided along the X, Y and Z axes for illustrative purposes of the collimation properties. FIGS. 31(b) and (c) illustrate beam collimation in the XZ plane for CSACM. The aperture of the beam is between z=−25 mm and z=25 mm.

Figure 32:
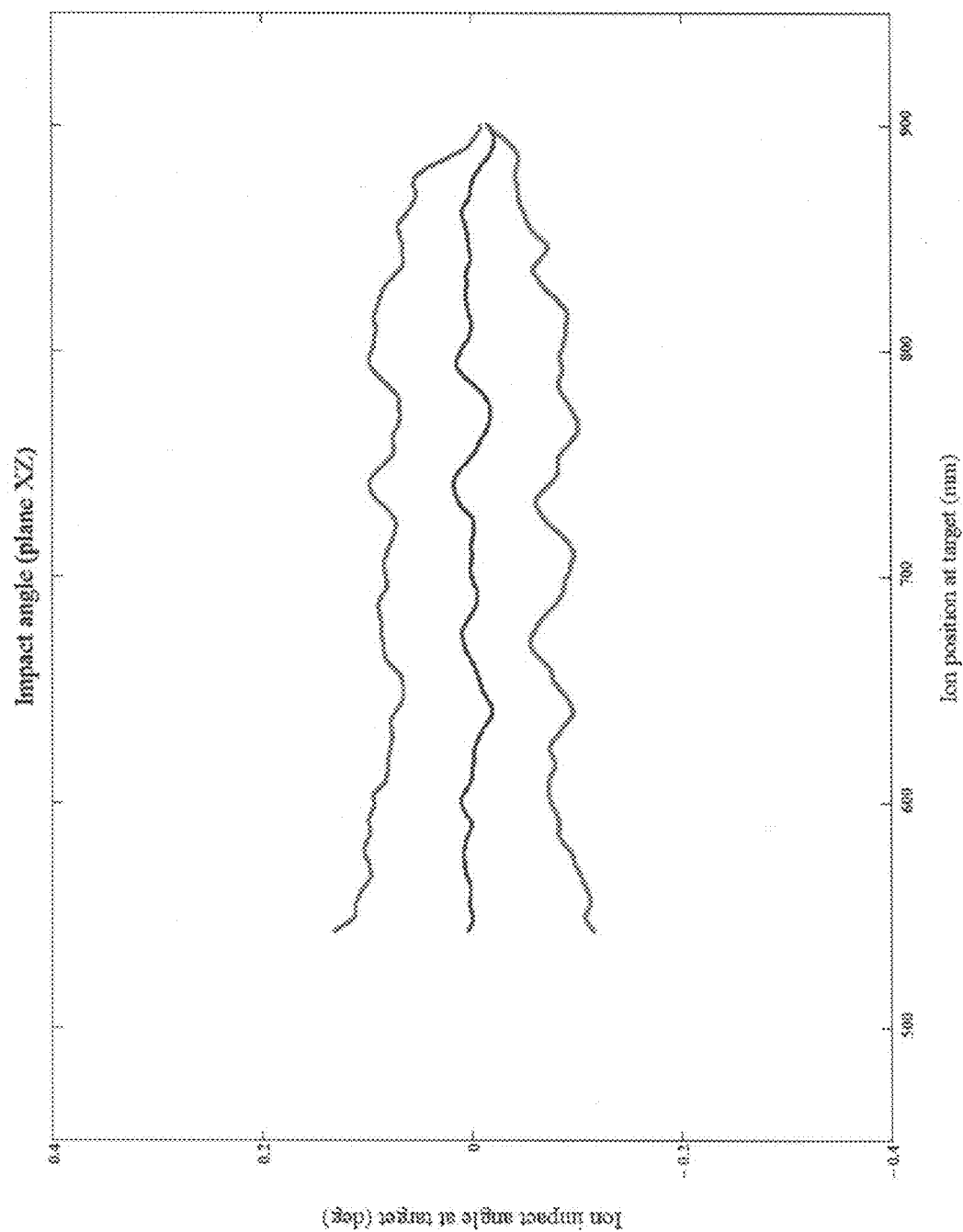
FIG. 32 illustrates the relationship between the impact angle $\alpha_z$ (in degrees) and the exit ion beam y-coordinate (in mm) for CSACM according to an exemplary, non-limiting embodiment.

FIG. 32 illustrates the relationship between the impact angle $\alpha_z$ (in degrees) and the exit ion beam y-coordinate for the CSACM of the present invention. Simulations were conducted for the upper (z=+10 mm), middle (z=0 mm) and lower (z=−10 mm) beams. The impact angle $\alpha_z$ changes slightly with beam position, but remains within precision +/−0.1 deg for all the beam aperture considered (360 mm).

Figure 33:
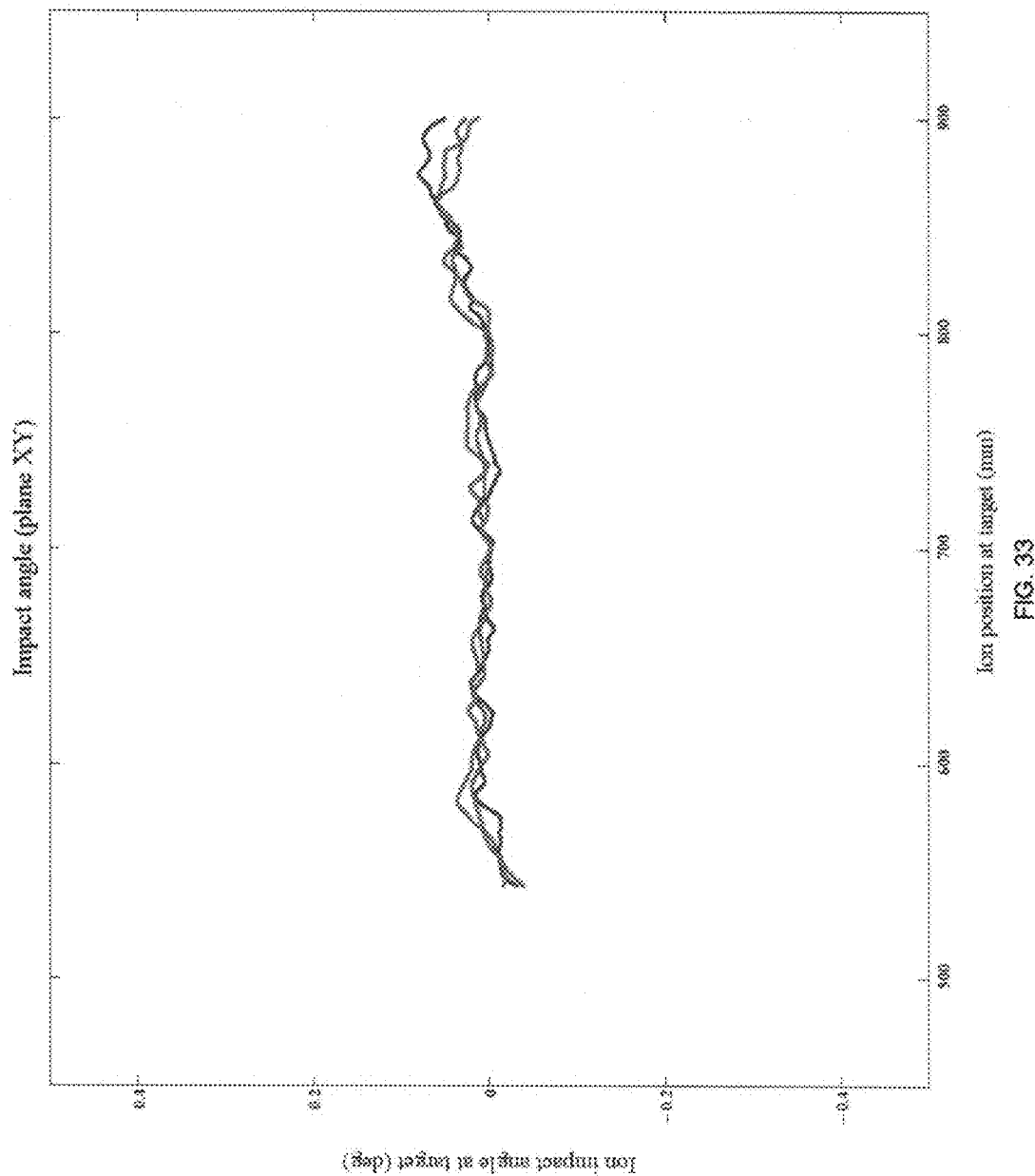
FIG. 33 illustrates the relationship between impact angle $\alpha_y$ in plane XY (in degrees) and the exit ion beam y-coordinate (in mm) at the target for CSACM according to an exemplary, non-limiting embodiment.

FIG. 33 illustrates the relationship between impact angle $\alpha_y$ and the position of the ion beam at the target, for upper, middle and lower beams according to the above-noted definitions, for the CSACM of the present invention. In FIG. 33, the impact angle $\alpha_y$ for the upper, middle and lower beams does not appear to vary substantially with respect to each other, and the precision of variation of $\alpha_y$ remains within the range +/−0.05 deg for the beam aperture considered (360 mm).

Figure 34:
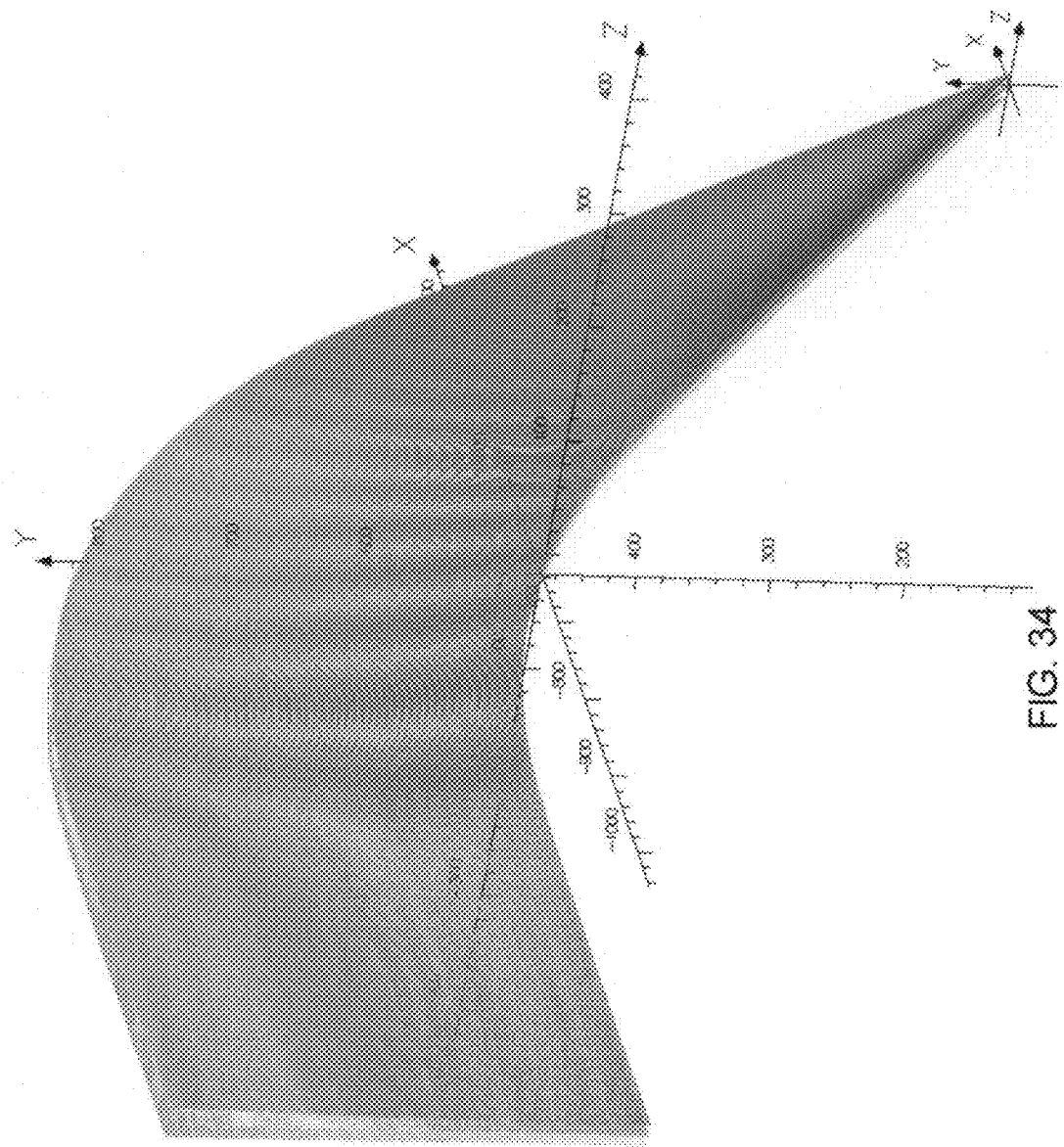
FIG. 34 illustrates an ion beam trajectory alone for CSACM-DCCM according to an exemplary, non-limiting embodiment.
Figure 35:
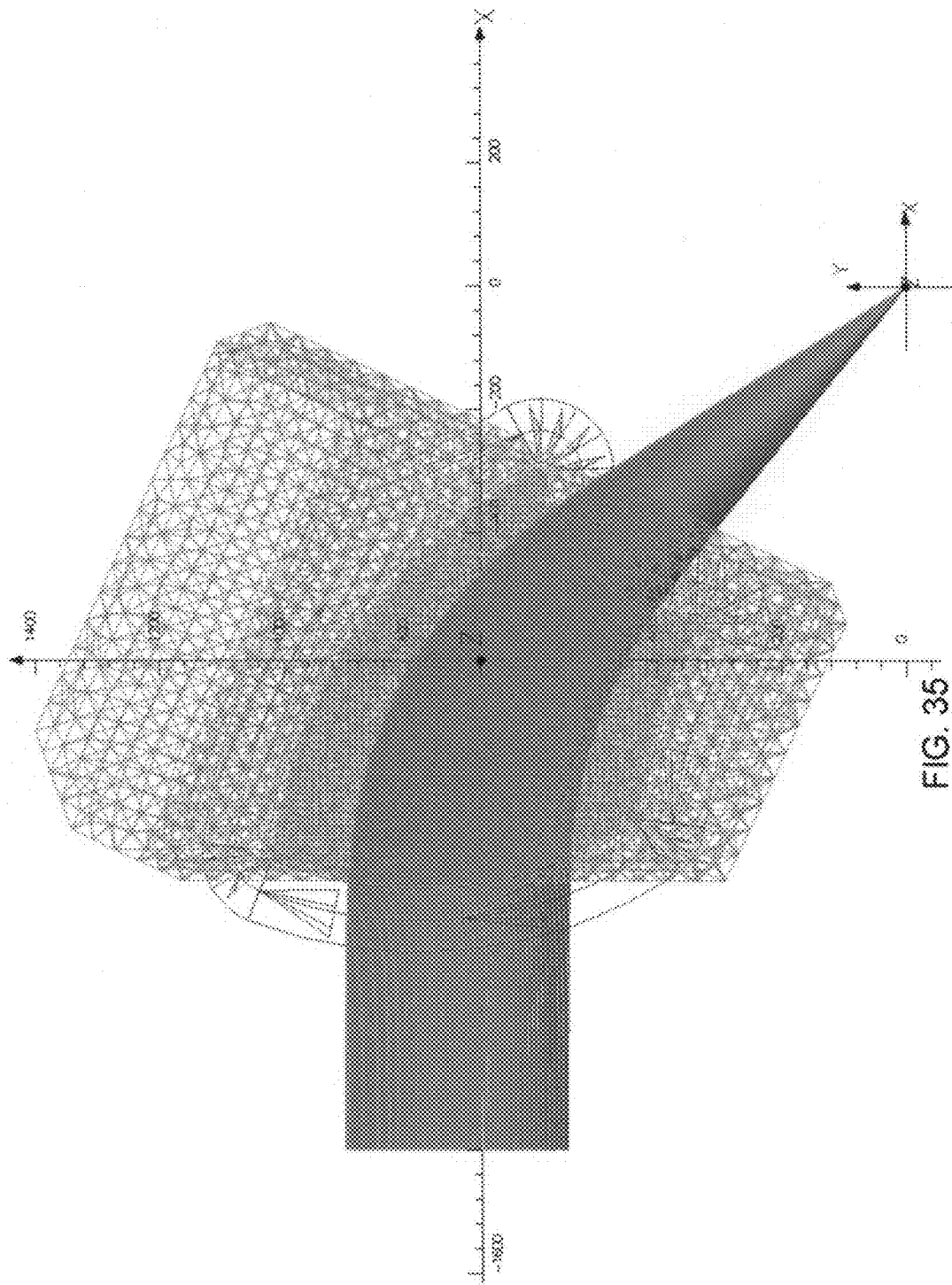
FIG. 35 illustrates the ion beam trajectory, including the collimator magnet with its double circle configuration for CSACM-DCCM according to an exemplary, non-limiting embodiment.

FIGS. 34-37 provide additional illustrations of the exemplary, non-limiting ion beam trajectories for CSACM-DCCM, based on the above-explained computer simulations. For example, but not by way of limitation, FIG. 34 illustrates an ion beam trajectory alone for CSACM-DCCM, and FIG. 35 illustrates the ion beam trajectory, including the collimator magnet with its double circle configuration. Ion rays incident to the CM have different position angles and belong to different XY planes, while exit ion rays from CSA-DCCM are substantially parallel. Numerical values (in units of mm) are provided along the X, Y and Z axes for illustrative purposes of the collimation properties.

Figure 36:
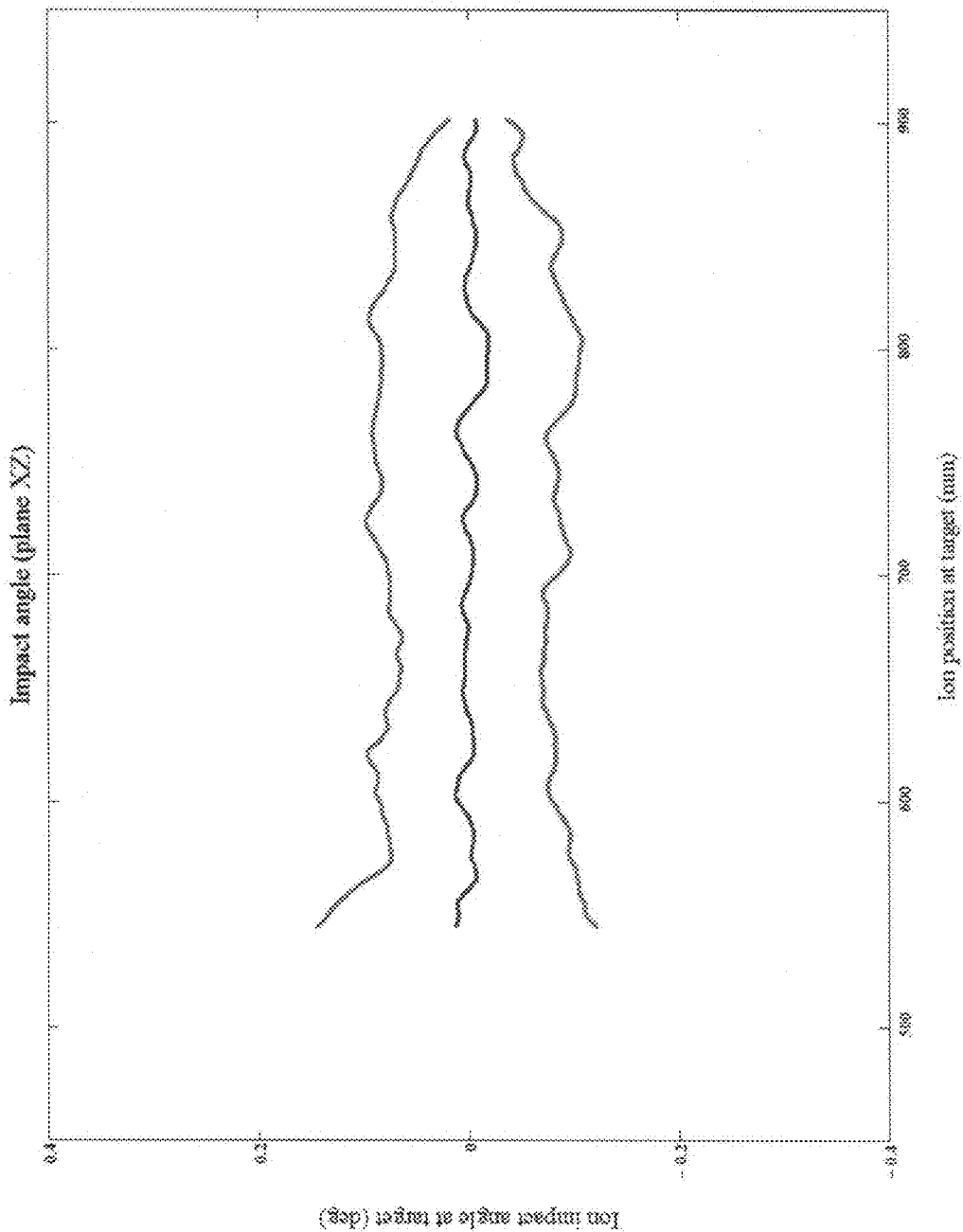
FIG. 36 illustrates the relationship between the impact angle $\alpha_z$ in plane XY (in degrees) and the exit ion beam y-coordinate for CSACM-DCCM according to an exemplary, non-limiting embodiment.

FIG. 36 illustrates the relationship between the impact angle $\alpha_z$ (in degrees) and the exit beam y-coordinate for the CSA-DCCM of the present invention. Simulations of beam collimation were carried on for upper (z=+10 mm), middle (z=0 mm) and lower (z=−10 mm) beams. The impact angle $\alpha_z$ changes slightly with beam position, but remains within precision +/−0.1 deg for the beam aperture considered (360 mm).

Figure 37:
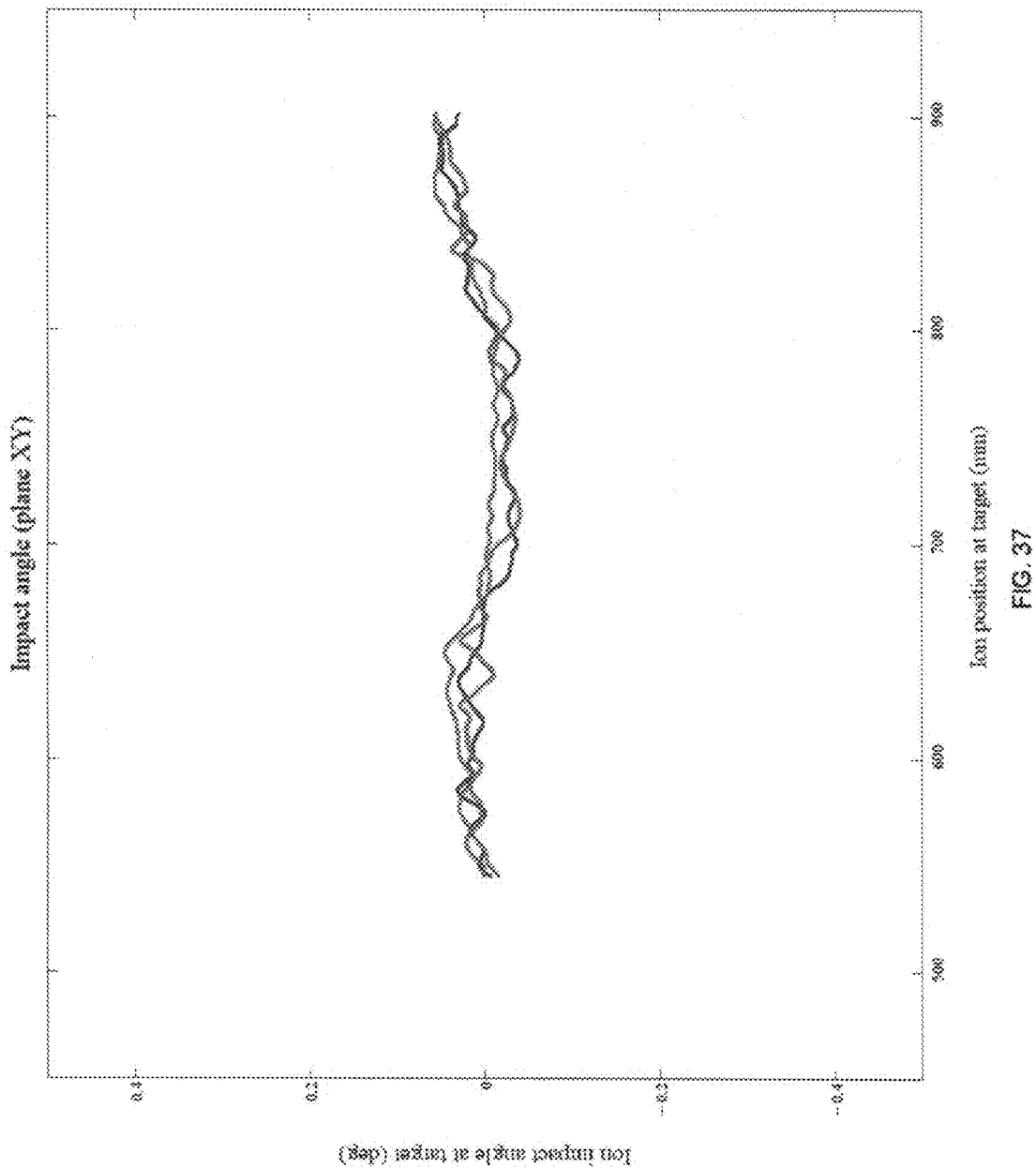
FIG. 37 illustrates the relationship between impact angle $\alpha_y$ in plane XY (in degrees) at the ion beam y-coordinate at the target for CSACM-DCCM according to an exemplary, non-limiting embodiment.

FIG. 37 illustrates the relationship between impact angle $\alpha_y$ and the position of the ion beam at the target, for upper, middle and lower beams according to the above-noted definitions, for the CSA-DCCM of the present invention. In FIG. 37, the impact angle $\alpha_y$ for the upper, middle and lower beams does not appear to vary substantially with respect to each other, and the precision of variation of $\alpha_y$ remains within the range +/−0.05 deg for the beam aperture considered (360 mm).

The highest degree of precision of ion beam collimation is obtained for the case of CSACM. However, the ease of fabrication must be considered as well. Next, CSA-DCCM has a slightly lower degree of beam collimation precision than CSACM. However, CSA-DCCM is easier to fabricate as compared with CSACM. Both CSACM and CSA-DCCM have "perfect" beam collimation in two directions (XY plane and XZ plane). Moreover, in addition to increased precision of beam parallelism, CSACM and CSA-DCCM allow for obtaining exit ion beams with larger aperture, suitable for use in ion implantation systems designed for larger wafer size.

CIACM and CEACM provide collimation in one direction (XY plane) and provide the highest precision of ion beam collimation, but may pose difficulties in the fabrication process. Further, CIA-DCCM and CEA-DCCM also provide one-direction collimation, but with the tradeoff of ease of fabrication in exchange for slightly reduced precision as compared with CIACM and CEACM.

In one exemplary, non-limiting embodiment, the sum of the incidence angle and the exit angle are substantially equal to 0 for CSACM In another exemplary, non-limiting embodiment, the incidence angle is substantially equal to a constant for CIACM. Yet in another exemplary, non-limiting embodiment, the exit angle is substantially equal to a constant for CEACM. More specifically, the CM is manufactured and measured for geometrical dimensions to a degree of precision, and to the extent that the degree of precision permits, the foregoing incidence angle, exit angle or their sum can be considered to be "substantially" equal to zero.

Further exemplary, non-limiting embodiments relate to consideration of space charge effects. For example, an exemplary embodiment may incorporate compensation of uniform space charge effect (sum of incident and exit angles is a constant value). Alternatively, an exemplary embodiment may incorporate non-uniform space charge effect (sum of incident and exit angles is a non-constant value). Uniform space charge forces may be considered, as well as magnetic field fringe forces.

With respect to the size of the initial ion beam (prior to the CM), the following considerations are taken into account. The CM takes into account the above-noted two constraints, and based on this consideration, equations are derived. For example, but not by way of limitation, differential equation results and numerical computations provide a solution that includes two non-circular curves that describe the CM incident and exit edges.

When the virtual ion source is not point but actual has a physical structure or distribution, some degradation of the ion beam collimation may occur, as shown in FIGS. 38(a), (b) and (c). More specifically, for the CSACM subject having a point virtual ion source as the ion source, degradation in XY parallelism occurs at about 0.1 degrees for every 2.5 mm difference in ion source position. This degradation in parallelism precision may be considered acceptable in some applications.

In view of the foregoing results as shown in FIGS. 38(a)-(c), for example, it is possible to structure the CSACM taking into consideration the physical extent of the ion source. For example but not by way of limitation, collimation at the target would be "perfect" (in the XY and XZ planes) even if the virtual ion source is distributed (e.g., a linear ion source) rather than point (or punctual). Accordingly, no degradation in beam collimation occurs due to the ion source being distributed.

Figure 39:
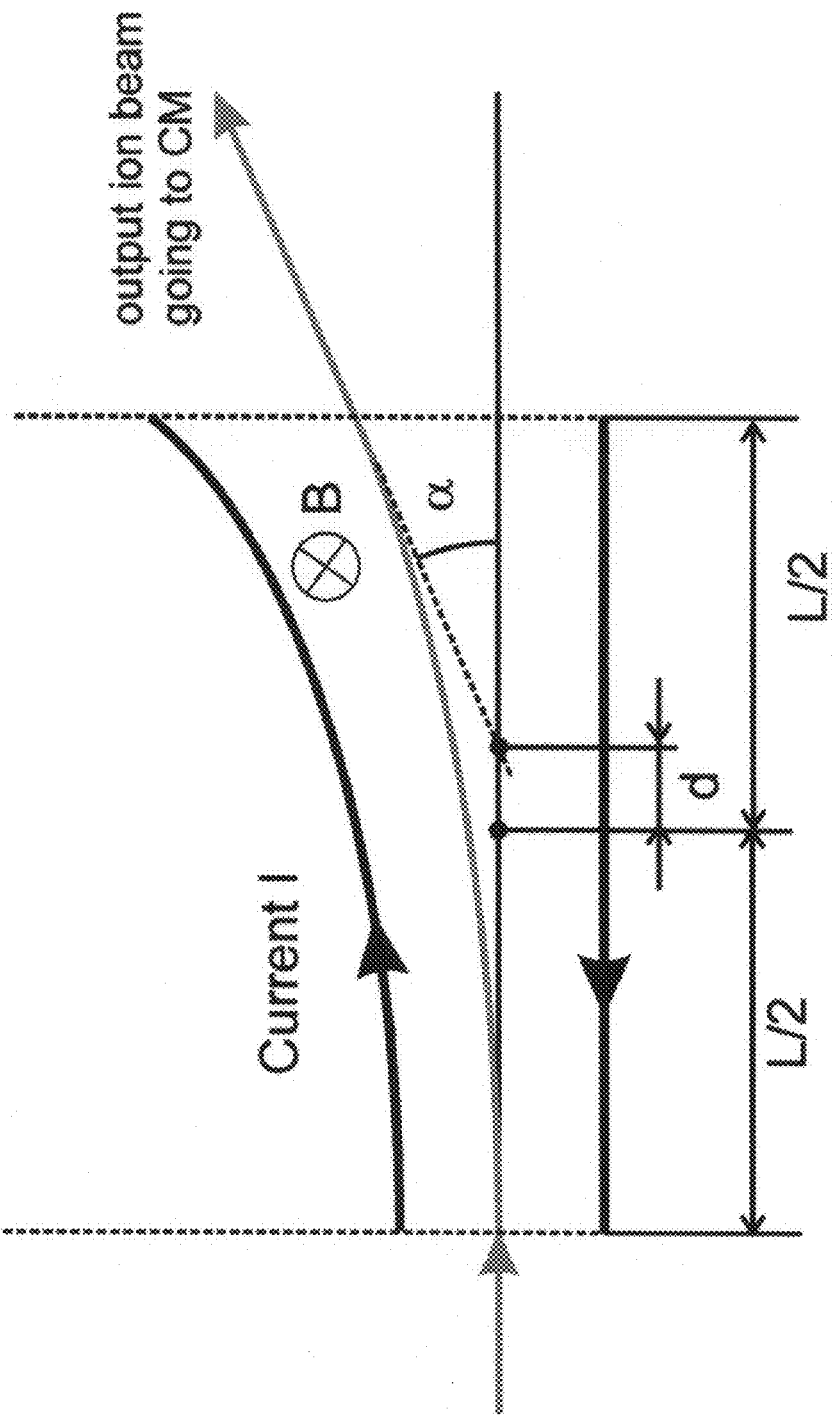
FIG. 39 illustrates that for a BSM of length L, the distributed virtual ion source (hereinafter referred to as "VIS") has position d expressed as function of ray angular position a by equation (7) according to an exemplary, non-limiting embodiment.

In the case of a punctual virtual ion source, the ion source position is defined only by its angle $\alpha$. However, a virtual ion source can be defined that is not a point (i.e., it is a distributed virtual ion source), depending on ion ray initial position d and angle $\alpha$. The size of the region where the distributed virtual ion source is positioned depends on the properties of the beam sweeping magnet (BSM) that is positioned before the CM. For example, but not by way of limitation, in a simple analytical model and as shown in FIG. 39, for a BSM of length L, the distributed VIS has position d expressed as function of ray angular position $\alpha$ by following equation. The initial position d of each ray is measured on the BSM axis with respect to the geometrical middle of the BSM, with positive values heading toward the CM.

$$d = \frac{L}{1+\cos\alpha} - \frac{L}{2} \qquad (7)$$

Numerical modeling of BSM using, for example, OPERA3D may be used for more precise evaluation of the position of the distributed ion source. Even with modification of the virtual ion source definition from point source to distributed source, the two constraints that define the CM remain unchanged, as the change is related to the initial position of the ion rays only. Therefore, the same procedure can be applied for defining the collimator magnet shape.

The unit placed before the CM in the ion implantation system has the function of ion beam deflection. Beam deflection may be produced by electric forces or magnetic forces or a combination of both. For example but not by way of limitation, magnetic forces are used for ion beam deflection in the case of BSM. When beam deflection due to magnetic forces takes place, two secondary effects are (1) distributed position of the virtual ion source (i.e., related to the apparent position of the ion beam forwarded to the CM, as discussed above, and (2) ion beam deflection in XZ plane (along Z direction). The latter effect occurs due to small components of the magnetic field that appear in the BSM in the horizontal (XY) plane. For example but not by way of limitation, both these secondary effects may be taken into account and compensated by the CM design.

The BSM deflects the ion beam with different angles, depending on the magnitude of the magnetic field, as obtained by applying currents to coils. The BSM provides desirable beam deflection in plane XY with sweeping angle $\alpha$ as shown in FIG. 39. However, undesirable lateral beam deflection (in XZ plane), also occurs. This lateral deflection is smaller for smaller sweeping angle $\alpha$ and greater for greater sweeping angle $\alpha$, because magnetic field, including its horizontal component, is smaller or respectively greater in the two cases.

The undesirable lateral beam deflection, is due, for example, to the fact that electric coils are physical objects with finite physical dimensions instead of being ideal coils with zero thickness and width. As a result of undesirable beam deflection in XZ plane, increased divergence ("toe-out") of the ion beam occurs, divergence which is greater for rays with greater angular deflection $\alpha$.

CSACM can be designed to compensate for this unwanted XZ plane deflection of the ion beam. For this purpose, the differential equation that describes the collimator magnet corresponds to condition $\alpha_i + \alpha_e$=not constant, where "not constant" is a function of ion beam angular position $\alpha$. This function may be known, for example (but not limited to) if performing 3D modeling for the BSM, for example using OPERA3D software as disclosed above.

Moreover, the "global" design for the BSM+CM element pair (which comprises part of the ion implantation system) can be performed, as information about the 3-dimensional (3-D) beam deflection provided by the beam sweeping magnet (BSM) is obtained and then used as input information for the CM, which therefore are configured as a pair.

As a result of the exemplary embodiments, desirable precision levels for beam collimation (parallelism) of the ion beam and size of the beam aperture may be achieved, suitable for "next generation" ion implantation systems. Related art implantation systems, as discussed above and corresponding to the year 2001 level, could process wafers of diameter 300 mm and having minimum circuit pattern width of semiconductor device around 250 nm. For example but not by way of limitation, devices on wafer with minimal dimension in the 25-45 nm range and wafers with 300-450 mm diameter or more might be processed in implantation systems using collimator magnets as disclosed herein, and included in the exemplary embodiments.

Additionally, the present invention is not limited to the foregoing disclosure of CM, and other uses as may be understood by one skilled in the art may be also be included. For example, but not by way of limitation, the CM could be used to deflect ions in applications other than ion implantation, such as beam lines designed for research of elementary particles, machines for ions used in sterilization of materials (e.g., food), medical purposes (e.g., cancer treatment using ions), interaction with living cells or the like. Further, the CM is not limited to collimation of ions, but may also be used with for the collimation of electrons. Additionally, while the CM includes a yoke and coil structure, other materials or technologies may be used, as is well known in the art, such as superconducting coils instead of resistive coils.

The foregoing embodiments are merely exemplary and are not to be construed as limiting. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. An apparatus for implanting ions in a target, comprising:
   an ion generation source that generates an ion beam including said ions; and
   a collimator magnet that receives the ion beam having divergent ion rays and outputs a parallel ion beam to irradiate said target, said collimator having an incident edge and an exit edge,
   wherein said incident edge has an incidence angle between (a) a line defined by each of said ion rays at said incident edge and (b) a line extending normal to said incident edge, and said exit edge has an angle between (a) a line defined by each of said ion rays at said exit edge and (b) a line extending normal to said exit edge, and a sum of said incidence angle and said exit angle equals zero simultaneously for all of said ion rays.

2. The apparatus of claim 1, wherein said incident and said exit edge of the collimator magnet are respectively along different circles, without linear portions.

3. The apparatus of claim 1, wherein said incident edge and said exit edge are subjected to compensation for an effect of the magnetic field fringe of said collimator magnet by removing a virtual slice of at least one of said incident edge and said exit edge.

4. The apparatus of claim 3, wherein said virtual slice has a substantially constant thickness, so as to compensate for deflection of said ion beam as a whole.

5. The apparatus of claim 3, wherein said virtual slice has a variable thickness, so as to compensate for deflection of individual rays of said ion beam as well as for deflection of said ion beam as a whole.

6. The apparatus of claim 1, wherein said ion beam is deflected in an XY plane as well as in an XZ plane, and the net beam deflection in the XZ plane is substantially equal to zero for each ray in the beam.

7. An apparatus for implanting ions in a target, comprising:
   an ion generation source that generates an ion beam including said ions; and
   a collimator magnet that receives the ion beam having divergent ion rays and outputs a parallel ion beam to irradiate said target, said collimator having an incident edge and an exit edge,
   wherein said incident edge has an incidence angle between (a) a line defined by each of said ion rays at said incident edge and (b) a line extending normal to said incident edge, and said exit edge has an angle between (a) a line defined by each of said ion rays at said exit edge and (b) a line extending normal to said exit edge, and a sum of said incidence angle and said exit angle is constant simultaneously for all of said ion rays.

8. The apparatus of claim 7, wherein said incident and said exit edge of the collimator magnet are respectively along different circles, without linear portions.

9. The apparatus of claim 7, wherein said incident edge and said exit edge are subjected to compensation for an effect of the magnetic field fringe of said collimator magnet by removing a virtual slice of at least one of said incident edge and said exit edge.

10. The apparatus of claim 9, wherein said virtual slice has a substantially constant thickness, so as to compensate for deflection of said ion beam as a whole.

11. The apparatus of claim 9, wherein said virtual slice has a variable thickness, so as to compensate for deflection of individual rays of said ion beam as well as for deflection of said ion beam as a whole.

12. The apparatus of claim 7, wherein said ion beam is deflected in an XY plane and in an XZ plane, and the net beam deflection in the XZ plane is substantially uniform for each ray in the beam compensating the ion beam divergence due to space charge effects.

* * * * *

UNITED STATES PATENT AND TRADEMARK OFFICE
CERTIFICATE OF CORRECTION

| | | |
|---|---|---|
| PATENT NO. | : 8,164,070 B2 | Page 1 of 2 |
| APPLICATION NO. | : 12/328824 | |
| DATED | : April 24, 2012 | |
| INVENTOR(S) | : Dan Nicolaescu | |

It is certified that error appears in the above-identified patent and that said Letters Patent is hereby corrected as shown below:

In the drawings, delete fig. 30, and insert the following fig. 30.

Signed and Sealed this
Twelfth Day of June, 2012

David J. Kappos
*Director of the United States Patent and Trademark Office*